(12) United States Patent
Shionoya et al.

(10) Patent No.: US 11,095,830 B2
(45) Date of Patent: Aug. 17, 2021

(54) IMAGE-CAPTURING DEVICE AND IMAGE PROCESSING DEVICE

(71) Applicant: NIKON CORPORATION, Tokyo (JP)

(72) Inventors: Takashi Shionoya, Koganei (JP); Toshiyuki Kanbara, Tokyo (JP); Naoki Sekiguchi, Yashio (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/827,254

(22) Filed: Mar. 23, 2020

(65) Prior Publication Data

US 2020/0228705 A1    Jul. 16, 2020

Related U.S. Application Data

(63) Continuation of application No. 15/764,917, filed as application No. PCT/JP2016/078313 on Sep. 26, 2016, now Pat. No. 10,638,037.

(30) Foreign Application Priority Data

Sep. 30, 2015   (JP) .................................. 2015-195288

(51) Int. Cl.
*H04N 5/235*      (2006.01)
*H04N 5/353*      (2011.01)
(Continued)

(52) U.S. Cl.
CPC .......... *H04N 5/2355* (2013.01); *G06T 3/4015* (2013.01); *H01L 27/14621* (2013.01);
(Continued)

(58) Field of Classification Search
CPC ............. H04N 5/23229; H04N 5/2353; H04N 5/2355; H04N 5/341; H04N 5/351;
(Continued)

(56) References Cited

U.S. PATENT DOCUMENTS 7,446,812 B2 *  11/2008  Ando .................... H04N 5/369
                                                   348/362
8,345,108 B2 *   1/2013  Kobayashi ........ H01L 27/14634
                                                   348/208.12
(Continued)

FOREIGN PATENT DOCUMENTS

CN      103190145 A     7/2013
EP       2640065 A1     9/2013
(Continued)

OTHER PUBLICATIONS

Dec. 13, 2016 International Search Report issued in International Patent Application No. PCT/JP2016/078313.
(Continued)

*Primary Examiner* — Lin Ye
*Assistant Examiner* — Chriss S Yoder, III
(74) *Attorney, Agent, or Firm* — Oliff PLC

(57) ABSTRACT

An image-capturing device includes: an image sensor that includes an imagecapturing area where an image of a subject is captured; a setting unit that sets imagecapturing conditions to be applied to the image-capturing area; a selection unit that selects pixels to be used for interpolation from pixels present in the image-capturing area; and a generation unit that generates an image of the subject captured in the image-capturing area with signals generated through interpolation executed by using signals output from the pixels selected by the selection unit, wherein: the selection unit makes a change in selection of at least some of the pixels to be selected depending upon the image-capturing conditions set by the setting unit.

8 Claims, 29 Drawing Sheets

(51) Int. Cl.
  *H04N 9/04* (2006.01)
  *G06T 3/40* (2006.01)
  *H04N 5/355* (2011.01)
  *H01L 27/146* (2006.01)
  *H04N 5/232* (2006.01)
  *H04N 5/369* (2011.01)
  *H04N 5/367* (2011.01)
  *H04N 5/357* (2011.01)
  *H04N 5/351* (2011.01)
  *H04N 5/341* (2011.01)

(52) U.S. Cl.
  CPC ... *H01L 27/14627* (2013.01); *H04N 5/23229* (2013.01); *H04N 5/232122* (2018.08); *H04N 5/3535* (2013.01); *H04N 5/35554* (2013.01); *H04N 5/36961* (2018.08); *H04N 9/04515* (2018.08); *H04N 9/04557* (2018.08); *H01L 27/14634* (2013.01); *H04N 5/2353* (2013.01); *H04N 5/341* (2013.01); *H04N 5/351* (2013.01); *H04N 5/353* (2013.01); *H04N 5/357* (2013.01); *H04N 5/367* (2013.01); *H04N 9/045* (2013.01)

(58) Field of Classification Search
  CPC .. H04N 5/353; H04N 5/3535; H04N 5/35554; H04N 5/357; H04N 5/367; H04N 9/045; H04N 9/04515; H01L 27/14634; G06T 3/4015
  See application file for complete search history.

(56) References Cited

U.S. PATENT DOCUMENTS 9,148,578 B2 * 9/2015 Tsubaki ............... H04N 5/235

| | | |
|---|---|---|
| 2006/0023109 A1 | 2/2006 | Mabuchi et al. |
| 2008/0284871 A1 | 11/2008 | Kobayashi |
| 2013/0242152 A1 * | 9/2013 | Kasai ............... H04N 9/04515 348/294 |
| 2015/0244915 A1 * | 8/2015 | Kikuchi ............. H04N 5/23251 348/234 |
| 2016/0112644 A1 | 4/2016 | Nishi |

FOREIGN PATENT DOCUMENTS

| | | |
|---|---|---|
| EP | 3007434 A1 | 4/2016 |
| JP | H08-172640 A | 7/1996 |
| JP | 2006-049361 A | 2/2006 |
| JP | 2006-197192 A | 7/2006 |
| JP | 2015-056710 A | 3/2015 |
| WO | 2014/192152 A1 | 12/2014 |

OTHER PUBLICATIONS

Mar. 25, 2019 Search Report issued in European Patent Application No. 16851463.6.
Apr. 2, 2019 Office Action issued in Japanese Patent Application No. 2017-543270.
Jun. 14, 2019 Office Action issued in U.S. Appl. No. 15/764,917.
Oct. 9, 2019 Office Action issued in Chinese Patent Application No. 201680057213.5.
Feb. 20, 2020 Office Action issued in European Patent Application No. 16 851 463.6.
May 31, 2021 Office Action issued in Chinese Application No. 2020100795797.4.

* cited by examiner

FIG.7
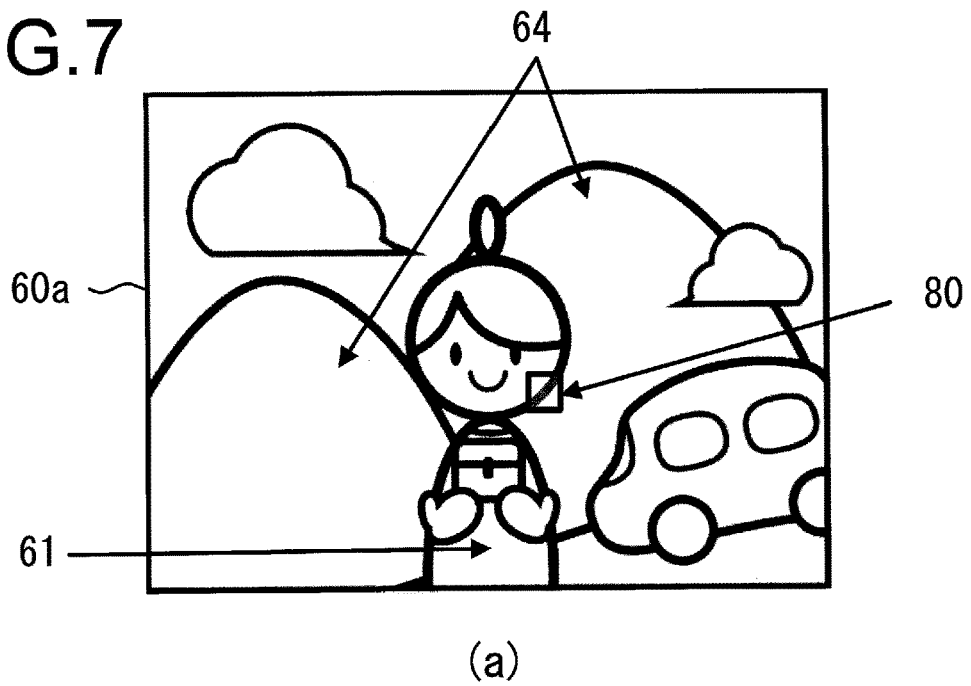
(a)
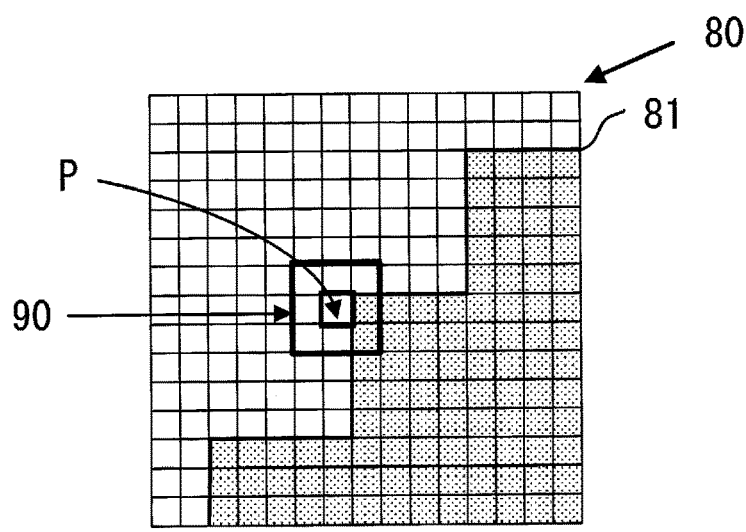
(b)
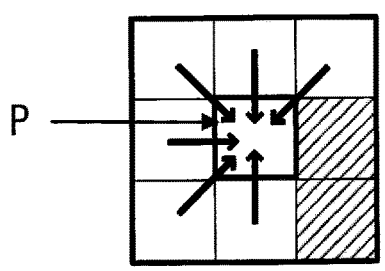
(c)
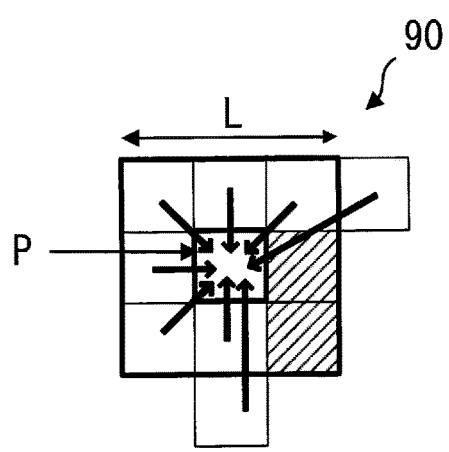
(d)

FIG.9
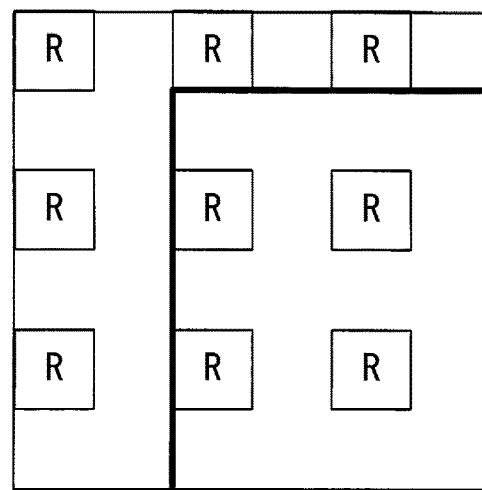
(a)
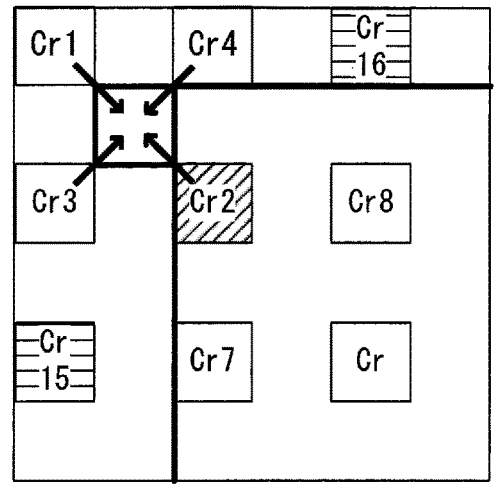
(b)
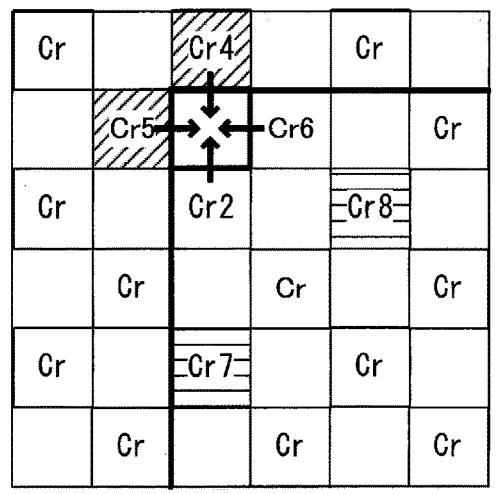
(c)

FIG.10
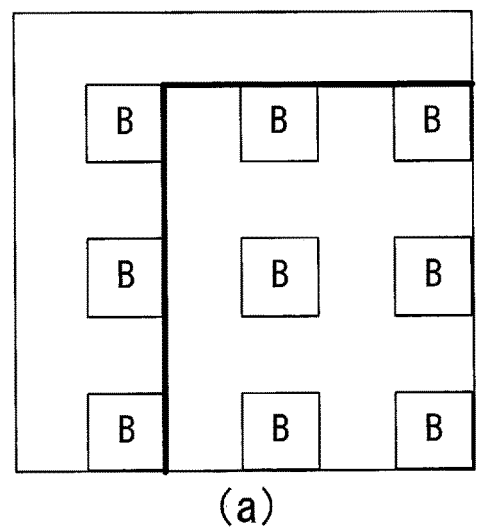
(a)
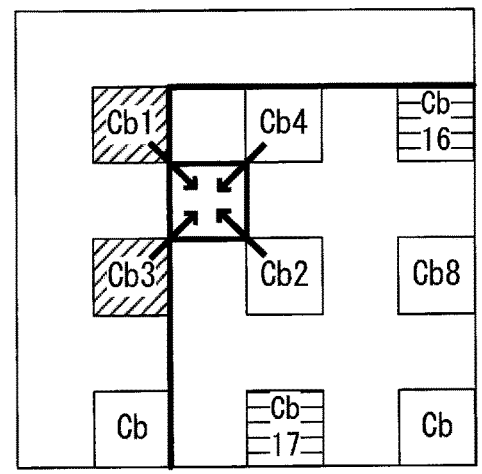
(b)
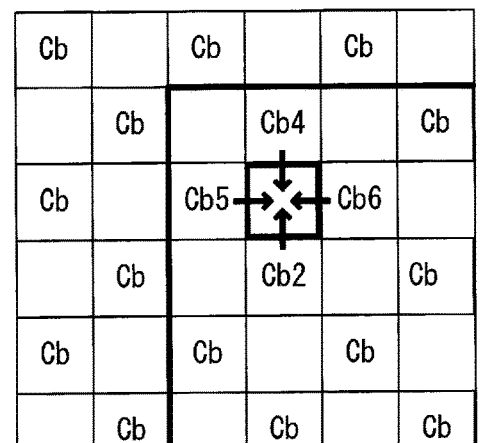
(c)

FIG.14
(a)
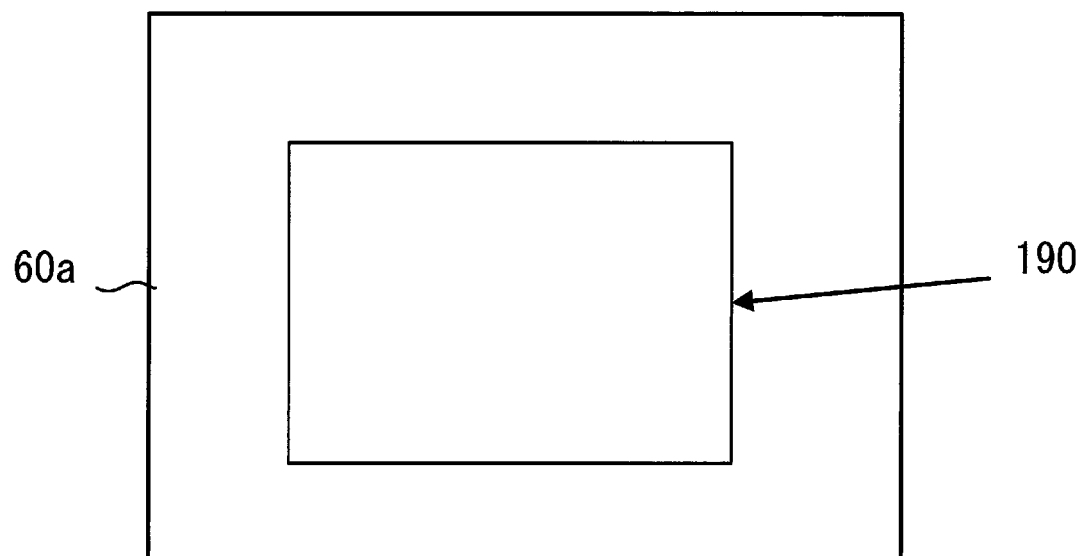
(b)

FIG.16
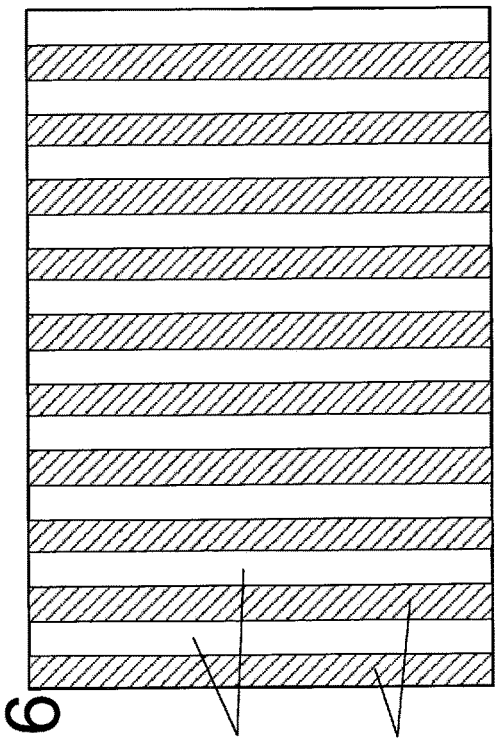
(a)
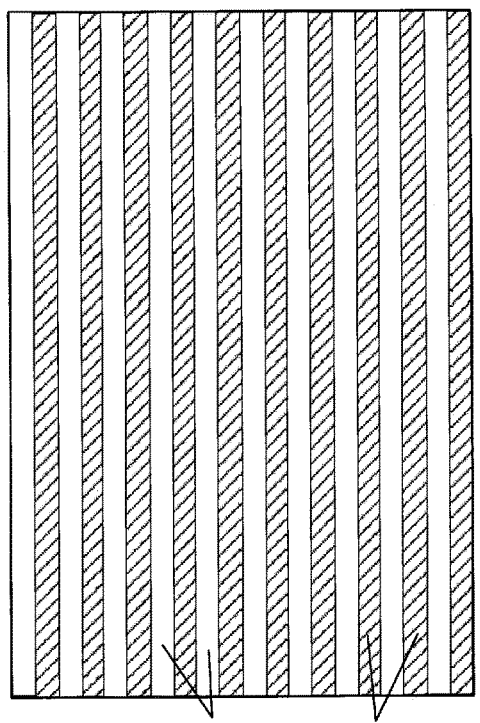
(b)
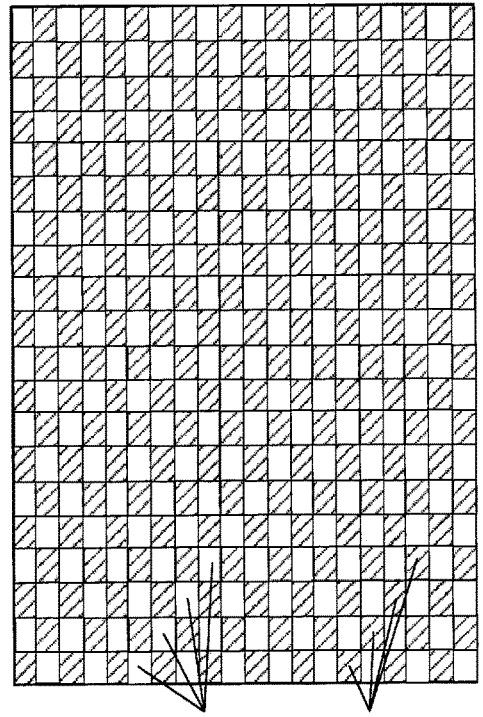
(c)

IMAGE-CAPTURING DEVICE AND IMAGE PROCESSING DEVICE

This application is a continuation application of U.S. application Ser. No. 15/764,917, filed Mar. 30, 2018, which is in turn a National Stage Application of PCT/JP2016/078313, filed Sep. 26, 2016, which itself claims priority to Japanese Application No. 2015-195288, filed Sep. 30, 2015.

TECHNICAL FIELD

The present invention relates to an image-capturing device and an image processing device.

BACKGROUND ART

There is an image-capturing device equipped with an image sensor that allows an image-capturing condition different from the image-capturing condition selected for another area to be set for an area in the imaging field is known in the related art (see PTL1). However, there is an issue to be addressed in that image data obtained over areas with different image-capturing conditions applied thereto cannot be handled in a manner similar to that with which image data obtained in areas with matching image-capturing conditions applied thereto are used.

CITATION LIST

Patent Literature

PTL1: Japanese Laid Open Patent Publication No. 2006-197192

SUMMARY OF INVENTION

According to the 1st aspect of the present invention, an image-capturing device comprises: an image sensor that includes an image-capturing area where an image of a subject is captured; a setting unit that sets image-capturing conditions to be applied to the image-capturing area; a selection unit that selects pixels to be used for interpolation from pixels present in the image-capturing area; and a generation unit that generates an image of the subject captured in the image-capturing area with signals generated through interpolation executed by using signals output from the pixels selected by the selection unit, wherein: the selection unit makes a change in selection of at least some of the pixels to be selected depending upon the image-capturing conditions set by the setting unit.

According to the 15th aspect of the present invention, an image-capturing device comprises: an image sensor that includes a first image-capturing area set so as to capture an image of a subject under first image-capturing conditions, a second image-capturing area set so as to capture an image of the subject under second image-capturing conditions different from the first image-capturing conditions and a third image-capturing area set so as to capture an image of the subject under third image-capturing conditions different from the second image-capturing conditions; a selection unit that selects pixels, to be used for purposes of interpolation executed for a pixel present in the first image-capturing area among pixels present in the second image-capturing area, and pixels present in the third image-capturing area; and a generation unit that generates an image of the subject captured in the first image-capturing area with signals generated through interpolation executed by using signals output from the pixels selected by the selection unit.

According to the 16th aspect of the present invention, an image-capturing device comprises: an image sensor that includes a first image-capturing area set so as to capture an image of a subject under first image-capturing conditions and a second image-capturing area set so as to capture an image of the subject under second image-capturing conditions different from the first image-capturing conditions; a selection unit that selects pixels to be used for purposes of interpolation executed for a pixel present in the first image-capturing area among pixels present in the first image-capturing area and pixels present in the second image-capturing area; and a generation unit that generates an image of the subject captured in the first image-capturing area with signals generated through interpolation executed by using signals output from the pixels selected by the selection unit.

According to the 17th aspect of the present invention, an image-capturing device comprises: an image sensor that includes a first image-capturing area where an image of a subject is captured, a second image-capturing area where an image of the subject is captured and a third image-capturing area where an image of the subject is captured; a setting unit that sets first image-capturing conditions as image-capturing conditions for the first image-capturing area, sets second image-capturing conditions, different from the first image-capturing conditions, as image-capturing conditions for the second image-capturing area and sets third image-capturing conditions, different from the first image-capturing conditions by an extent smaller than an extent of difference between the first image-capturing conditions and the second image-capturing conditions, as image-capturing conditions for the third image-capturing area; a selection unit that selects pixels to be used for purposes of interpolation executed for a pixel present in the first image-capturing area among pixels present in the first image-capturing area, pixels present in the second image-capturing area and pixels present in the third image-capturing area; and a generation unit that generates an image of the subject captured in the first image-capturing area with signals generated through interpolation executed by using signals output from the pixels selected by the selection unit.

According to the 18th aspect of the present invention, an image-capturing device comprises: an image sensor that includes a first image-capturing area where an image of a subject is captured, a second image-capturing area where an image of the subject is captured and a third image-capturing area where an image of the subject is captured, set apart from the first image-capturing area by a distance greater than a distance between the first image-capturing area and the second image-capturing area; a setting unit that sets image-capturing conditions different from image-capturing conditions selected for the first image-capturing area, as image-capturing conditions for the second image-capturing area; a selection unit that selects pixels to be used for purposes of interpolation executed for a pixel present in the first image-capturing area among pixels present in the first image-capturing area, pixels present in the second image-capturing area and pixels present in the third image-capturing area; and a generation unit that generates an image of the subject captured in the first image-capturing area with signals generated through interpolation executed by using signals output from the pixels selected by the selection unit.

According to the 19th aspect of the present invention, an image-capturing device comprises: an image sensor that includes an image-capturing area where an image of a subject is captured; a setting unit that sets image-capturing conditions to be applied to the image-capturing area; and a generation unit that generates an image of the subject captured in the image-capturing area with signals generated through interpolation executed by using signals output from pixels selected as pixels to be used for purposes of interpolation and present in the image-capturing area, wherein: a change is made in selection of at least some of the pixels to be selected depending upon the image-capturing conditions set by the setting unit.

According to the 20th aspect of the present invention, an image-capturing device comprises: an image sensor that includes a first image-capturing area set so as to capture an image of a subject under first image-capturing conditions and a second image-capturing area set so as to capture an image of the subject under second image-capturing conditions different from the first image-capturing conditions; and a generation unit that generates an image of the subject captured in the first image-capturing area with signals generated through interpolation executed by using signals output from pixels, selected as pixels to be used for purposes of interpolation executed for a pixel present in the first image-capturing area, among pixels present in the first image-capturing area and pixels present in the second image-capturing area.

According to the 21st aspect of the present invention, an image-capturing device comprises: an image sensor that includes an image-capturing area where an image of a subject is captured; a setting unit that sets image-capturing conditions to be applied to the image-capturing area; and a generation unit that generates an image of the subject captured in the image-capturing area with signals generated through noise reduction executed by using signals output from pixels that output noise reduction signals, selected from pixels present in the image-capturing area, wherein: a change is made in selection of at least some of the pixels to be selected depending upon the image-capturing conditions set by the setting unit.

According to the 22nd aspect of the present invention, an image-capturing device comprises: an image sensor that includes a first image-capturing area set so as to capture an image of a subject under first image-capturing conditions, a second image-capturing area set so as to capture an image of the subject under second image-capturing conditions different from the first image-capturing conditions and a third image-capturing area set so as to capture an image of the subject under third image-capturing conditions different from the second image-capturing conditions; a selection unit that selects pixels to be used to reduce noise for a pixel present in the first image-capturing area among pixels present in the second image-capturing area and pixels present in the third image-capturing area; and a generation unit that generates an image of the subject captured in the first image-capturing area with signals having undergone noise reduction executed by using signals output from the pixels selected from the pixels present in the second image-capturing area and the pixels present in the third image-capturing area, as pixels to output signals to be used to reduce noise in a signal at a pixel present in the first image-capturing area.

According to the 23rd aspect of the present invention, an image-capturing device comprises: an image sensor that includes a first image-capturing area set so as to capture an image of a subject under first image-capturing conditions and a second image-capturing area set so as to capture an image of the subject under second image-capturing conditions different from the first image-capturing conditions; and a generation unit that generates an image of the subject captured in the first image-capturing area with signals generated through interpolation executed by using signals output from pixels selected from pixels present in the first image-capturing area and pixels present in the second image-capturing area, as pixels to output signals to be used to reduce noise for a pixel present in the first image-capturing area.

According to the 24th aspect of the present invention, an image-capturing device comprises: an image sensor that includes an image-capturing area where an image of a subject is captured; a setting unit that sets image-capturing conditions to be applied to the image-capturing area; and a generation unit that generates an image of the subject captured in the image-capturing area with signals having undergone image processing executed by using signals output from pixels selected as pixels to be used in image processing, wherein: a change is made in selection of at least some of the pixels to be selected depending upon the image-capturing conditions set by the setting unit.

According to the 25th aspect of the present invention, an image processing device comprises: a selection unit that selects signals to be used for purposes of interpolation, among signals output from pixels present in an image-capturing area of an image sensor; and a generation unit that generates an image of a subject captured in the image-capturing area with signals generated through interpolation executed by using the signals selected by the selection unit, wherein: the selection unit makes a change in selection of at least some of the pixels to be selected depending upon the image-capturing conditions set for the image-capturing area.

According to the 26th aspect of the present invention, an image processing device comprises: a selection unit that selects signals to be used for noise reduction, among signals output among pixels present in an image-capturing area of an image sensor; and a generation unit that generates an image of a subject captured in the image-capturing area with signals having undergone noise reduction executed by using the signals selected by the selection unit, wherein: the selection unit makes a change in selection of at least some of the pixels to be selected depending upon the image-capturing conditions set for the image-capturing area.

According to the 27th aspect of the present invention, an image processing device comprises: a selection unit that selects signals to be used for purposes of interpolation, among signals output from pixels present in an image-capturing area of an image sensor; and a display unit that brings up on display an image of a subject captured in the image-capturing area, generated with signals generated through interpolation executed by using the signals selected by the selection unit, wherein: the selection unit makes a change in selection of at least some of the pixels to be selected depending upon the image-capturing conditions set for the image-capturing area.

According to the 28th aspect of the present invention, an image processing device comprises: a selection unit that selects signals to be used for noise reduction, among signals output from pixels present in an image-capturing area of an image sensor; and a display unit that brings up on display an image of a subject captured in the image-capturing area, generated with signals having undergone noise reduction executed by using the signals selected by the selection unit, wherein: the selection unit makes a change in selection of at least some of the pixels to be selected depending upon the image-capturing conditions set for the image-capturing area.

BRIEF DESCRIPTION OF DRAWINGS

FIG. 8 An example of an arrangement of photoelectric conversion signals output from pixels illustrated in FIG. 8(a), a diagram illustrating how G-color component image data are generated through interpolation presented in FIG. 8(b), and an example of G-color component image data resulting from the interpolation illustrated in FIG. 8(c)

FIG. 9 A diagram showing only the R-color component image data in FIG. 8(a), presented in FIG. 9(a), an illustration of interpolation for the chrominance component Cr presented in FIG. 9(b), and a diagram illustrating how image data for the chrominance component Cr are generated through interpolation presented in FIG. 9(c)

FIG. 10 A diagram showing only the B-color component image data in FIG. 8(a), presented in FIG. 10(a), an illustration of interpolation for the chrominance component Cb presented in FIG. 10(b), and a diagram illustrating how image data for the chrominance component Cb are generated through interpolation presented in FIG. 10(c)

DESCRIPTION OF EMBODIMENTS

The image processing device achieved in an embodiment may be installed in an electronic device such as a digital camera, as described below. A camera 1 (see FIG. 1) is configured so as to enable image-capturing operation to be executed under different conditions set for different areas of the image-capturing surface at an image sensor 32a. An image processing unit 33 executes processing optimal for each of the areas for which different image-capturing conditions have been selected. Such a camera 1 will be described in detail in reference to drawings.

Description of the Camera

First Embodiment

Figure 1:
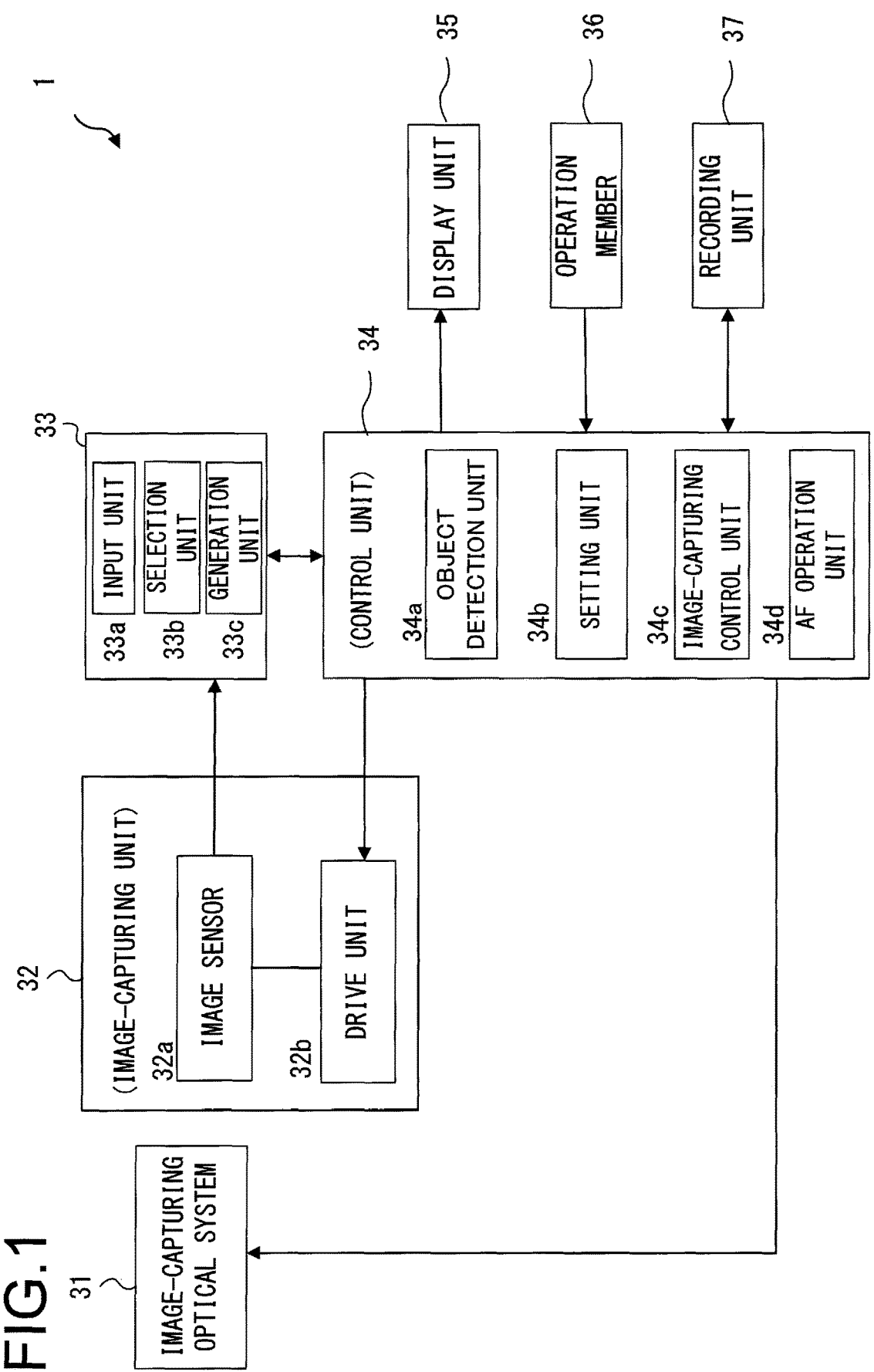
FIG. 1 A block diagram presenting an example of a structure that may be adopted in the camera achieved in a first embodiment FIG. 2 A sectional view of a stacked image sensor FIG. 3 An illustration of the pixel arrangement and unit areas at the image-capturing chip FIG. 4 An illustration of the circuits in a unit area FIG. 5 A schematic illustration of an image of a subject formed at the image sensor in the camera FIG. 6 An example of an image-capturing condition setting screen FIG. 7 An example of an area around the boundary of a first area in a live view image illustrated in FIG. 7(a), an enlarged view of the area around the boundary presented in FIG. 7(b), an enlarged view of a target pixel and reference pixels presented in FIG. 7(c), and an enlarged view of a target pixel and reference pixels designated in a second embodiment presented in FIG. 7(d)

FIG. 1 is a block diagram presenting an example of a structure that may be adopted in the camera 1 achieved in the first embodiment. The camera 1 in FIG. 1 comprises an image-capturing optical system 31, an image-capturing unit 32, the image processing unit 33, a control unit 34, a display unit 35, an operation member 36 and a recording unit 37.

The image-capturing optical system 31 guides a light flux departing a subject field to the image-capturing unit 32. At the image-capturing unit 32, which includes the image sensor 32a and a drive unit 32b, an image of the subject, formed via the image-capturing optical system 31, undergoes photoelectric conversion. The image-capturing unit 32 is capable of capturing an image under uniform conditions set for the entire range of the image-capturing surface at the image sensor 32a or capturing an image under different conditions for different areas of the image-capturing surface at the image sensor 32a. The image-capturing unit 32 will be described in detail later. The drive unit 32b generates a drive signal needed to enable accumulation control at the image sensor 32a. An image-capturing instruction indicating an electric charge accumulation time and the like for the image-capturing unit 32 is transmitted from the control unit 34 to the drive unit 32b.

The image processing unit 33 includes an input unit 33a, a selection unit 33b and a generation unit 33c. Image data obtained by the image-capturing unit 32 are input to the input unit 33a. The selection unit 33b executes preliminary processing on the image data input as described above. The preliminary processing will be described in detail later. The generation unit 33c generates an image based upon the input image data mentioned above and image data resulting from the preliminary processing. In addition, the generation unit 33c executes image processing on the image data. This image processing includes, for instance, color interpolation processing, defective pixel correction processing, edge enhancement processing, noise reduction processing, white balance adjustment processing, gamma correction processing, display luminance adjustment processing and saturation adjustment processing. In addition, the generation unit 33c generates an image to be brought up on display at the display unit 35.

The control unit 34, which may be constituted with, for instance, a CPU, controls the overall operation in the camera 1. For instance, the control unit 34 executes a predetermined exposure calculation based upon photoelectric conversion signals obtained via the image-capturing unit 32, determines exposure conditions such as the electric charge accumulation time (exposure time), the aperture value to be set for the image-capturing optical system 31 and the ISO sensitivity, which must be set for the image sensor 32a to achieve the optimal exposure, and issues an instruction for the drive unit 32b accordingly. In addition, it determines image processing conditions under which the saturation (chroma), the contrast, the sharpness and the like are to be adjusted, in correspondence to the image-capturing scene mode currently set in the camera 1 and the types of subject elements having been detected. It then issues an instruction to the image processing unit 33 accordingly. Detection of subject elements will be explained later.

The control unit 34 includes an object detection unit 34a, a setting unit 34b, an image-capturing control unit 34c and an AF operation unit 34d. While these units are achieved in software with the control unit 34 executing a program installed in a nonvolatile memory (not shown), they may instead be configured with an ASIC or the like instead.

The object detection unit 34a executes object recognition processing of the known art so as to detect subject elements, such as a person (a person's face), an animal such as a dog or a cat (an animal face), a plant, a vehicle such as a bicycle, an automobile or a train, a building, a still object, a landscape such as mountains or clouds, and a determined specific object, in an image obtained via the image-capturing unit 32. The setting unit 34b divides the imaging field at the image-capturing unit 32 into a plurality of areas that contain subject elements detected as described above.

The setting unit 34b also sets image-capturing conditions for the plurality of areas. The image-capturing conditions include the exposure conditions (the electric charge accumulation time, the gain, the ISO sensitivity, the frame rate and the like) explained earlier and the image processing conditions (e.g., a white balance adjustment parameter, a gamma correction curve, a display brightness adjustment parameter, a saturation adjustment parameter and the like). It is to be noted that uniform image-capturing conditions may be set for all of the plurality of areas or different image-capturing conditions may be set for different areas among the plurality of areas.

The image-capturing control unit 34c controls the image-capturing unit 32 (image sensor 32a) and the image processing unit 33 by adopting the image-capturing conditions set by the setting unit 34b for the individual areas. Thus, the image-capturing unit 32 can be engaged in image-capturing operation under different exposure conditions set for different areas among the plurality of areas and the image processing unit 33 can be engaged in image processing under different image processing conditions set for different areas among the plurality of areas. There are no restrictions imposed with regard to the number of pixels making up an area. For instance, each area may be made up with 1000 pixels or a single pixel. In addition, the number of pixels making up a given area may be different from the number of pixels making up another area.

The AF operation unit 34d controls autofocus adjustment (autofocus: AF) operation through which focus is adjusted at a specific position within the imaging field (hereafter referred to as a focus detection position) for the subject corresponding to the specific position. Based upon arithmetic operation results, the AF operation unit 34d transmits a drive signal based upon which a focus lens in the image-capturing optical system 31 is to be driven to an in-focus position, to the drive unit 32b. The processing executed by the AF operation unit 34d for autofocus adjustment is also referred to as focus detection processing. The focus detection processing will be described in detail later.

An image generated via the image processing unit 33, an image resulting from the image processing executed at the image processing unit 33, an image read out from the recording unit 37, or the like is reproduced and brought up on display at the display unit 35. At the display unit 35, an operation menu screen, a setting screen in which image-capturing conditions are set, and the like are also brought up on display.

The operation member 36 is configured with various operation numbers such as a shutter release button and a menu button. The operation member 36 outputs an operation signal corresponding to a specific operation among various operations to the control unit 34. The operation member 36 includes a touch operation member disposed at the display surface of the display unit 35.

In response to an instruction issued by the control unit 34, the recording unit 37 records image data and the like into a recording medium constituted with, for instance, a memory card (not shown). The recording unit 37 also reads out image data recorded in the recording medium in response to an instruction issued by the control unit 34.

<Description of a Stacked Image Sensor>

Figure 2:
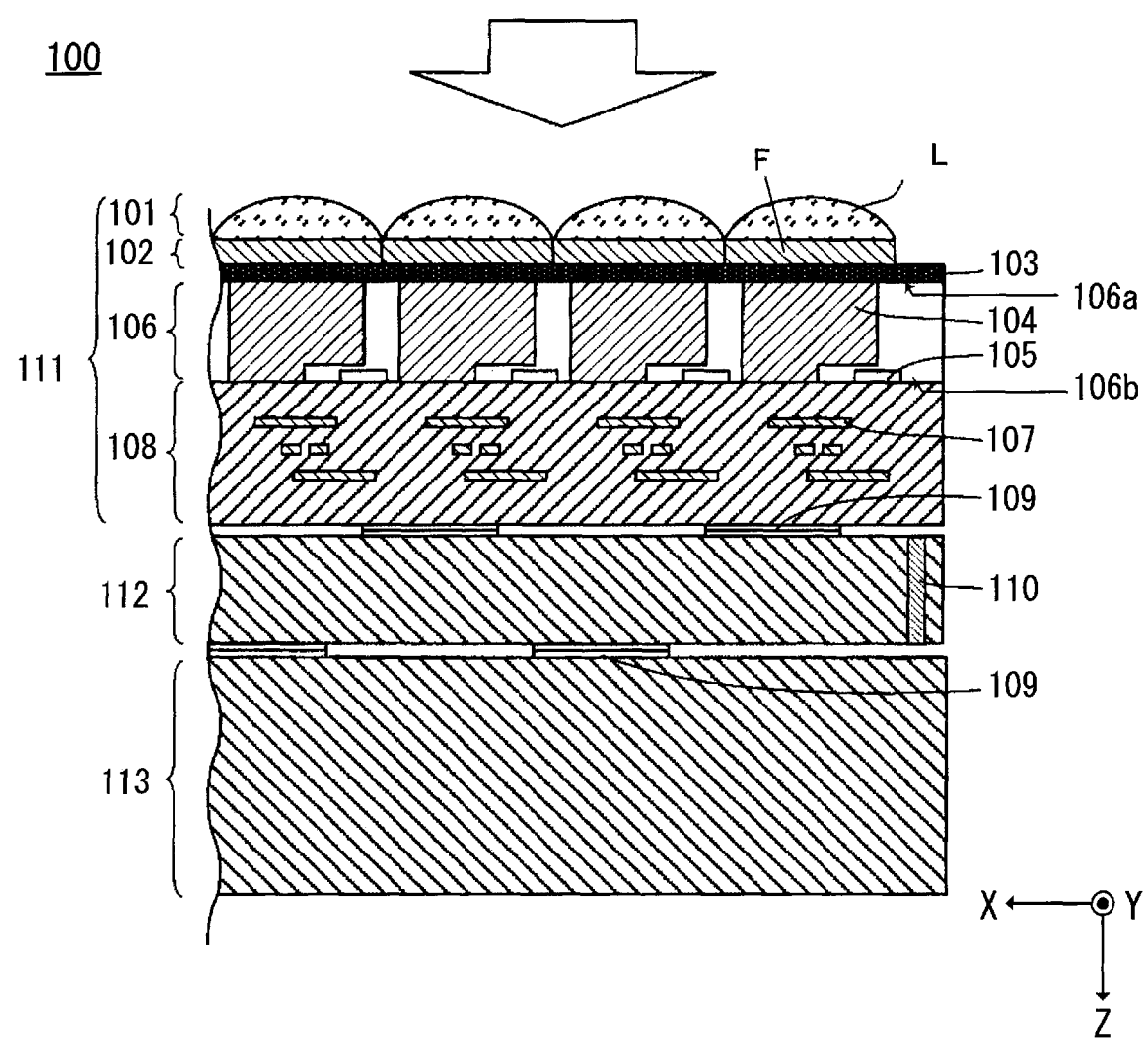

A stacked image sensor 100 representing an example of the image sensor 32a described above will be explained next. FIG. 2 is a sectional view of the image sensor 100. The image sensor 100 includes an image-capturing chip 111, a signal processing chip 112 and a memory chip 113. The image-capturing chip 111 is stacked on the signal processing chip 112. The signal processing chip 112 is stacked on the memory chip 113. Electrical connections are achieved via connecting portions 109 for the image-capturing chip 111 and the signal processing chip 112 and also for the signal processing chip 112 and the memory chip 113. The connecting portions 109 may be, for instance, bumps or electrodes. The image-capturing chip 111 captures an image formed with light departing a subject and generates image data. The image-capturing chip 111 outputs the image data to the signal processing chip 112. At the signal processing chip 112, signal processing is executed on the image data output from the image-capturing chip 111. In the memory chip 113, which includes a plurality of memories, the image data are stored. It is to be noted that the image sensor 100 may be configured with an image-capturing chip and a signal processing chip only. In the image sensor 100 configured with an image-capturing chip and a signal processing chip, a storage unit where image data are stored may be included in the signal processing chip, or a separate storage unit independent of the image sensor 100 may be used for data storage.

As shown in FIG. 2, incident light enters the image sensor primarily toward a Z axis+side indicated by the unfilled arrow. In addition, the direction running to the left on the drawing sheet and perpendicular to the Z axis will be referred to as an X axis+direction and a direction running toward the viewer of the drawing away from the drawing sheet, perpendicular to the Z axis and the X axis, will be referred to as a Y axis+direction with regard to the coordinate axes. In some of the drawings to be referred to in the subsequent description, coordinate axes will be presented so as to indicate the orientations of the individual drawings in reference to the coordinate axes in FIG. 2.

The image-capturing chip 111 may be, for instance, a CMOS image sensor. More specifically, the image-capturing chip 111 is a backside illumination CMOS image sensor. The image-capturing chip 111 includes a microlens layer 101, a color filter layer 102, a passivation layer 103, a semiconductor layer 106 and a wiring layer 108. At the image-capturing chip 111, the microlens layer 101, the color filter layer 102, the passivation layer 103, the semiconductor layer 106 and the wiring layer 108 are disposed in this order advancing along the Z axis+direction.

The microlens layer 101 includes a plurality of microlenses L. Via each microlens L, light having entered therein is condensed onto a photoelectric conversion unit 104 to be described later. The color filter layer 102 includes a plurality of color filters F. The color filters F in the color filter layer 102 are a plurality of different types of color filters with varying spectral characteristics. In more specific terms, first filters (R) having spectral characteristics whereby red-color component light is primarily transmitted through, second filters (Gb, Gr) having spectral characteristics whereby green-color component light is primarily transmitted through and third filters (B) having spectral characteristics whereby blue-color component light is primarily transmitted through are formed in the color filter layer 102. In the color filter layer 102, the first filters, the second filters and the third filters are disposed in, for instance, a Bayer array. The passivation layer 103, constituted with a nitride film or an oxide film, protects the semiconductor layer 106.

The semiconductor layer 106 includes photoelectric conversion units 104 and read-out circuits 105. The semiconductor layer 106 includes a plurality of photoelectric conversion units 104 present between a first surface 106a, which is a light-entry surface and a second surface 106b located on the opposite side from the first surface 106a. The plurality of photoelectric conversion units 104 are arrayed along the X axis and along the Y axis in the semiconductor layer 106. The photoelectric conversion units 104 have a photoelectric conversion function through which light is converted to an electric charge. In addition, electric charges, generated based upon photoelectric conversion signals, are accumulated in the photoelectric conversion units 104. The photoelectric conversion units 104 may be, for instance, photodiodes. The semiconductor layer 106 includes read-out circuits 105 located further toward the second surface 106b relative to the photoelectric conversion units 104. A plurality of read-out circuits 105 are arrayed along the X axis and Y axis in the semiconductor layer 106. The read-out circuits 105, each constituted with a plurality of transistors, read out image data obtained with electric charges resulting from the photoelectric conversion at the photoelectric conversion units 104 and outputs the image data thus read out to the wiring layer 108.

The wiring layer 108 includes a plurality of metal layers. The metal layers may be, for instance, Al wirings, Cu wirings and the like. The image data read out via the read-out circuits 105 are output to the wiring layer 108. The image data are then output to the signal processing chip 112 from the wiring layer 108 via the connecting portions 109.

It is to be noted that the connecting portions 109 may each be provided in correspondence to one of the photoelectric conversion units 104. As an alternative, the connecting portions 109 may each be provided in correspondence to a plurality of photoelectric conversion units 104. The pitch with which the connecting portions 109 are disposed in correspondence to a plurality of photoelectric conversion units 104 may be greater than the pitch with which the photoelectric conversion units 104 are disposed. In addition, the connecting portions 109 may be disposed in an area around the area where the photoelectric conversion units 104 are disposed.

The signal processing chip 112 includes a plurality of signal processing circuits. The signal processing circuits are engaged in signal processing executed on image data output from the image-capturing chip 111. Such a signal processing circuit may be, for instance, an amplifier circuit that amplifies the signal value of an image data signal, a correlated double sampling circuit engaged in noise reduction processing executed to reduce noise in the image data and an analog/digital (A/D) conversion circuit via which analog signals are converted to digital signals. The signal processing circuits may each be provided in correspondence to one of the photoelectric conversion units 104.

As an alternative, a signal processing circuit may be provided in correspondence to a plurality of photoelectric conversion units 104. The signal processing chip 112 includes a plurality of through electrodes (through vias) 110. The through electrodes (through vias) 110 may be, for instance, silicone through electrodes (through-silicon vias). The circuits disposed at the signal processing chip 112 are connected with one another via the through electrodes (through vias) 110. The through electrodes (through vias) 110 may also be disposed in a peripheral area at the image-capturing chip 111 and also at the memory chip 113. It is to be noted that some of the elements configuring a signal processing circuit may be disposed at the image-capturing chip 111. For instance, a comparator that compares an input voltage with a reference voltage in an analog/digital conversion circuit may be disposed at the image-capturing chip 111 with circuits such as a counter circuit and a latch circuit in the analog/digital conversion circuit disposed at the signal processing chip 112.

The memory chip 113 includes a plurality of storage units. Image data having undergone the signal processing at the signal processing chip 112 are stored in the storage units. The storage units may be, for instance, volatile memory circuits such as DRAMs. The storage units may each be provided in correspondence to one of the photoelectric conversion units 104. Alternatively, the storage units may each be provided in correspondence to a plurality of photoelectric conversion units 104. The image data stored in the storage units are output to an image processing unit located at a subsequent stage.

Figure 3:
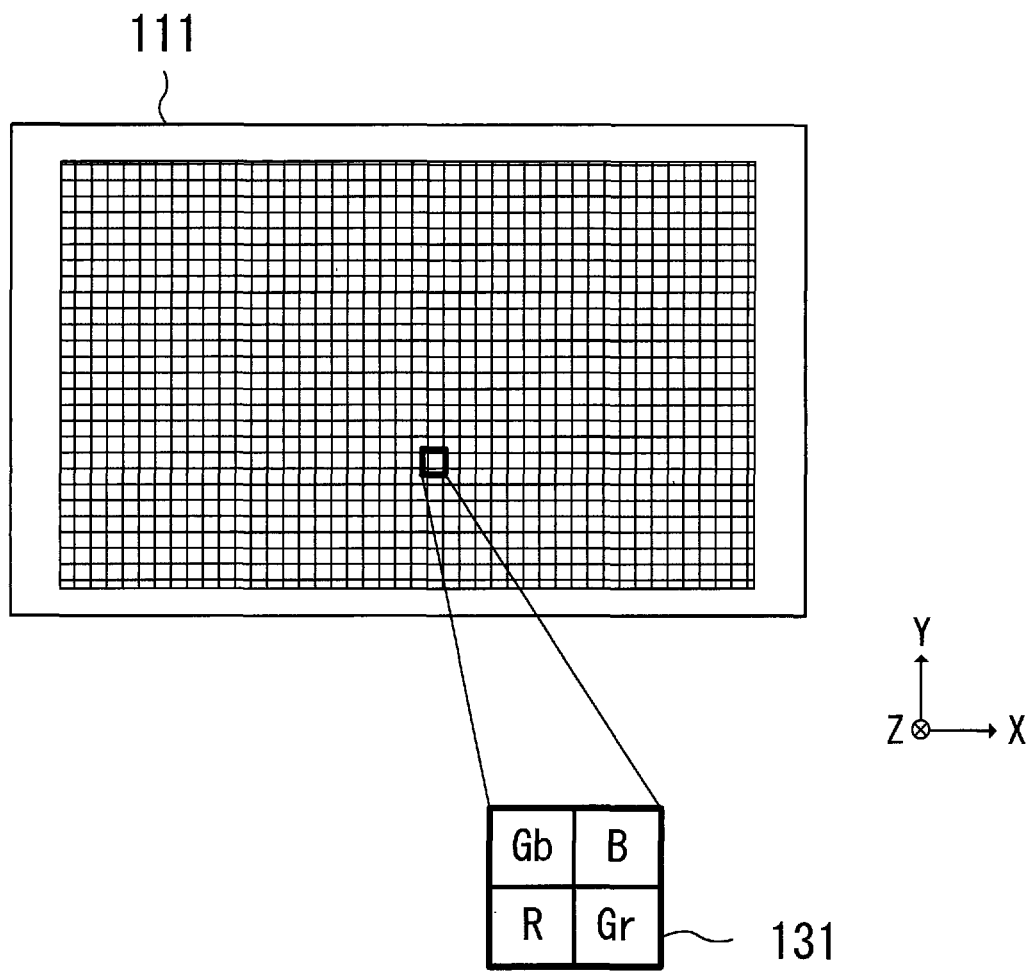

FIG. 3 illustrates the pixel array arrangement and unit areas 131 at the image-capturing chip 111. More specifically, it shows the image-capturing chip 111 viewed from the back-side (image-capturing surface side). At least 20 million pixels, for instance, are arrayed in a matrix pattern in a pixel area. In the example presented in FIG. 3, each unit area 131 is formed with 2 pixels×2 pixels=4 pixels disposed adjacent to each other. The grid lines in the figure indicate a concept based upon which adjacent pixels are grouped together to form a unit area 131. The number of pixels to form a unit area 131 is not limited to this example and a unit area 131 may instead be formed with approximately 1000 pixels, e.g., 32 pixels×32 pixels, with more or fewer than 32×32 pixels, or even with a single pixel.

As the partial enlargement of the pixel area indicates, the unit area 131 in FIG. 3 includes four pixels, i.e., green pixels Gb and Gr, a blue pixel B and a red pixel R, disposed therein in an arrangement pattern commonly referred to as a Bayer array pattern. The green pixels Gb and Gr each include a green color filter F, and thus receive light in the green color wavelength range in the incident light. Likewise, the blue-color pixel B includes a blue color filter F and receives light in the blue color wavelength range, whereas the red-color pixel R includes a red color filter F and receives light in the red color wavelength range.

In the embodiment, a plurality of blocks are defined so that each block contains at least one unit area 131. Namely, the minimum unit for constituting a block is a single unit area 131. As explained earlier, the smallest number of pixels to form a unit area 131, among the values that may be taken for the number of pixels, is one. Accordingly, if a block is to be defined in units of pixels, the value representing the smallest number of pixels, among values that may be taken for the number of pixels to define a single block, will be one. The pixels included in the individual blocks can be controlled by using control parameter values different from one another. All the unit areas 131 in a given block, i.e., all the pixels present within the particular block, are controlled under uniform image-capturing conditions. In other words, photoelectric conversion signals generated under different image-capturing conditions can be obtained from a pixel group in a given block and from a pixel group included in another block. Examples of such control parameters include the frame rate, the gain, the culling (subsampling) rate, the number of addition-undergoing rows or columns over which photoelectric conversion signals are to be added together, the duration or the number of times over which electric charges are to be accumulated and the number of bits (word length) for digitization. The image sensor 100 allows data to be culled along the direction in which columns extend (along the Y axis at the image-capturing chip 111) as well as along the direction in which the rows extend (along the X axis at the image-capturing chip 111). In addition, image processing parameters may be used as control parameters.

Figure 4:
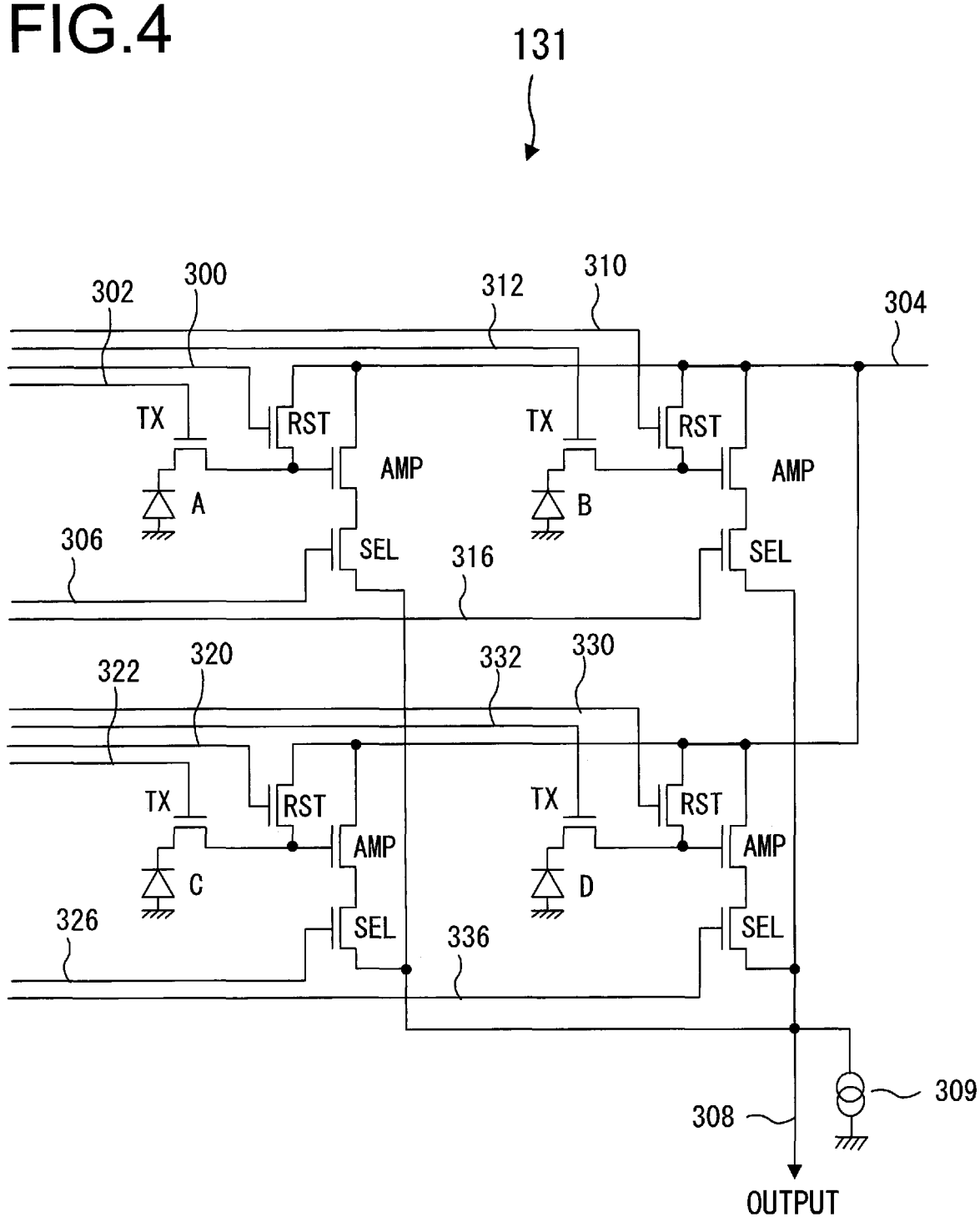

FIG. 4 illustrates circuits present in a unit area 131. In the example presented in FIG. 4, a single unit area 131 is formed with 2 pixels×2 pixels=4 pixels disposed adjacent to one another. It is to be noted that the number of pixels included in the unit area 131 is not limited to this example, as explained earlier. Namely, the unit area 131 may include 1000 pixels or more, or it may be made up with a single pixel. Reference signs A through D indicate two-dimensional positions taken within the unit area 131.

Pixel reset transistors (RST) present in the unit area 131 adopt a structure that allows them to be turned on/off independently of one another in correspondence to the individual pixels. FIG. 4 shows a reset wiring 300, via which the reset transistor for a pixel A is turned on/off, and a reset wiring 310, via which the reset transistor for pixel B is turn on/off, provided as a member separate from the reset wiring 300. Likewise, a reset wiring 320, via which the reset transistor for a pixel C is turned on/off, is provided as a member separate from the reset wirings 300 and 310. An exclusive reset wiring 330, via which the reset transistor is turned on/off is also provided for the remaining pixel D.

Pixel transfer transistors (TX) present in the unit area 131 also adopt a structure that allows them to be turned on/off independently of one another in correspondence to individual pixels. FIG. 4 shows a transfer wiring 302 via which the transfer transistor for the pixel A is turned on/off, a transfer wiring 312 via which the transfer transistor for the pixel B is turned on/off, and a transfer wiring 322 via which the transfer transistor for the pixel C is turned on/off, provided as members independent of one another. An exclusive transfer wiring 332, via which the transfer transistor is turned on/off is also provided for the remaining pixel D.

In addition, pixel selection transistors (SEL) present in the unit area 131 adopt a structure that allow them to be turned on/off the independently of one another in correspondence to individual pixels. FIG. 4 shows a selection wiring 306 via which the selection transistor for the pixel A is turned on/off, a selection wiring 316 via which the selection transistor for the pixel B is turned on/off, and a selection wiring 326 via which the selection transistor for the pixel C is turned on/off, provided as members independent of one another. An exclusive selection wiring 336, via which the selection transistor is turned on/off is also provided for the remaining pixel D.

It is to be noted that a common power wiring 304 is connected to all the pixels A through D included in the unit area 131. Likewise, a common output wiring 308 is connected to all the pixels A through D included in the unit area 131. In addition, while the power wiring 304 is a common wiring connected with a plurality of unit areas, output wirings 308 are installed each in correspondence to a specific unit area 131. A load current source 309 supplies an electric current to the output wiring 308. The load current source 309 may be disposed on the side where the image-capturing chip 111 is located or on the side where the signal processing chip 112 is located.

By individually turning on/off the reset transistors and the transfer transistors in the unit area 131, the electric charge accumulation parameters including the electric charge accumulation start time, the accumulation end time and the transfer timing can be controlled for each of the pixels A through D included in the unit area 131. In addition, by individually turning on/off the selection transistors in the unit area 131 independently of one another, the photoelectric conversion signals from the individual pixels A through D can be output via the common output wiring 308.

The electric charge accumulation at the pixels A through D in the unit area 131 may be controlled in an order regulated in correspondence to rows and columns through a method known as the rolling shutter method in the related art. In the rolling shutter method, as columns are specified after pixels are selected in correspondence to a specific row, photoelectric conversion signals are output in the order "ABCD" in the example presented in FIG. 4.

By configuring the circuits in correspondence to unit areas 131 as described above, it is ensured that the charge accumulation time can be controlled in correspondence to each unit area 131. Namely, the configuration makes it possible to individually output photoelectric conversion signals at varying frame rates from one unit area 131 to another. In addition, by allowing unit areas 131 in another block to idle while electric charge accumulation (image-capturing) is underway in unit areas 131 in a block at the image-capturing chip 111, it is possible to engage only a specific block at the image-capturing chip 111 in image-capturing operation so as to obtain the photoelectric conversion signals output from the particular block. Furthermore, different blocks (accumulation control target blocks) may be selected for electric charge accumulation (image-capturing) from one frame to another, so as to output photoelectric conversion signals from the different blocks successively engaged in image-capturing operation at the image-capturing chip 111.

As explained earlier, the output wirings 308 are installed each in correspondence to one of the unit areas 131. Since the image sensor 100 is configured by stacking the image-capturing chip 111, the signal processing chip 112 and the memory chip 113 one on another, wirings can be installed without having to increase the size of the individual chips along the planar direction by using the electrical connections between chips, achieved via the connecting portions 109 for the output wirings 308.

<Block Control at the Image Sensor>

The structure achieved in the embodiment makes it possible to set different image capturing conditions for different blocks among the plurality of blocks at the image sensor 32a. The control unit 34 (image-capturing control unit 34c) engages the image sensor in image-capturing operation under image-capturing conditions set in correspondence to each area among the plurality of areas each made to correspond to one of the blocks.

Figure 5:
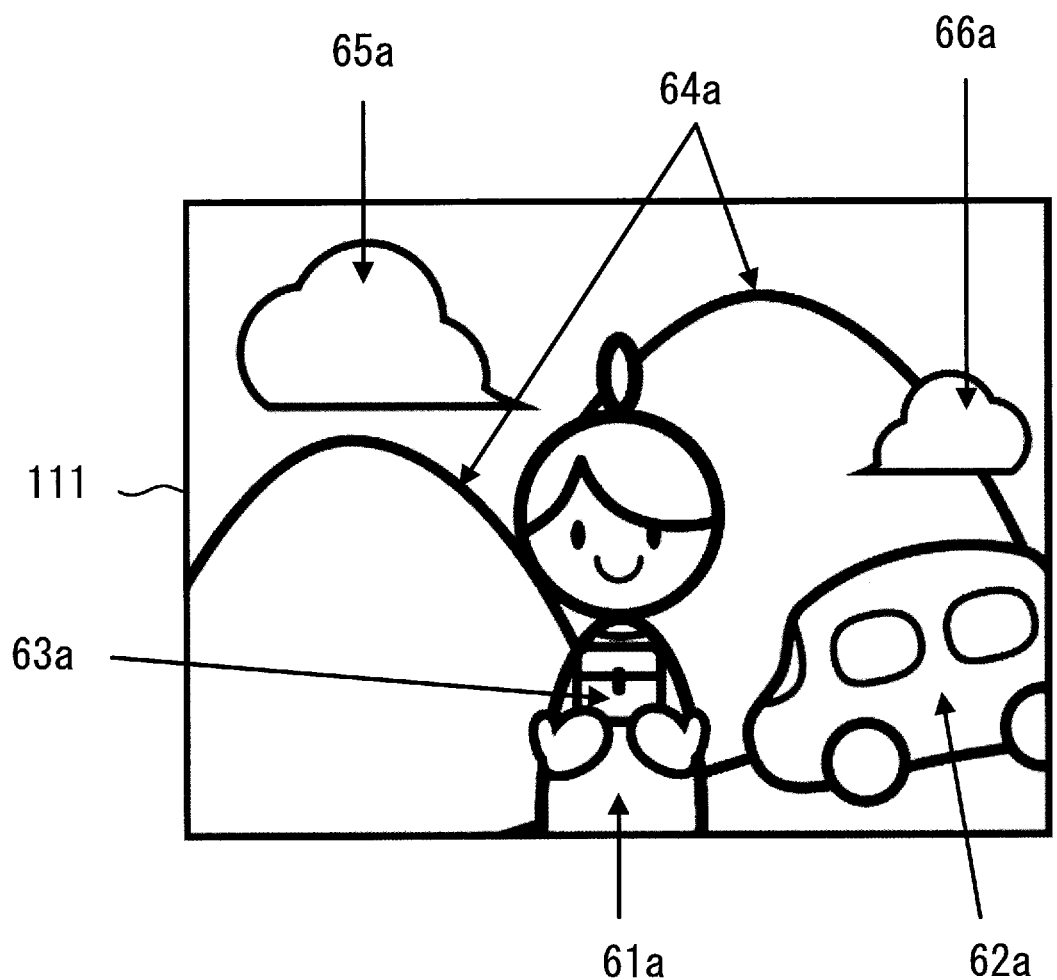

FIG. 5 schematically illustrates an image of a subject formed at the image sensor 32a in the camera 1. Before an image-capturing instruction is issued, the camera 1 obtains a live view image through photoelectric conversion of the subject image. The term "live view image" is used to refer to a monitor image repeatedly captured at a predetermined frame rate (e.g., 60 fps).

Before the imaging field is divided into separate areas by the setting unit 34b, the control unit 34 sets uniform image-capturing conditions for the entire range (i.e., the entire imaging field) of the image-capturing chip 111. When uniform image-capturing conditions are selected, common image-capturing conditions are set for the entire imaging field. However, even if there is variance in, for instance, the apex value of less than approximately 0.3 (stop), the image-capturing conditions are regarded to be uniform. The image-capturing conditions to be set uniformly for the entire range of the image-capturing chip 111 are determined based upon exposure conditions corresponding to the measured value representing the subject luminance or exposure conditions manually set by the user.

FIG. 5 shows an image that includes a person 61a, an automobile 62a, a purse 63a, mountains 64a and clouds 65a, and 66a, formed at the image-capturing surface of the image-capturing chip 111. The person 61a is holding the purse 63a with both hands. The automobile 62a is parked behind and to the right of the person 61a.

<Areal Division>

The control unit 34 divides the image plane of the live view image into a plurality of areas as described below based upon the live view image. First, the object detection unit 34a detects subject elements in the live view image. Subject element detection is executed by adopting a subject recognition technology of the known art. The object detection unit 34a detects the person 61a, the automobile 62a, the purse 63a, the mountains 64a, the cloud 65a, and the cloud 66a as subject elements in the example presented in FIG. 5.

Next, the setting unit 34b divides the live view image plane into areas that contain the subject elements listed above. The embodiment will be described by designating an area containing the person 61a as an area 61, an area containing the automobile 62a as an area 62, an area containing the person 63a as an area 63, an area containing the mountains 64a as an area 64, an area containing the cloud 65a as an area 65 and an area containing the cloud 66a as an area 66.

<Setting Image Capturing Conditions for Each Block>

Figure 6:
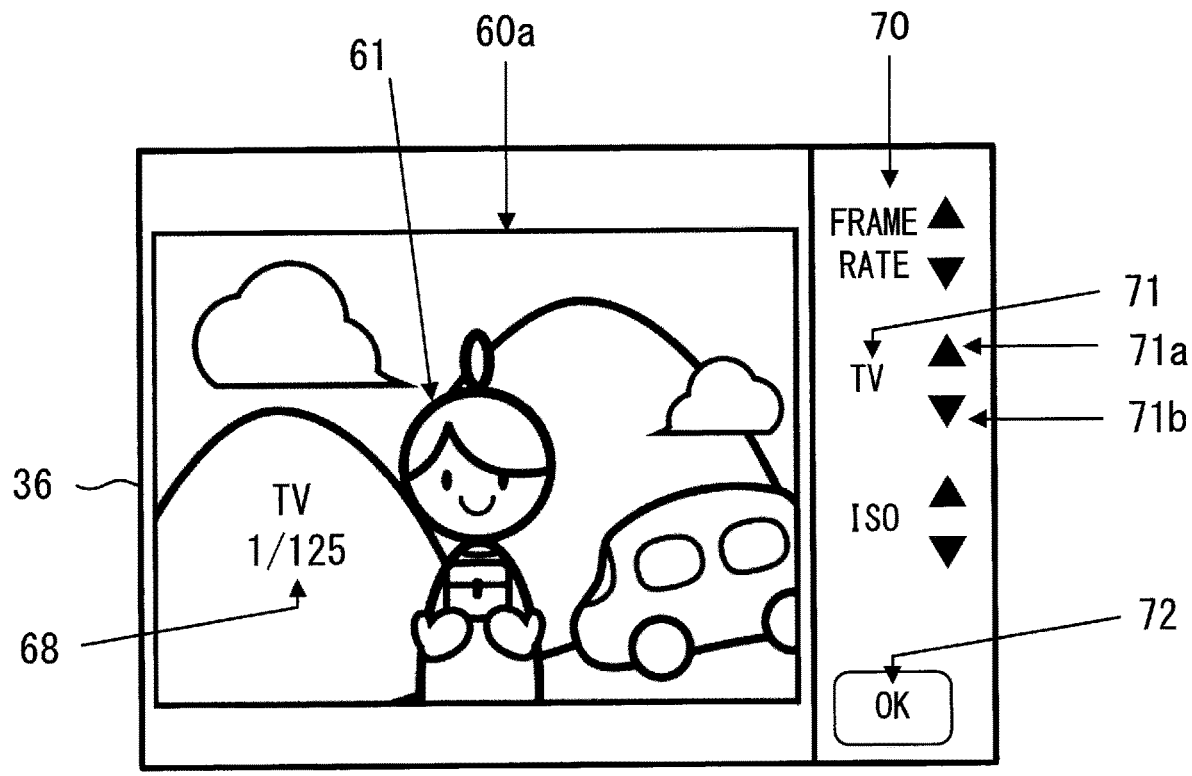

Once the image plane is divided into the plurality of areas via the setting unit 34b, the control unit 34 brings up on display at the display unit 35 a setting screen such as that shown in FIG. 6. FIG. 6 shows a live view image 60a brought up on display, with an image-capturing condition setting screen 70 displayed to the right relative to the live view image 60a.

The setting screen 70 includes the frame rate, the shutter speed (TV) and the gain (ISO), set in this order starting from the top, representing examples of image-capturing condition settings. The term "frame rate" is used to refer to the number of live view image frames obtained per second or the number of video image frames recorded by the camera 1 per second. The gain indicates the ISO sensitivity. Image-capturing conditions other than those in FIG. 6 may be added as needed as image-capturing condition settings. If all the settings cannot be fitted within the screen 70, excess settings may be displayed as the setting field is scrolled up and down.

In the embodiment, the control unit 34 designates an area selected by the user among the different areas defined by the setting unit 34b, as an image-capturing condition setting (adjustment) target. For instance, the camera 1 may allow touch-screen operations and in such a case, the user taps the display position corresponding to a primary photographic subject for which he wishes to set (adjust) image-capturing conditions on the display screen at the display unit 35 with the live view image 60a currently on display. If the user taps, for instance, the display position at which the person 61a is displayed, the control unit 34 designates the area 61 containing the person 61a in the live view image 60a as an image-capturing condition setting (adjustment) target area and displays the area 61 by highlighting the edges of the area 61.

The area 61 displayed with highlighted edges (bold-line edges, brightened edges, colored edges, dotted line edges, blinking edges or the like) in FIG. 6 is the image-capturing condition setting (adjustment) target area. In the example presented in FIG. 6 the live view image 60a on display includes the area 61 with highlighted edges. In this situation, the area 61 has been designated as the image-capturing condition setting (adjustment) target. For instance, the user of the camera 1 that allows touch-screen operations may tap a shutter speed (TV) display 71, and in response, the control unit 34 will display the current shutter speed setting for the highlighted area (i.e., the area 61) (see reference numeral 68).

While the following explanation is provided in relation to the camera 1 by assuming that it allows touch-screen operations, the present invention may be adopted in a camera in which image-capturing conditions are set (adjusted) by operating a button or the like configuring the operation member 36.

As the user taps either an UP icon 71a or a DOWN icon 71b for the shutter speed (TV), the setting unit 34b raises or lowers the shutter speed relative to the current setting in the shutter speed display 68 in correspondence to the tap operation, and also transmits an instruction for the image-capturing unit 32 (see FIG. 1) so as to adjust the image-capturing condition for the unit areas 131 (see FIG. 3) at the image sensor 32a corresponding to the highlighted area (the area 61), as indicated by the tap operation. An OK icon 72 is an operational icon via which a selected image-capturing condition is confirmed. The setting unit 34b sets (adjusts) the frame rate and the gain (ISO) in much the same way as it does the shutter speed (TV).

It is to be noted that while an explanation has been given on an example in which the setting unit 34b sets an image-capturing condition based upon a user operation, the present invention is not limited to this example. Instead of setting the image-capturing conditions in response to a user operation, the setting unit 34b may set an image-capturing condition based upon a decision made by the control unit 34. For instance, white-clipping (blown-out highlights) or black-clipping (crushed blacks) may have occurred in an area that includes a subject element achieving the highest or lowest luminance in the image and in such a case, the setting unit 34b may select an image-capturing condition so as to eliminate the white-clipping or black-clipping based upon a decision made by the control unit 34.

The initial image-capturing condition settings are sustained for areas that are not highlighted (areas other than the area 61).

Instead of highlighting the edges of the area designated as the image-capturing condition setting (adjustment) target, the control unit 34 may brighten the entire target area, may display the target area by increasing the contrast for the entire area or may flash the entire target area on display. As an alternative, it may frame the target area. The frame around the target area may be a double frame or a single frame, and the display mode for the frame around the target area, such as the type of line representing the frame, the color, the brightness or the like may be adjusted as needed. In addition, the control unit 34 may bring up on display a symbol such as an arrow pointing to the image-capturing condition setting target area in the vicinity of the target area. The control unit 34 may darken the areas other than the image-capturing condition setting (adjustment) target area or may display the areas other than the target area by lowering the contrast.

Once the image-capturing conditions for the individual areas have been set as described above, the shutter release button (not shown) constituting the operation member 36 or an image-capturing start instruction icon (shutter release icon) on display is operated, the control unit 34 controls the image-capturing unit 32 in response, so as to engage it in image-capturing operation under the image-capturing conditions individually set for the different areas. The image processing unit 33 then executes the image processing on image data obtained via the image-capturing unit 32. As explained earlier, the image processing can be executed under different image processing conditions set for different areas.

Once the image processing has been executed by the image processing unit 33, the recording unit 37, having received an instruction from the control unit 34, records the image data having undergone the image processing into the recording medium constituted with, for instance, a memory card (not shown). A sequence of image-capturing processing thus ends.

<Data Selection Processing>

As described above, once the setting unit 34b has divided the imaging field into a plurality of areas, image-capturing conditions can be set (adjusted) for an area selected by the user or for an area determined by the control unit 34. If different image-capturing conditions have been set for individual areas, the control unit 34 initiates the following data selection processing as needed.

1. When Executing Image Processing

If a specific type of image processing is to be executed on image data obtained by applying different image-capturing conditions for different areas, the image processing unit 33 (selection unit 33b) executes data selection processing as preliminary processing preceding the image processing on image data located near a boundary between areas. Through the specific type of image processing, image data are generated through calculation in correspondence to a processing target position set in the image by referencing image data available at a plurality of reference positions around the target position, and in more specific terms, such a specific type of image processing may be, for instance, defective pixel correction processing, color interpolation processing, edge enhancement processing or noise reduction processing.

The data selection processing is executed so as to lessen any unnatural appearance that is bound to occur in the processed image due to the difference in the image-capturing conditions set for divided areas. The target position may be located near the boundary between divided areas, and under such circumstances, image data obtained by applying image-capturing conditions matching those corresponding to image data at the target position and image data obtained by applying image-capturing conditions different from those corresponding to image data at the target position may both be present at the plurality of reference positions around the target position. In the embodiment, based upon the theory that it is more desirable to generate image data at the target position through calculation executed by referencing the image data at reference positions at which image-capturing conditions matching those for the target position have been applied rather than by referencing the image data at reference positions at which different image-capturing conditions have been applied, data to be used in the image processing are selected as described below.

FIG. 7(a) shows an area 80 near the boundary between the area 61 and the area 64 in the live view image 60a. In this example, first image-capturing conditions have been set at least for the area 61 that includes the person and second image-capturing conditions have been set for the area 64 that includes the mountains. FIG. 7(b) provides an enlargement of the area 80 near the boundary in FIG. 7(a). Image data from the pixels on the image sensor 32a, corresponding to the area 61 for which the first image-capturing conditions have been set, are indicated as unshaded squares, whereas image data from the pixels on the image sensor 32a, corresponding to the area 64 for which the second image-capturing conditions have been set, are indicated as shaded squares. In FIG. 7(b), image data from a target pixel P are located in the area 61, at a boundary area near a boundary 81 between the area 61 and the area 64. Pixels around the target pixel P, present within a predetermined range 90 centered on the target pixel P (e.g., a 3×3 pixel range) are designated as reference pixels (eight pixels in this example). FIG. 7(c) provides an enlarged view of the target pixel P and the reference pixels. The position taken by the target pixel P is the target position, whereas the positions taken by the reference pixels surrounding the target pixel P are reference positions.

The image processing unit 33 (generation unit 33c) may execute image processing by directly referencing the image data at the reference pixels without first executing the data selection processing. However, if the image-capturing conditions (first image-capturing conditions) applied at the target pixel P are different from the image-capturing conditions (second image-capturing conditions) applied at reference pixels around the target pixel P, the selection unit 33b selects image data obtained under the first image-capturing conditions, among the sets of image data at the reference pixels, as the image data to be used in the image processing, as in (example 1) through (example 3) described below. The generation unit 33c then executes the image processing so as to generate image data for the target pixel P through calculation by referencing the image data at the reference pixels selected through the data selection processing. In FIG. 7(c), the data output from the unshaded pixels are image data obtained under the first image-capturing conditions, whereas the data output from the shaded pixels are image data obtained under the second image-capturing conditions. In the embodiment, the image data obtained under the second image-capturing conditions are not selected and thus, the image data output from the shaded pixels are not used in the image processing.

Example 1

If, for instance, the first image-capturing conditions and the second image-capturing conditions are different from each other only in the ISO sensitivity with an ISO sensitivity setting of 100 selected for the first image-capturing conditions and an ISO sensitivity setting of 800 selected for the second image-capturing conditions, the image processing unit 33 (selection unit 33b) selects image data obtained under the first image-capturing conditions, among the sets of image data at the reference pixels, as the image data to be used in the image processing. In other words, the image data obtained under the second image-capturing conditions different from the first image-capturing conditions, among the sets of image data at the reference pixels, are not used in the image processing.

Example 2

If the first image-capturing conditions and the second image-capturing conditions are different from each other only in the shutter speed with a shutter speed setting of 1/1000 sec selected for the first image-capturing conditions and a shutter speed setting of 1/100 sec selected for the second image-capturing conditions, the image processing unit 33 (selection unit 33b) selects image data obtained under the first image-capturing conditions, among the sets of image data at the reference pixels, as the image data to be used in the image processing. In other words, the image data obtained under the second image-capturing conditions different from the first image-capturing conditions, among the sets of image data at the reference pixels, are not used in the image processing.

Example 3

If the first image-capturing conditions and the second image-capturing conditions are different from each other only in the frame rate (with uniform electric charge accumulation time) with a frame rate setting of 30 fps selected for the first image-capturing conditions and a frame rate setting of 60 fps selected for the second image-capturing conditions, the image processing unit 33 (selection unit 33b) selects image data obtained under the second image-capturing conditions (60 fps), among the sets of image data at the reference pixels, which express frame images obtained with timing close to the timing with which frame images have been obtained under the first image-capturing conditions (30 fps). Namely, image data expressing frame images obtained with timing significantly different from the timing with which the frame images have been obtained under the first image-capturing conditions (30 fps) among the sets of image data at the reference pixels, are not used in the image processing.

If, on the other hand, the image-capturing conditions applied at the target pixel P and the image-capturing conditions applied at all the reference pixels around the target pixel P match completely, the image processing unit 33 (selection unit 33b) selects all the image data. For instance, upon deciding that image-capturing conditions identical to the image-capturing conditions set for the target pixel P have been applied at all the reference pixels, the image processing unit executes the image processing so as to generate image data for the target pixel P through calculation by directly referencing the image data at all the reference pixels.

It is to be noted that as has been explained earlier, image-capturing conditions indicating a slight difference (e.g., apex values different from each other by 0.3 (stop) or less) may be regarded as uniform image-capturing conditions.

<Examples of Image Processing>

Examples of image processing that may be executed in conjunction with data selection processing will be explained next.

(1) Defective Pixel Correction Processing

Defective pixel correction processing is a type of image processing executed during image-capturing operation in the embodiment. Generally, a pixel defect may occur during or following the production process through which the image sensor 100, which is a solid-state image sensor, is manufactured, and image data may be output from a defective pixel at an abnormal level. Accordingly, the image processing unit 33 (generation unit 33c) corrects image data output from a defective pixel so as to render the image data at the pixel position at which a pixel defect has occurred, less conspicuous.

An example of defective pixel correction processing will be described below. The image processing unit 33 (generation unit 33c) designates, for instance, a pixel in an image corresponding to a single frame, which takes a defective pixel position recorded in advance in a nonvolatile memory (not shown), as a target pixel P (processing target pixel) and also designates pixels (eight pixels in this example) present around the target pixel P within a predetermined range 90 (e.g., a 3×3 pixel range) centered around the target pixel P (see FIG. 7(c)) as reference pixels.

The image processing unit 33 (generation unit 33c) calculates a largest value and a smallest value among the values indicated in the image data obtained at the reference pixels, and if the image data output from the target pixel P indicate a value greater than the largest value or smaller than the smallest value, it executes Max, Min filter processing so as to replace the image data output from the target pixel P either with the image data indicating the largest value or the smallest value. This processing is executed for all the defective pixels, the position information for which is recorded in the nonvolatile memory.

The image processing unit 33 (selection unit 33b) in the embodiment selects image data, among the sets of image data at the reference pixels, obtained under the first image-capturing conditions, if the reference pixels include pixels to which the second image-capturing conditions, different from the first image-capturing conditions applied at the target pixel P, have been applied. Then the image processing unit 33 (generation unit 33c) executes the Max, Min filter processing, as described above, by referencing the selected image data. It is to be noted that the defective pixel correction processing may be executed by averaging the values in the selected image data.

(2) Color Interpolation Processing

Color interpolation processing is a type of image processing executed during image-capturing operation in the embodiment. As shown in FIG. 3, green-color pixels Gb and Gr, blue-color pixels B and red-color pixels R are disposed in a Bayer array at the image-capturing chip 111 in the image sensor 100. Since image data with color components different from the color component corresponding to the color filter disposed at a given pixel position are missing at the particular pixel position, the image processing unit 33 (generation unit 33c) executes color interpolation processing so as to generate image data for the missing color components by referencing image data at positions taken by surrounding pixels.

An example of color interpolation processing will be explained. FIG. 8(a) shows how image data output from the image sensor 100 may be arranged. In line with the Bayer array rules, sets of image data corresponding to the various pixel positions each take a specific color among R, G and B.

<G Color Interpolation>

Standard G color interpolation will be described first. The image processing unit 33 (generation unit 33c) engaged in G color interpolation sequentially designates positions each corresponding to the R color component or the B color component as a target position and generates G color component image data for the target position by referencing four sets of G color component image data at reference positions around the target position. For instance, when generating G color component image data for the target position framed with bold lines in FIG. 8(b), (i.e., a second-row/second-column position, counting from the upper left corner. In the following description, the target position will be likewise indicated in relation to the row and the column it occupies relative to the upper left corner position), the four sets of G color component image data G1 through G4 located near the target position (second row/second column) are referenced. The image processing unit 33 (generation unit 33c) may generate, for instance, G color component image data (aG1+bG2+cG3+dG4)/4 for the target position (second row/second column). It is to be noted that a through d are weighting coefficients each selected in correspondence to the distance between the specific reference position and the target position and the image structure.

Next, the G color interpolation executed in the embodiment will be explained. In FIG. 8(a) through FIG. 8(c) the first image-capturing conditions are set for the area located to the left of and above the bold lines and the second image-capturing conditions are set for the area located to the right of and below the bold lines. It is to be noted that the first image-capturing conditions and the second image-capturing conditions set as shown in FIG. 8(a) through FIG. 8(c) are different from each other. In addition, the G color component image data G1 through G4 in FIG. 8(b) are located at positions designated as reference positions referenced in the image processing executed for the pixel at the target position (second row/second column). The first image-capturing conditions are set for the target position (second row/second column) in FIG. 8(b). The image data G1 through G3 located at some of the reference positions have been obtained under the first image-capturing conditions. However, the image data G4 located at one of the reference positions have been obtained under the second image-capturing conditions. Accordingly, the image processing unit 33 (selection unit 33b) selects the image data G1 through G3 obtained under the first image-capturing conditions among the G color component image data G1 through G4. The image processing unit 33 (generation unit 33c) executes calculation so as to generate G color component image data for the target position (second row/second column) by referencing the image data selected as described above. The image processing unit 33 (generation unit 33c) may generate, for instance, G color component image data (a1G1+b1G2+c1G3)/3 for the target position (second row/second column). It is to be noted that a1 through c1 are weighting coefficients each selected in correspondence to the distance between the specific reference position and the target position and the image structure.

The image processing unit 33 (generation unit 33c) is able to obtain G color component image data for each pixel position, as shown in FIG. 8(c) by generating G color component image data at each position among the B color component positions and the R color component positions in FIG. 8(a).

<R Color Interpolation>

FIG. 9(a) shows only the R color component image data extracted from the image data in the diagram in FIG. 8(a). The image processing unit 33 (generation unit 33c) generates, through calculation, image data representing a chrominance component Cr in FIG. 9(b), based upon the G color component image data shown in FIG. 8(c) and the R color component image data shown in FIG. 9(a).

Standard chrominance component Cr interpolation will be described first. For instance, when generating chrominance component image data Cr corresponding to the chrominance component Cr for the target position (second-row/second-column) indicated for the target position framed with bold lines in FIG. 9(b), four sets of chrominance component image data Cr1 through Cr4 located near the target position (second row/second column) are referenced. The image processing unit 33 (generation unit 33c) may generate, for instance, chrominance component image data Cr (eCr1+fCr2+gCr3+hCr4)/4 for the target position (second row/second column). It is to be noted that e through h are weighting coefficients each selected in correspondence to the distance between the specific reference position and the target position and the image structure.

Likewise, when generating image data corresponding to the chrominance component Cr for the target position (second-row/third-column) framed with bold lines in FIG. 9(c), four sets of chrominance component image data Cr2 and Cr4 through Cr6 located near the target position (second row/third column) are referenced. The image processing unit 33 (generation unit 33c) may generate, for instance, chrominance component image data Cr (qCr2+rCr4+sCr5+tCr6)/4 for the target position (second row/third column). It is to be noted that q through t are weighting coefficients each selected in correspondence to the distance between the specific reference position and the target position and the image structure. Chrominance component image data Cr are generated for each pixel position through the process described above.

Next, the chrominance component Cr interpolation executed in the embodiment will be explained. In FIG. 9(a) through FIG. 9(c) the first image-capturing conditions are set for the area located to the left of and above the bold lines and the second image-capturing conditions are set for the area located to the right of and below the bold lines. It is to be noted that the first image-capturing conditions and the second image-capturing conditions set as shown in FIG. 9(a) through FIG. 9(c) are different from each other. The position indicated with the bold-line frame (second row/second column) in FIG. 9(b) is the target position for the chrominance component Cr interpolation. In addition, the chrominance component image data Cr1 through Cr4 in FIG. 9(b) are located at positions designated as reference positions in the image processing executed for the pixel at the target position (second row/second column). The first image-capturing conditions are set for the target position (second row/second column) in FIG. 9(b). The image data Cr1, Cr3 and Cr4 located at some of the reference positions have been obtained under the first image-capturing conditions. However, the image data Cr2 located at one of the reference positions have been obtained under the second image-capturing conditions. Accordingly, the image processing unit 33 (selection unit 33b) selects the image data Cr1, Cr3 and Cr4 obtained under the first image-capturing conditions among the chrominance component image data Cr1 through Cr4. The image processing unit 33 (generation unit 33c) then executes calculation so as to generate chrominance component image data Cr for the target position (second row/second column) by referencing the image data selected as described above. The image processing unit 33 (generation unit 33c) may generate, for instance, chrominance component image data Cr (e1Cr1+g1Cr3+h1Cr4)/3 for the target position (second row/second column). It is to be noted that e1, g1 and h1 are weighting coefficients each selected in correspondence to the distance between the specific reference position and the target position and the image structure.

In addition, the target position for the chrominance component Cr interpolation is the position indicated with the bold-line frame (second row/third column) in FIG. 9(c). The chrominance component image data Cr2, Cr4, Cr5 and Cr6 in FIG. 9(c) are located at positions designated as reference positions in the image processing executed for the pixel at the target position (second row/third column). The second image-capturing conditions are set for the target position (second row/third column) in FIG. 9(c). The image data Cr4 and Cr5 located at some of the reference positions have been obtained under the first image-capturing conditions. However, the image data Cr2 and Cr6 located at the other reference positions have been obtained under the second image-capturing conditions.

Accordingly, the image processing unit 33 (selection unit 33b) selects the image data Cr2 and Cr6 obtained under the second image-capturing conditions among the chrominance component image data Cr2 and Cr4 through Cr6 based upon a principle similar to that described in reference to FIG. 9(b). The image processing unit 33 (generation unit 33c) then executes calculation so as to generate chrominance component image data Cr for the target position (second row/third column) by referencing the image data selected as described above. The image processing unit 33 (generation unit 33c) may generate, for instance, chrominance component image data (g2Cr2+h2Cr6)/2 for the target position (second row/third column). It is to be noted that g2 and h2 are weighting coefficients each selected in correspondence to the distance between the specific reference position and the target position and the image structure.

Once chrominance component image data Cr have been obtained for each pixel position, the image processing unit 33 (generation unit 33c) is able to obtain R color component image data corresponding to each pixel position by adding each set of G color component image data in FIG. 8(c) to the chrominance component image data Cr at the corresponding pixel position.

<B Color Interpolation>

FIG. 10(a) shows only the B color component image data extracted from the image data in the diagram in FIG. 8(a). The image processing unit 33 (generation unit 33c) generates, through calculation, image data representing a chrominance component Cb in FIG. 10(b), based upon the G color component image data shown in FIG. 8(c) and the B color component image data shown in FIG. 10(a).

Standard chrominance component Cb interpolation will be described first. For instance, when generating image data corresponding to the chrominance component image data Cb for the target position (third-row/third-column) framed with bold lines in FIG. 10(b), four sets of chrominance component image data Cb1 through Cb4 located near the target position (third row/third column) are referenced. The image processing unit 33 (generation unit 33c) may generate, for instance, chrominance component image data Cb (uCb1+vCb2+wCb3+xCb4)/4 for the target position (third row/third column). It is to be noted that u through x are weighting coefficients each selected in correspondence to the distance between the specific reference position and the target position and the image structure.

Likewise, when generating chrominance component image data Cb for the target position (third-row/fourth-column) framed with bold lines in FIG. 10(c), four sets of chrominance component image data Cb2 and Cb4 through Cb6 located near the target position (third row/fourth column) are referenced. The image processing unit 33 (generation unit 33c) may generate, for instance, chrominance component image data Cb (yCb2+zCb4+αCb5+βCb6)/4 for the target position (third row/fourth column). It is to be noted that y, z, α and β are weighting coefficients each selected in correspondence to the distance between the specific reference position and the target position and the image structure. Chrominance component image data Cb are generated for each pixel position through the process described above.

Next, the chrominance component Cb interpolation executed in the embodiment will be explained. In FIG. 10(a) through FIG. 10(c), the first image-capturing conditions are set for the area located to the left of and above the bold lines and the second image-capturing conditions are set for the area located to the right of and below the bold lines. It is to be noted that the first image-capturing conditions and the second image-capturing conditions set as shown in FIG. 10(a) through FIG. 10(c) are different from each other. The position indicated with the bold-line frame (third row/third column) in FIG. 10(b) is the target position for the chrominance component Cb interpolation. In addition, the chrominance component image data Cb1 through Cb4 in FIG. 10(b) are located at positions designated as reference positions in the image processing executed for the pixel at the target position (third row/third column). The second image-capturing conditions are set for the target position (third row/third column) in FIG. 10(b). The image data Cb1 and Cb3 located at some of the reference positions have been obtained under the first image-capturing conditions. However, the image data Cb2 and Cb4 located at the other reference positions have been obtained under the second image-capturing conditions. Accordingly, the image processing unit 33 (selection unit 33b) selects the image data Cb2 and Cb4 obtained under the second image-capturing conditions among the chrominance component image data Cb1 through Cb4. The image processing unit 33 (generation unit 33c) then executes calculation so as to generate chrominance component image data Cb for the target position (third row/third column) by referencing the image data selected as described above. The image processing unit 33 (generation unit 33c) may generate, for instance, chrominance component image data Cb (v1Cb2+x1Cb4)/2 for the target position (third row/third column). It is to be noted that v1 and x1 are weighting coefficients each selected in correspondence to the distance between the specific reference position and the target position and the image structure.

Chrominance component image data Cb are generated in much the same way for the target position (third row/fourth column) indicated with the bold-line frame in FIG. 10(c).

The target position for the chrominance component Cb interpolation is the position indicated with the bold-line frame (third row/fourth column) in FIG. 10(c). In addition, the chrominance component image data Cb2 and Cb4 through Cb6 in FIG. 10(c) are located at positions designated as reference positions in the image processing executed for the pixel at the target position (third row/fourth column). The second image-capturing conditions are set for the target position (third row/fourth column) in FIG. 10(c). Furthermore, the image data Cb2 and Cb4 through Cb6 at all the reference positions have been generated under the second image-capturing conditions. Accordingly, the image processing unit 33 (generation unit 33c) generates chrominance component image data Cb for the target position (third row/fourth column) by referencing the four sets of chrominance component image data Cb2 and Cb4 through Cb6 located near the target position (third row/fourth column).

Once chrominance component image data Cb have been obtained for each pixel position, the image processing unit 33 (generation unit 33c) is able to obtain B color component image data in correspondence to each pixel position by adding each set of G color component image data in FIG. 8(c) to the chrominance component image data Cb at the corresponding pixel position.

(3) Edge Enhancement Processing

An example of edge enhancement processing will be explained next. The image processing unit 33 (generation unit 33c) executes, for instance, a linear filter operation of the known art for a single image frame by using a kernel of a predetermined size centered on a target pixel P (processing target pixel). Assuming that a sharpening filter representing an example of a linear filter takes a kernel size of N×N pixels, the position taken by the target pixel P is the target position and the positions taken by ($N^2$−1) reference pixels surrounding the target pixel P are reference positions.

It is to be noted that the kernel size may be N pixels×M pixels instead.

The image processing unit 33 (generation unit 33c) executes filter processing through which the image data at the target pixel P are replaced with linear filter operation results starting, for instance, on the horizontal line at the top of the frame image and moving toward the horizontal line at the bottom by shifting the target pixel from left to right on each horizontal line.

If the reference pixels described above include pixels to which second image-capturing conditions different from first image-capturing conditions applied at the target pixel P are applied, the image processing unit 33 (selection unit 33b) in the embodiment selects image data obtained under the first image-capturing conditions among the sets of image data at the reference pixels. Subsequently, the image processing unit 33 (generation unit 33c) executes the linear filter processing mentioned earlier by referencing the selected image data.

(4) Noise Reduction Processing

An example of noise reduction processing will be explained next. The image processing unit 33 (generation unit 33c) may execute, for instance, a linear filter operation of the known art for, for instance, a single image frame by using a kernel of a predetermined size centered on a target pixel P (processing target pixel). Assuming that a smoothing filter representing an example of a linear filter takes a kernel size of N×N pixels, the position taken by the target pixel P is the target position and the positions taken by ($N^2$−1) reference pixels surrounding the target pixel P are reference positions.

It is to be noted that the kernel size may be N×M pixels instead.

The image processing unit 33 (generation unit 33c) executes filter processing through which the image data at the target pixel P are replaced with linear filter operation results starting, for instance, on the horizontal line at the top of the frame image and moving toward the horizontal line at the bottom by shifting the target pixel from left to right on each horizontal line.

If the reference pixels described above include pixels to which second image-capturing conditions different from first image-capturing conditions applied at the target pixel P are applied, the image processing unit 33 (selection unit 33b) in the embodiment selects image data obtained under the first image-capturing conditions among the sets of image data at the reference pixels. Subsequently, the image processing unit 33 (generation unit 33c) executes the linear filter processing mentioned earlier by referencing the selected image data.

As described above, if the reference pixels include pixels to which the second image-capturing conditions different from the first image-capturing conditions applied at the target pixel P are applied, the image processing unit 33 (selection unit 33b) selects image data obtained under the first image-capturing conditions among the sets of image data obtained at the reference pixels. Subsequently, the image processing unit 33 (generation unit 33c) executes image processing such as defective pixel correction processing, color interpolation processing, edge enhancement processing or noise reduction processing by referencing the selected image data. The image processing unit 33 (selection unit 33b) generates an image by executing similar processing for image data (including image data obtained under the second image-capturing conditions) originating from other pixels, output from the image sensor. The image thus generated is brought up on display at a display unit such as a display device.

2. When Executing Focus Detection Processing

The control unit 34 (AF operation unit 34d) executes focus detection processing by using image data corresponding to a specific position (focus detection position) on the imaging field. If different image-capturing conditions have been set for different areas and the focus detection position for an AF operation is located at a boundary between areas, the control unit 34 (AF operation unit 34d) executes data selection processing on image data obtained for purposes of focus detection, which are located near the boundary of the areas, as preliminary processing prior to the focus detection processing.

The data selection processing is executed in order to minimize the extent to which the accuracy of the focus detection processing is lowered due to different image-capturing conditions set for different areas in the imaging field divided by the setting unit 34b. For instance, the image data to be used for focus detection available at the focus detection position set to detect an image shift quantity representing the extent of image misalignment (phase difference) in the image, may be located near a boundary between areas and in such a case, the focus detection image data may include image data obtained under different image-capturing conditions. In the embodiment, data selection processing is executed as described below based upon the theory that it is better to detect an image shift quantity (phase difference) by using image data obtained under uniform image-capturing conditions rather than to detect an image shift quantity (phase difference) by using image data obtained under different image-capturing conditions.

<Example of Focus Detection Processing>

An example of focus detection processing executed in conjunction with data selection processing will be described. Through the AF operation executed in the embodiment, focus is adjusted on a subject corresponding to, for instance, a focus detection position selected by the user from a plurality of focus detection positions. The control unit 34 (AF operation unit 34*d*) calculates a defocus quantity representing the extent of defocusing in the image-capturing optical system 31 by detecting the image shift quantity (phase difference) representing the extent of image misalignment among a plurality of subject images formed with light fluxes having passed through different pupil areas at the image-capturing optical system 31. The control unit 34 (AF operation unit 34*d*) then drives the focus lens in the image-capturing optical system 31 to a position at which the defocus quantities is reduced to 0 (equal to or less than an allowable value), i.e., to the in-focus position.

Figure 11:
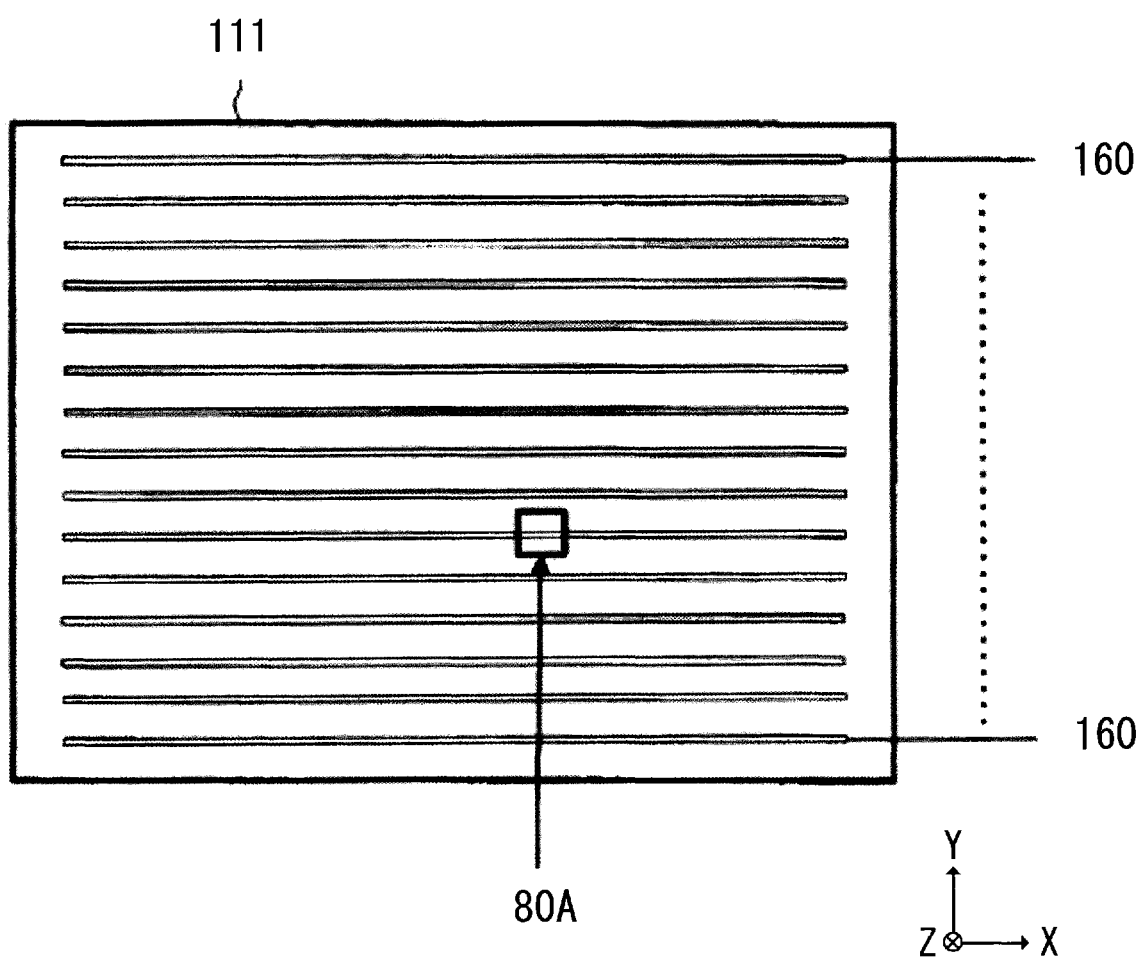
FIG. 11 A diagram presenting examples of positions at which focus detection pixels may be disposed at the image-capturing surface FIG. 12 An enlarged view of an area of a focus detection pixel line FIG. 13 An enlarged view of the focus detection position FIG. 14 An example of a template image representing a detection target object illustrated in FIG. 14(a), and an example of a live view image and the corresponding search range presented in FIG. 14(b)

FIG. 11 presents an example of positional arrangement with which focus detection pixels may be disposed at the image-capturing surface of the image sensor 32*a*. In the embodiment, focus detection pixels are disposed in series at discrete positions along the X axis (along the horizontal direction) at the image-capturing chip 111. In the example presented in FIG. 11, 15 focus detection pixel lines 160 are set over a predetermined interval. Focus detection pixels making up focus detection pixel lines 160 each output a photoelectric conversion signal to be used for focus detection. Standard image-capturing pixels are disposed at pixel positions other than those on the focus detection pixel lines 160 at the image-capturing chip 111. The image-capturing pixels output photoelectric conversion signals used to generate a live view image or an image to be recorded.

Figure 12:
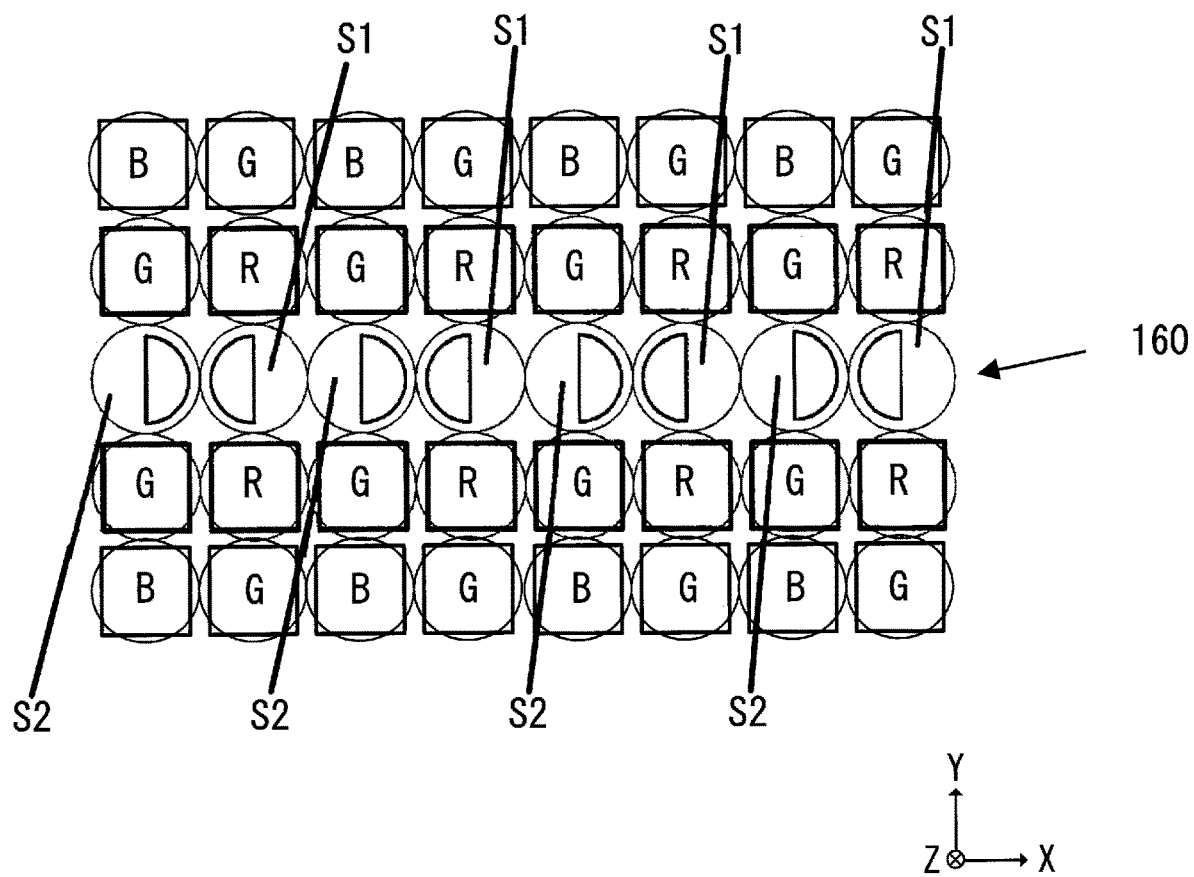

FIG. 12 is an enlarged view of part of the focus detection pixel line 160 corresponding to a focus detection position 80A in FIG. 11. FIG. 12 shows red-color pixels R, green-color pixels G (Gb, Gr) blue-color pixels B, focus detection pixels S1 and focus detection pixels S2. The red-color pixels R, the green-color pixels G (Gb, Gr) and the blue-color pixels B are disposed in conformance to the Bayer array rules described earlier.

The square areas representing the red-color pixels R, the green-color pixels G (Gb, Gr) and the blue-color pixels B each indicate a light receiving area of an image-capturing pixel. The individual image-capturing pixels each receive a light flux having passed through an exit pupil in the image-capturing optical system 31 (see FIG. 1). In other words, the red-color pixels R, the green-color pixels G (Gb, Gr) and the blue-color pixels B each include a square-shaped mask opening and light having passed through the mask openings reaches the light receiving portions at the image-capturing pixels.

It is to be noted that the shape of the light receiving areas (mask openings) at the red-color pixels R, the green-color pixels G (Gb, Gr) and the blue-color pixels B does not need to be quadrangular and the light receiving areas may be formed in a round shape.

The semicircular areas in the focus detection pixels S1 and the focus detection pixels S2 each indicate a light receiving area at a focus detection pixel. Namely, the focus detection pixels S1 each include a semicircular mask opening located on the left side of the pixel in FIG. 12, and light having passed through the mask openings reaches the light receiving portions at the focus detection pixels S1. The focus detection pixels S2, on the other hand, each include a semicircular mask opening located on the right side of the pixel in FIG. 12, and light having passed through the mask openings reaches the light receiving portions at the focus detection pixels S2. Thus, a pair of light fluxes passing through different areas of the exit pupil in the image-capturing optical system 31 (see FIG. 1) are received, one at the focus detection pixels S1 and the other at the focus detection pixels S2.

It is to be noted that the positions taken by the focus detection pixel lines 160 at the image-capturing chip 111 are not limited to those in the example presented in FIG. 11. In addition, the number of focus detection pixel lines 160 is not limited to the example presented in FIG. 11. Furthermore, the mask openings at the focus detection pixels S1 and the focus detection pixels S2 may assume, for instance, a rectangular shape achieved by splitting the square light receiving area (mask opening) at an image-capturing pixel R, an image-capturing pixel G or an image-capturing pixel B along the lateral direction, instead of the semicircular shape.

Moreover, focus detection pixel lines 160 may each be formed by disposing focus detection pixels one after another along the Y axis (along the vertical direction) at the image-capturing chip 111, instead. An image sensor configured with image-capturing pixels and focus detection pixels disposed in a two-dimensional array as shown in FIG. 12 is of the known art, and detailed illustrations and a detailed explanation of these pixels are not provided.

It is to be noted that each focus detection pixel S1 or S2 receives one light flux in the pair of focus detection light fluxes in the example presented in FIG. 12. As an alternative, both light fluxes in the pair of focus detection light fluxes may be received at each focus detection pixel. By allowing each focus detection pixel to receive both light fluxes in the pair of focus detection light fluxes, the photoelectric conversion signals obtained from the focus detection pixels can be also used as photoelectric conversion signals to be recorded.

The control unit 34 (AF operation unit 34*d*) detects the image shift quantity (phase difference) representing the extent of image misalignment occurring between a pair of images formed with the pair of light fluxes passing through different areas in the image-capturing optical system 31 (see FIG. 1) based upon focus detection photoelectric conversion signals (signal data) output from the focus detection pixels S1 and the focus detection pixels S2. Then, it executes an arithmetic operation to calculate a defocus quantity based upon the image shift quantity (phase difference). Since the arithmetic operation executed to calculate the defocus quantity through this split pupil phase method is of the known art in the field of cameras, a detailed explanation is not provided.

Figure 13:
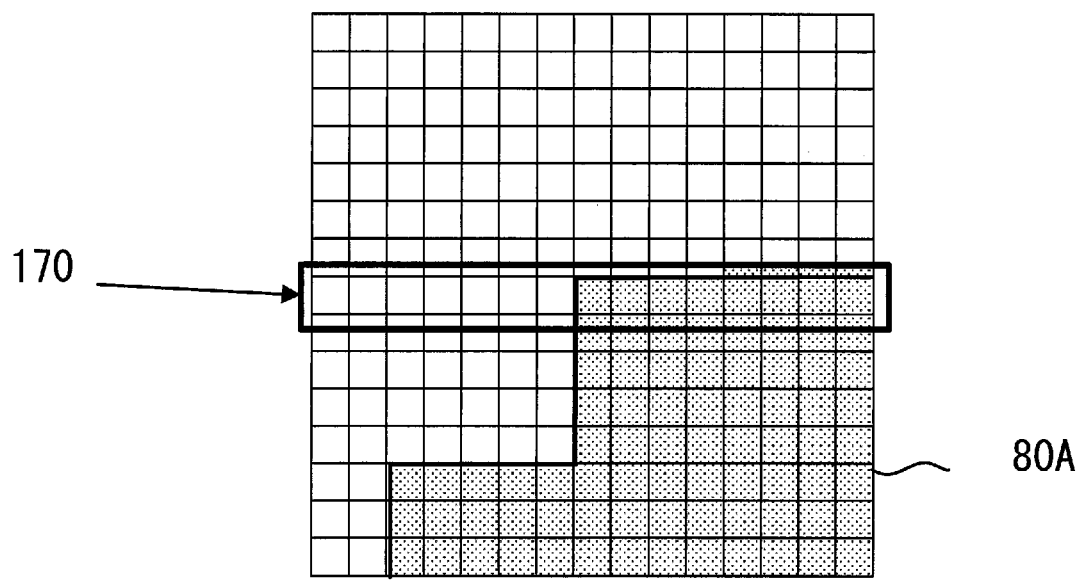

It is assumed that the focus detection position 80A (see FIG. 11), located at a position corresponding to the area 80 near the boundary of the area 61 in the live view image 60A such as that shown in FIG. 7(*a*) has been selected by the user. FIG. 13 presents an enlarged view of the focus detection position 80A. The first image-capturing conditions have been set for the unshaded pixels, whereas the second image-capturing conditions have been set for the shaded pixels. The area enclosed by a frame 170 in FIG. 13 corresponds to the focus detection pixel line 160 (see FIG. 11).

The control unit 34 (AF operation unit 34*d*) normally executes focus detection processing by directly using focus detection signal data output from the focus detection pixels within the frame 170 without executing data selection processing. However, if the focus detection signal data from the area enclosed by the frame 170 include both focus detection signal data obtained under the first image-capturing conditions and focus detection image data obtained under the second image-capturing conditions, the control unit 34 (AF operation unit 34*d*) selects the focus detection signal data obtained under the first image-capturing conditions, among the sets of focus detection signal data available in the area enclosed by the frame 170, as focus detection signal data to be used for the focus detection processing, as explained in reference to (example 1) through (example 3) below. The control unit 34 (AF operation unit 34*d*) then executes the focus detection processing by using the focus detection signal data selected through the data selection processing. In FIG. 13, the data output from the unshaded pixels are focus detection signal data obtained under the first image-capturing conditions and the data output from the shaded pixels are focus detection signal data obtained under the second image-capturing conditions. In this embodiment, the focus detection signal data obtained under the second image-capturing conditions are not selected and thus the focus detection signal data output from the shaded axles are not used in the focus detection processing.

Example 1

If, for instance, the first image-capturing conditions and the second image-capturing conditions are different from each other only in the ISO sensitivity with an ISO sensitivity setting of 100 selected for the first image-capturing conditions and an ISO sensitivity setting of 800 selected for the second image-capturing conditions, the control unit 34 (AF operation unit 34*d*) selects focus detection signal data obtained under the first image-capturing conditions, among the sets of image data available in the area enclosed by the frame 170, as the signal data to be used in the focus detection processing. In other words, the focus detection signal data obtained under the second image-capturing conditions different from the first image-capturing conditions, among the focus detection signal available in the area enclosed by the frame 170, are not used in the focus detection processing.

Example 2

If the first image-capturing conditions and the second image-capturing conditions are different from each other only in the shutter speed with a shutter speed setting of 1/1000 sec selected for the first image-capturing conditions and a shutter speed setting of 1/100 sec selected for the second image-capturing conditions, the control unit 34 (AF operation unit 34*d*) selects focus detection signal data obtained under the first image-capturing conditions, among the sets of focus detection signal data available in the area enclosed with the frame 170, to be used in the focus detection processing. In other words, the focus detection signal data obtained under the second image-capturing conditions different from the first image-capturing conditions, among the sets of focus detection signal data available in the area enclosed by the frame 170, are not used in the focus detection processing.

Example 3

If the first image-capturing conditions and the second image-capturing conditions are different from each other only in the frame rate (with uniform electric charge accumulation time) with a frame rate setting of 30 fps selected for the first image-capturing conditions and a frame rate setting of 60 fps selected for the second image-capturing conditions, the control unit 34 (AF operation unit 34*d*) selects focus detection signal data obtained under the first image-capturing conditions among the sets of focus detection signal data available in the area enclosed by the frame 170. Namely, the focus detection signal data obtained under the second image-capturing conditions with timing different from the timing with which the image data have been obtained under the first image-capturing conditions, among the sets of focus detection signal data available in the area enclosed by the frame 170, are not used in the focus detection processing.

However, if the focus detection signal data in the area enclosed by the frame 170 have been obtained under uniform image-capturing conditions, the control unit 34 (AF operation unit 34*d*) does not execute the data selection processing described above. Namely, the control unit 34 (AF operation unit 34*d*) executes focus detection processing by directly utilizing the focus detection signal data output from the focus detection pixels in the area enclosed by the frame 170.

It is to be noted that as has been explained earlier, image-capturing conditions indicating a slight difference from each other are regarded as uniform image-capturing conditions.

In addition, while focus detection signal data obtained under the first image-capturing conditions are selected from the sets of focus detection signal data available in the area enclosed by the frame 170 in the example described above, focus detection signal data obtained under the second image-capturing conditions among the sets of focus detection signal data available in the area enclosed by the frame 170, may be selected instead.

In the example described above, focus detection is executed by specifying an area for which the first image-capturing conditions have been set and accordingly, focus detection photoelectric conversion signals, generated under the first image-capturing conditions, are selected for focus detection. A different example in which a focusing target subject is located astride an area with the first image-capturing conditions applied thereto and an area with the second image-capturing conditions applied thereto will be described below. When the subject, for which focus is to be adjusted, is located astride an area with the first image-capturing conditions applied thereto and an area with the second image-capturing conditions applied thereto, the control unit 34 (AF operation unit 34*d*) selects focus detection photoelectric conversion signals generated under the first image-capturing conditions as the signals to be used in the focus detection processing, among the focus detection photoelectric conversion signals generated in the area enclosed by the frame 170. The control unit 34 (AF operation unit 34*d*) then calculates a first defocus quantity based upon the focus detection photoelectric conversion signals thus selected. Next, the control unit 34 (AF operation unit 34*d*) selects focus detection photoelectric conversion signals generated under the second image-capturing conditions as the signals to be used in the focus detection processing, among the focus detection photoelectric conversion signals generated in the area enclosed by the frame 170. The control unit 34 (AF operation unit 34*d*) then calculates a second defocus quantity based upon the focus detection photoelectric conversion signals thus selected. The control unit 34 (AF operation unit 34*d*) then executes focus detection processing by using the first defocus quantity and the second defocus quantity. In more specific terms, the control unit 34 (AF operation unit 34*d*) may calculate the distance over which the lens needs to move by calculating the average value of the first defocus quantity and the second defocus quantity. As an alternative, the control unit 34 (AF operation unit 34*d*) may select one of the values representing the first defocus quantity and the second defocus quantity that indicates a smaller lens drive distance. As a further alternative, the control unit 34 (AF operation unit 34*d*) may select one of the values representing the first defocus quantity and the second defocus quantity that indicates that the subject is located closer to the camera.

In addition, when the focusing target subject is present astride an area with the first image-capturing conditions applied thereto and an area with the second image-capturing conditions applied thereto, the control unit 34 (AF operation unit 34*d*) may select the focus detection photoelectric conversion signals generated in the area occupied by the greater part of the subject. For instance, 70% of the facial area, i.e., the focusing target subject, may be present in the area with the first image-capturing conditions applied thereto with the remaining 30% of the facial area in the second area, and in such a case, the control unit 34 (AF operation unit 34*d*) will select the focus detection photoelectric conversion signals generated under the first image-capturing conditions. It is to be noted that the areal ratios (%) described above simply represents an example, and the present invention is not limited to this example.

While an explanation has been given on an example in which the focus detection processing is executed through the split-pupil phase difference method, the same principle applies when focus detection processing is executed through the contrast detection method whereby the focus lens in the image-capturing optical system 31 is driven to the in-focus position based upon variance in the contrast of the subject image.

The control unit 34 engaged in focus detection through the contrast detection method executes focus evaluation value calculation of the known art, based upon image data output from image-capturing pixels at the image sensor 32*a*, disposed in the area corresponding to the focus detection position, at each position taken by the focus lens in the image-capturing optical system 31 as it drives the focus lens. It then determines the focus lens position at which the maximum focus evaluation value is achieved as the in-focus position.

Under normal circumstances, the control unit 34 executes focus evaluation value calculation by directly utilizing the image data output from the image-capturing pixels disposed in the area corresponding to the focus detection position without executing any data selection processing. However, if the image data obtained in the area corresponding to the focus detection position include both image data obtained under the first image-capturing conditions and image data obtained under the second image-capturing conditions, the control unit 34 selects either the image data obtained under the first image-capturing conditions or the image data obtained under the second image-capturing conditions, among the sets of image data obtained in the area corresponding to the focus detection position. The control unit 34 then executes the focus evaluation value calculation by using the image data selected through the data selection processing. It is to be noted that when the focusing target subject is present astride an area with the first image-capturing conditions applied thereto and an area with the second image-capturing conditions applied thereto, the control unit 34 (AF operation unit 34*d*) may select the focus detection photoelectric conversion signals generated in the area occupied by the greater part of the subject.

3. When Executing Subject Detection Processing

FIG. 14(*a*) presents an example of a template image 180 of a detection target object, whereas FIG. 14(*b*) shows a live view image 60(*a*) and a search range 190 in an example. The control unit 34 (object detection unit 34*a*) detects a target object (e.g., the purse 63*a*, which is one of the subject elements in FIG. 5) in the live view image. While the control unit 34 (object detection unit 34*a*) may set the entire live view image 60*a* as the target object detection range, it may set part of the live view image 60*a* as a search range 190 so as to lessen the detection processing load.

If different image-capturing conditions are set for different areas to another and a boundary between areas is present within the search range 190, the control unit 34 (object detection unit 34*a*) executes data selection processing with regard to image data located near the boundary between the areas as preliminary processing prior to the subject detection processing.

The data selection processing is executed in order to minimize the extent to which the accuracy of the subject element detection processing is lowered due to different image-capturing conditions set for different areas in the imaging field divided by the setting unit 34*b*. Generally speaking, when the search range 190 set for purposes of subject element detection includes a boundary between areas, image data obtained under different image-capturing conditions may both be present together in the image data obtained over the search range 190. In the embodiment, data selection processing is executed as described below based upon the theory that it is better to detect a subject element by using image data obtained under uniform image-capturing conditions rather than to detect a subject element by using image data obtained under different image-capturing conditions.

An explanation will be given on an example in which the purse 63*a*, held by the person 61*a* in the live view image 60*a* in FIG. 5 is detected. The control unit 34 (object detection unit 34*a*) sets the search range 190 in the vicinity of the area containing the person 61*a*. It is to be noted that the area 61 in which the person 61*a* is present may be simply set as the search range.

If the search range 190 is not split over two areas with different image-capturing conditions applied thereto, the control unit 34 (object detection unit 34*a*) executes subject detection processing by using the image data in the search range 190 without executing data selection processing. However, if the image data in the search range 190 include both image data obtained under the first image-capturing conditions and image data obtained under the second image-capturing conditions, the control unit 34 (object detection unit 34*a*) selects the image data obtained under the first image-capturing conditions, among the sets of image data in the search range 190, as the image data to be used for the subject detection processing, as in (example 1) through (example 3) described earlier in reference to the focus detection processing. The control unit 34 (object detection unit 34*a*) then executes subject detection processing for the area with the first image-capturing conditions applied thereto by using the image data selected through the data selection processing. The subject detection processing executed in this situation may be, for instance, processing through which the target object is detected by determining a similarity factor indicating the degree of similarity between the template image 180 and the selected image data corresponding to the first image-capturing conditions (often referred to as template matching). The control unit 34 (object detection unit 34*a*) next selects the image data obtained under the second image-capturing conditions, among the sets of image data in the search range 190, as the image data to be used in the subject detection processing. The control unit 34 (object detection unit 34*a*) executes subject detection processing similar to that described above for the area with second image-capturing conditions applied thereto by using the image data thus selected through the data selection processing. The control unit 34 (object detection unit 34*a*) executes subject detection within the search range 190 through this process. Then, it detects the subject within the search range 190 by combining the subject area detected by using the image data obtained under the first image-capturing conditions and the subject area detected by using the image data obtained under the second image-capturing conditions at their boundary. It is to be noted that while the control unit 34 (object detection unit 34*a*) uses the image data obtained under the first image-capturing conditions and the image data obtained under the second image-capturing conditions in the example explained above, the subject may instead be detected by using image data obtained under either set of image-capturing conditions. For instance, while the search range 190 includes an area with the first image-capturing conditions applied thereto and an area with the second image-capturing conditions applied thereto, the ratio of the area with the first image-capturing conditions applied thereto may be greater, and in such a case, subject detection may be executed by using the image data obtained under the first image-capturing conditions alone. The areal ratio achieved by the area with the first image-capturing conditions applied thereto may be, for instance, 70% or more. However, the present invention is not limited to this example and the areal ratio of the area with the first image-capturing conditions applied thereto may be 80% or more or 90% or more. In other words, it will be obvious that the areal ratio of the area with the first image-capturing conditions applied thereto may be adjusted to an optimal value.

The data selection processing with regard to image data in the search range 190 described above may be executed for a search range set for detection of a specific subject such as a person's face or for an area set for purposes of image-capturing scene decision-making. For instance, the control unit 34 (object detection unit 34*a*), engaged in detection of a person's face within the search range 190, selects image data obtained under the first image-capturing conditions, among the sets of image data in the search range 190, as the image data to be used for the subject detection processing. The control unit 34 (object detection unit 34*a*) then executes face detection processing of the known art over the area with the first image-capturing conditions applied thereto. The control unit 34 (object detection unit 34*a*) next selects image data obtained under the second image-capturing conditions, among the sets of image data in the search range 190, as the image data to be used for subject detection processing. The control unit 34 (object detection unit 34*a*) executes face detection processing of the known art in the area with the second image-capturing conditions applied thereto. The control unit 34 (object detection unit 34*a*) then detects a face in the image data in the search range 190 by combining the face area detected within the area with the first image-capturing conditions applied thereto and the face area detected within the area with the second image-capturing conditions applied thereto at their boundary.

In addition, data selection similar to that executed with regard to the image data obtained within the search range 190 described above may be executed in conjunction with a search range set for characteristic quantity detection executed based upon image colors, edges and the like, instead of in conjunction with a search range set for pattern matching executed based upon a template image.

Furthermore, template matching processing of the known art may be executed by using image data obtained for a plurality of frames obtained at different time points so as to track a moving object by searching for an area in a frame image obtained at a later time point, which is similar to a tracking target object in a frame image obtained earlier. In this case, if image data obtained under the first image-capturing conditions and image data obtained under the second image-capturing conditions are both present over the search range set in the frame image obtained at the later time point, the control unit 34 selects the image data obtained under the first image-capturing conditions, among the sets of image data available in the search range, as the image data to be used for tracking processing. The control unit 34 then executes tracking processing for the area with the first image-capturing conditions applied thereto by using the image data selected through the data selection processing. Next, the control unit may select image data obtained under the second image-capturing conditions, among the sets of image data available in the search range as image data to be used in tracking processing in much the same way as that described above and execute tracking processing for the area with the second image-capturing conditions applied thereto by using the image data thus selected through the data selection processing.

Furthermore, image data corresponding to a plurality of frames obtained at different time points may be used to detect a motion vector through a method of the known art. If image data obtained under the first image-capturing conditions and image data obtained under the second image-capturing conditions are both present within a detection area set for motion vector detection, the control unit 34 selects the image data obtained under the first image-capturing conditions among the sets of image data in the detection range set for motion vector detection, as the image data to be used for the detection processing. The control unit 34 then detects a motion vector over the area with the first image-capturing conditions applied thereto by using the image data selected through the data selection processing. Subsequently, the control unit 34 may select the image data obtained under the second image-capturing conditions, among the sets of image data available in the search range as the image data to be used for motion vector detection processing in much the same way as that described above and execute motion vector detection processing for the area with the second image-capturing conditions applied thereto by using the image data selected through the data selection processing. The control unit 34 may determine a motion vector for the entire image based upon the motion vector detected in the area with the first image-capturing conditions applied thereto and the motion vector detected in the area with the second image-capturing conditions applied thereto, or it may hold the motion vectors detected in the individual areas.

4. When Setting Image-Capturing Conditions

After dividing the imaging field into a plurality of areas and setting different image-capturing conditions for different areas, the control unit 34 (setting unit 34*b*) may execute another photometering operation in order to determine exposure conditions. In such a case, it may execute data selection processing with regard to image data located near a boundary of areas as preliminary processing execute before setting the exposure conditions.

The data selection processing is executed in order to minimize the extent to which the accuracy of the processing through which exposure conditions are determined, is lowered due to different image-capturing conditions set in different areas in the imaging field divided by the setting unit 34*b*. For instance, a boundary between areas may be present within a photometering range set at a central area of the imaging field and under such circumstances, image data obtained under different image-capturing conditions may be included in the image data within the photometering range. In the embodiment, data selection processing is executed as described below based upon the theory that it is better to execute exposure calculation processing by using image data obtained under uniform image-capturing conditions rather than to execute exposure calculation processing by using image data obtained under different image-capturing conditions.

If the photometering range is not split over a plurality of areas with different image-capturing conditions applied thereto, the control unit 34 (setting unit 34*b*) executes exposure calculation processing by using the image data in the photometering range without executing data selection processing. However, if the image data in the photometering range include both image data obtained under the first image-capturing conditions and image data obtained under the second image-capturing conditions, the control unit 34 (setting unit 34*b*) selects the image data obtained under the first image-capturing conditions, among the sets of image data in the photometering range, as the image data to be used for the exposure calculation processing, as in (example 1) through (example 3) described earlier in reference to the focus detection processing and the subject detection processing. The control unit 34 (setting unit 34*b*) then executes exposure calculation processing in the area with the first image-capturing conditions applied thereto by using the image data selected through the data selection processing. The control unit 34 (setting unit 34*b*) next selects the image data obtained under the second image-capturing conditions, among the sets of image data in the photometering range, as the image data to be used for the exposure calculation processing. The control unit 34 (setting unit 34*b*) executes exposure calculation processing similar to that described above for the area with second image-capturing conditions applied thereto by using the image data thus selected through the data selection processing. Namely, the control unit 34 (setting unit 34*b*) executes data selection processing in order to select data to be used in photometering the individual areas and executes exposure calculation processing by using the image data selected through the data selection processing if a plurality of areas with different image-capturing conditions applied thereto are present within the photometering range.

In addition, if the photometering range is located astride an area with the first image-capturing conditions applied thereto and an area with the second image-capturing conditions applied thereto, the control unit 34 (setting unit 34*b*) may select an area having a greater areal ratio, as has been explained earlier in reference to the focus detection and the subject detection.

Image data may be selected with regard to a photometering (colorimetry or color-metering) range set when determining a white balance adjustment value, a photometering range set when determining whether or not auxiliary photographing light needs to be emitted from an auxiliary photographing light source or a photometering range set when determining the amount of auxiliary photographing light to be emitted from the light source, instead of the photometering range set for the exposure calculation processing described above.

In addition, photoelectric conversion signals may be read out at varying resolutions from one area to another in the imaging field divided into different areas. In such a case, image data may be selected in a similar manner with regard to an area used to determine the image-capturing scene when setting the readout resolution for each area.

<Flowchart>

Figure 15:
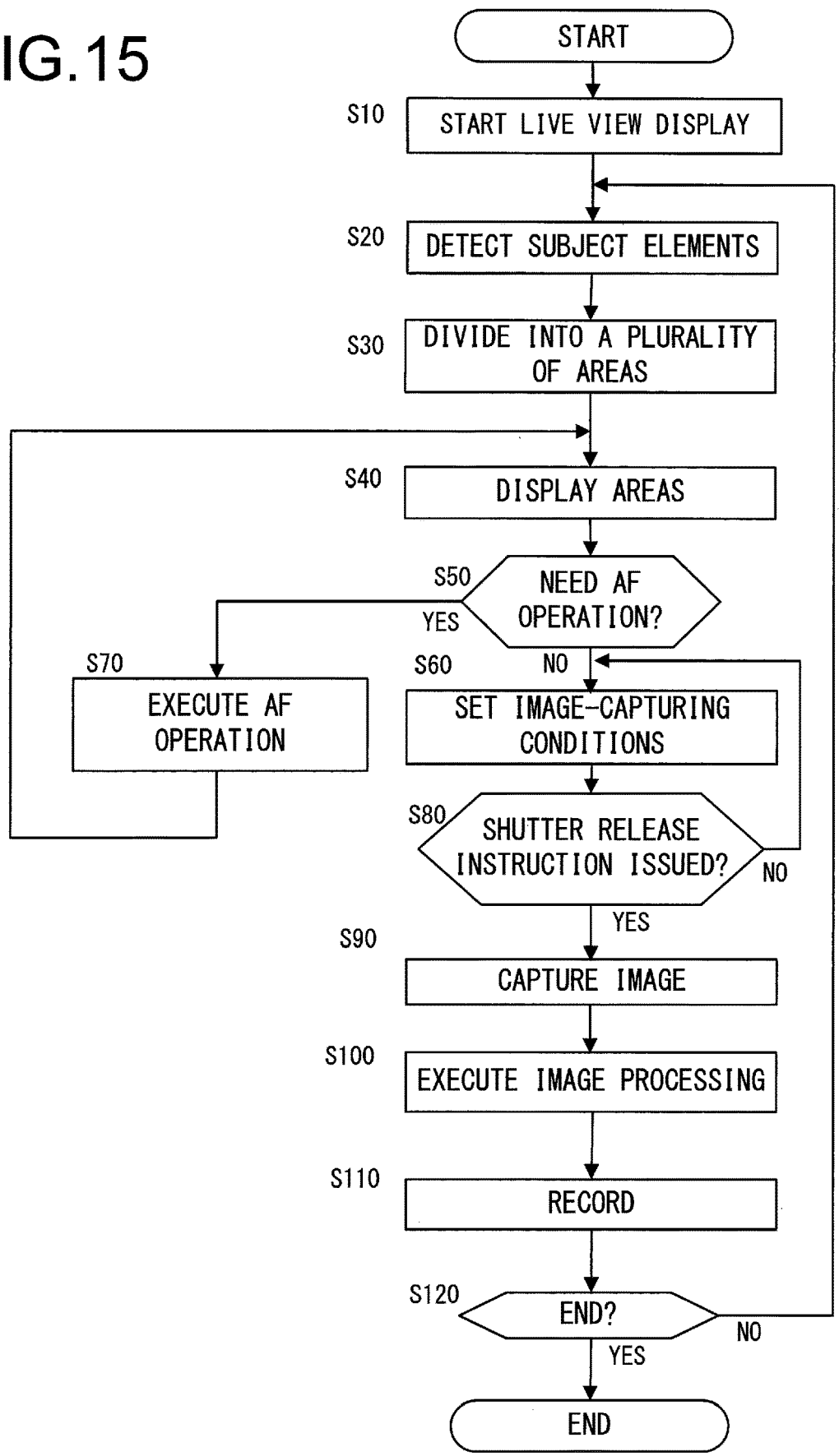
FIG. 15 A flowchart of the image-capturing processing executed by setting different image-capturing conditions for different areas FIG. 16 Examples of positions that may be taken for a first area and a second area at the image-capturing surface of the image sensor, presented in FIG. 16(a) through FIG. 16(c)

FIG. 15 presents a flowchart of the processing executed when capturing an image by setting image-capturing conditions for individual areas. As a main switch of the camera 1 is turned on, the control unit 34 starts a program that enables the processing shown in FIG. 15. In step S10, the control unit 34 engages the display unit 35 to bring up a live view display, and then the operation proceeds to step S20.

More specifically, the control unit 34 sequentially brings up on display at the display unit 35 images resulting from predetermined types of image processing executed on image data sequentially output from the image-capturing unit 32, as a live view image. As explained earlier, uniform image-capturing conditions are set at this time for the entire range of image-capturing chip 111, i.e., over the entire image plane.

It is to be noted that if a setting for executing AF operation while the live view image display is up is selected, the control unit 34 (AF operation unit 34*d*) controls the AF operation through which focus is adjusted on the subject element corresponding to a specific focus detection position by executing focus detection processing. The AF operation unit 34*d* executes focus detection processing after executing the data selection processing described earlier, as needed.

In addition, if the setting for executing AF operation is not selected while the live view display is up, the control unit 34 (AF operation unit 34*d*) executes AF operation later in response to an AF operation instruction.

In step S20, the control unit 34 (object detection unit 34*a*) detects subject elements in the live view image, and then the operation proceeds to step S30. The object detection unit 34*a* executes the subject detection processing after first executing the data selection processing described earlier, as needed. In step S30, the control unit 34 (setting unit 34*b*) divides the imaging field of the live view image into areas containing the subject elements, before the operation proceeds to step S40.

In step S40, the control unit 34 displays the areas at the display unit 35. As in the example presented in FIG. 6, the control unit 34 displays the areas by highlighting the area designated as the image-capturing condition setting (adjustment) target area. In addition, the control unit 34 brings up on display at the display unit 35 the image-capturing condition setting screen 70, before the operation proceeds to step S50.

It is to be noted that if the user taps the display position at which another primary subject is displayed on the display screen with his finger, the control unit 34 switches the image-capturing condition setting (adjustment) target area to the area that includes the other primary subject and highlights the new image-capturing condition setting (adjustment) target area on display.

In step S50, the control unit 34 makes a decision as to whether or not AF operation is necessary. The control unit 34 makes an affirmative decision in step S50 if, for instance, the subject has moved and the focusing condition has changed, if the focus detection position has been changed in response to a user operation or if an instruction for AF operation execution has been issued through a user operation. Upon making an affirmative decision in step S50, the control unit 34 proceeds to step S70. If, on the other hand, the focusing condition has remained unchanged, the focus detection position has not been changed in response to a user operation and an instruction for AF operation execution has not been issued through a user operation, the control unit 34 makes a negative decision in step S50 and the operation proceeds to step S60.

In step S70, the control unit 34 initiates AF operation, before the operation returns to step S40. The AF operation unit 34d executes focus detection processing for AF operation after executing the data selection processing described earlier as needed. Once the operation has returned to step S40, the control unit 34 repeatedly executes processing similar to that described above based upon the live view image obtained after the AF operation.

In step S60, the control unit 34 (setting unit 34b) sets image-capturing conditions for the highlighted area on display in response to a user operation and then the operation proceeds to step S80. It is to be noted that the display at the display unit 35 changes and image-capturing operations are set in response to a user operation in step S60, as has been explained earlier. The control unit 34 (setting unit 34b) executes exposure calculation processing after executing the data selection processing described earlier, as needed.

In step S80, the control unit 34 makes a decision as to whether or not an image-capturing instruction has been issued. The control unit 34 makes an affirmative decision in step S80 if a shutter release button (not shown) constituting part of the operation member 36 has been operated or a display icon via which an image-capturing instruction is issued, has been operated. Upon making an affirmative decision in step S80, the control unit 34 proceeds to step S90. If no image-capturing instruction has been issued, the control unit 34 makes a negative decision in step S80 and the operation returns to step S60.

In step S90, the control unit 34 executes specific image-capturing processing. Namely, the image-capturing control unit 34c controls the image sensor 32a so as to capture an image under image-capturing conditions set in correspondence to the individual areas, and then the operation proceeds to step S100.

In step S100, the control unit 34 (image-capturing control unit 34c) outputs an instruction to the image processing unit 33 so as to engage it in predetermined types of image processing on the image data obtained through the image-capturing processing, before the operation proceeds to step S110. The image processing executed in this step includes the defective pixel correction processing, the color interpolation processing, the edge enhancement processing and the noise reduction processing explained earlier.

It is to be noted that the image processing unit 33 (selection unit 33b) executes the image processing after executing data selection processing for image data located near a boundary of areas, as needed.

In step S110, the control unit 34 outputs an instruction to the recording unit 37 so as to record the image data having undergone the image processing into a recording medium (not shown), and then the operation proceeds to step S120.

In step S120, the control unit 34 makes a decision as to whether or not an end operation has been performed. If an end operation has been performed, the control unit 34 makes an affirmative decision in step S120 and ends the processing in FIG. 15. If, on the other hand no end operation has been performed, the control unit 34 makes a negative decision in step S120 and the operation returns to step S20. Once the operation has returned to step S20, the control unit 34 repeatedly executes the processing described above.

While the image sensor 32a in the example described above is a stacked image sensor 100, it is not necessary for the image sensor to be configured as a stacked image sensor, as long as it allows different image-capturing conditions to be set from one block to another among a plurality of blocks at the image sensor (image-capturing chip 111).

The following advantages and operations are achieved through the embodiment inscribed above.

(1) The camera 1, equipped with an image processing device, includes an image processing unit 33 (input unit 33a), to which first image data obtained by capturing a subject image having entered a first area at an image-capturing unit 32, under first image-capturing conditions, and second image data obtained by capturing a subject image having entered a second area at the image-capturing unit 32, under second image-capturing conditions different from the first image-capturing conditions, are input, a selection unit 33b that selects either the first image data or the second image data input to the input unit 33a, and an image processing unit (generation unit 33) that brings up on display at the display unit 35 an image generated by using the selected image data. This structure makes it possible to execute the optimal processing individually in areas with different image-capturing conditions applied thereto. In other words, an image can be generated in an optimal manner by using the sets of image data obtained in the individual areas. For instance, the unnatural appearance that would otherwise occur in an image, due to different image-capturing conditions being set for different areas, can be minimized.

(2) The generation unit 33c in the camera 1 generates an image by using image data available at specific reference pixels located around each target pixel taking a specific position in an image that includes the first image data and the second image data, whereas the selection unit 33b selects either the first image data or the second image data as the image data at the reference pixels in correspondence to the position taken by each target pixel. Through these measures, optimal processing can be executed individually for areas with different image-capturing conditions applied thereto.

(3) The selection unit 33b in the camera 1 selects either the first image data or the second image data obtained by capturing an image under image-capturing conditions matching the image-capturing conditions set for the target pixel. Through these measures, optimal processing can be executed individually for areas with different image-capturing conditions applied thereto.

(4) The selection unit 33b in the camera 1 also selects image data obtained at another pixel, different from the reference pixels, under image-capturing conditions matching those set for the target pixel. Through these measures, optimal processing can be executed individually for areas with different image-capturing conditions applied thereto.

(5) If the entire image data are made up exclusively with first image data, the selection unit 33b in the camera 1 selects all the image data. If the entire image data are made up exclusively with second image data, it selects all the image data. If the image data include both first image data and second image data, it selects either the first image data or the second image data. Through these measures, optimal processing can be executed individually for areas with different image-capturing conditions applied thereto.

(6) Since the first image-capturing conditions and the second image-capturing conditions set at the camera 1 include at least either the accumulation time or the ISO sensitivity, optimal processing can be executed in areas with different electric charge accumulation time settings or different image-capturing sensitivity settings applied thereto.

(7) The generation unit 33*c* in the camera 1 generates third image data through at least defective pixel correction processing, color interpolation processing, edge enhancement processing or noise reduction processing. As a result, image data having undergone defective pixel correction processing, color interpolation processing, edge enhancement processing or noise reduction processing optimally executed for areas with different image-capturing conditions applied thereto, can be generated.

Second Embodiment

In the image data selection processing executed in conjunction with image processing in the first embodiment, if image-capturing conditions (referred to as first image-capturing conditions) applied at a target pixel are different from image-capturing conditions (referred to as second image-capturing conditions) applied at reference pixels present around the target pixel P, the image processing unit 33 (selection unit 33*b*) selects image data obtained under the first image-capturing conditions matching those applied at the target pixel, among the sets of image data available at pixels located within a predetermined range 90, and the image processing unit 33 (generation unit 33*c*) references the selected image data.

In the second embodiment, the image processing unit 33 (selection unit 33*b*) also selects image data obtained under the first image-capturing conditions matching those applied at the target pixel, from sets of image data available at pixels located outside the predetermined range 90, as well, so as to allow the image processing unit 33 (generation unit 33*c*) to reference a greater number of sets of data. Namely, the image processing unit 33 (selection unit 33*b*) adjusts selection range and selects image data obtained under the first image-capturing conditions.

FIG. 7(*d*) provides an enlarged view of a target pixel P and reference pixels designated in the second embodiment. In FIG. 7(*d*), the data output from the unshaded pixels are image data obtained under the first image-capturing conditions, whereas the data output from the shaded pixels are image data obtained under the second image-capturing conditions within the predetermined range 90 centered on the target pixel P. As in the first embodiment, the image processing unit 33 (selection unit 33*b*) does not select image data available at the pixels (shaded pixels) with the second image-capturing conditions applied thereto even though they are located within the predetermined range 90.

The image processing unit 33 (selection unit 33*b*) in the second embodiment further selects image data at the unshaded pixels located outside the predetermined range 90 with the first image-capturing conditions applied thereto, as well as the image data available at the unshaded pixels located within the predetermined range 90 with the first image-capturing conditions applied thereto, as illustrated in FIG. 7(*d*). The image processing unit 33 (generation unit 33*c*) executes image processing by referencing the image data thus selected. In the example described above, the distances from the position taken by the target pixel P to the positions at which the image data have been obtained under the second image-capturing conditions, located inside the predetermined range 90, are greater than the distances from the position of the target pixel P to the positions at which the image data obtained at the unshaded pixels located outside the predetermined range 90 with the first image-capturing conditions applied thereto. In other words, the image processing unit 33 (generation unit 33*c*) is allowed to select image data obtained under the first image-capturing conditions available at pixels set apart from the target pixel P by greater distances rather than select image data obtained under the second image-capturing conditions at pixels set apart from the target pixel P by smaller distances.

It is to be noted that when selecting image data, the image processing unit 33 (selection unit 33*b*) gives priority to image data available at a pixel taking a position closer to the predetermined range 90 over image data available at a pixel taking a position further distanced from the predetermined range 90. The rationale for this approach is that a pixel located closer to the predetermined range 90 is more likely to hold image information commonly shared with the target pixel P than a pixel located further away from the predetermined range 90.

In addition, with L representing the length of a side of the predetermined range 90, the image processing unit 33 (selection unit 33*b*) selects image data available at an unshaded pixel (i.e., with the first image-capturing conditions applied thereto) set apart from the target pixel by a distance, indicated by a diagonal line, equal to L or less. The rationale for this selection approach is that it is desirable to not include image data at a pixel set apart from the predetermined range 90 by too great a distance since such a pixel is less likely to hold image information commonly shared with the target pixel P.

<Examples of Image Processing>

Examples of image processing that may be executed in the second embodiment will be described.

(1) Defective Pixel Correction Processing

If uniform image-capturing conditions have been applied at the target pixel P and all the pixels present within the predetermined range 90 centered on the target pixel P, the image processing unit 33 (selection unit 33*b*) selects all the sets of image data at the pixels located inside the predetermined range 90. Then, the image processing unit 33 (generation unit 33*c*) executes Max, Min filter processing by referencing the selected image data. It is to be noted that it may instead execute defective pixel correction processing by taking the average of the selected image data.

As illustrated in FIG. 7(*d*), if any pixel, for which the second image-capturing conditions, different from the first image-capturing conditions applied at the target pixel P have been set, is present in the predetermined range 90 centered on the target pixel P, the image processing unit 33 (selection unit 33*b*) selects the image data at the pixels located within the predetermined range 90 with the first image-capturing conditions applied thereto. It also selects the image data at the unshaded pixels, located outside the predetermined range 90 with the first image-capturing conditions applied thereto. The image processing unit 33 (generation unit 33*c*) then executes the Max, Min processing described above by referencing the image data thus selected. It is to be noted that it may instead execute defective pixel correction processing by taking the average of the selected image data.

The image processing unit 33 executes the processing described above for all the defective pixels, position information for which is recorded in the non-volatile memory.

(2) Color Interpolation Processing

<G Color Interpolation>

Figure 8:
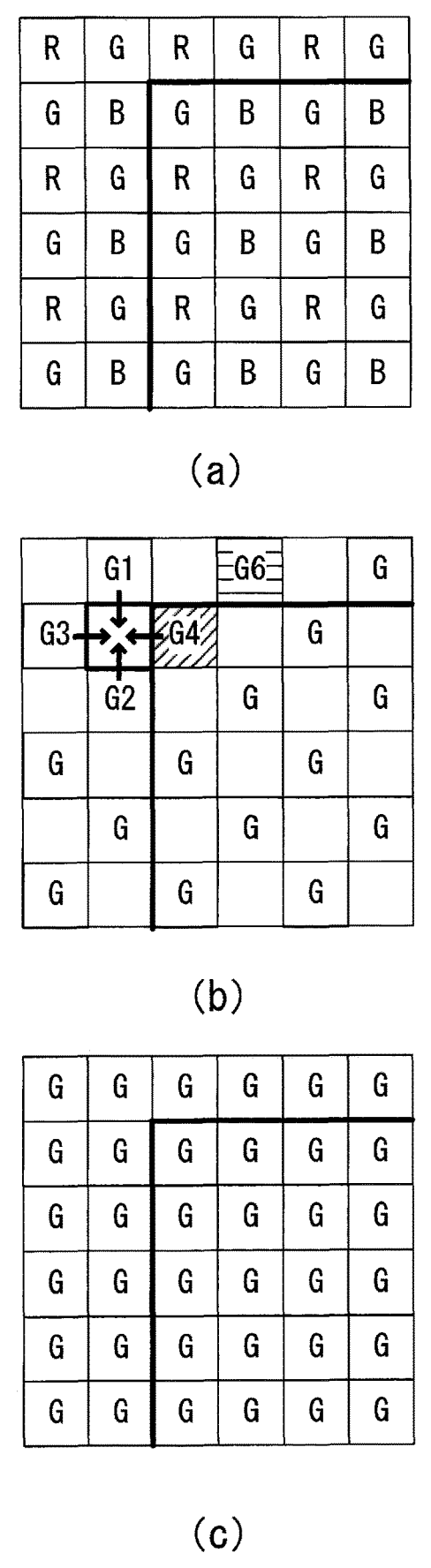

Next, the G color interpolation executed in the second embodiment will be explained. In FIG. 8(*a*) through FIG.

8(c), the first image-capturing conditions are set for the area located to the left of and above the bold lines and the second image-capturing conditions are set for the area located to the right of and below the bold lines, as in the first embodiment.

In the example presented in FIG. 8(b), the second image-capturing conditions, different from the first image-capturing conditions applied at the target position (second row/second column) are applied at the reference position corresponding to the shaded G-color component image data G4. Accordingly, the image processing unit 33 (selection unit 33b) selects the image data G1 through G3 obtained under the first image-capturing conditions among the sets of G color component image data G1 through G4. In addition, the image processing unit 33 (selection unit 33b) selects G color component image data G6 obtained under the first image-capturing conditions, located near the reference position corresponding to the data G4. In other words, the current embodiment is distinguishable from the first embodiment in that the image processing unit 33 (selection unit 33b) selects image data obtained under the first image-capturing conditions by setting alternative image data selection positions.

It is to be noted that if the second image-capturing conditions are also applied at the position corresponding to the data G6, data obtained under the first image-capturing conditions, among the sets of image data available at positions near the data G6, may be selected.

The image processing unit 33 (generation unit 33c) executes calculation so as to generate G color component image data for the target position (second row/second column) by referencing the image data selected as described above. The image processing unit 33 (generation unit 33c) may, for instance, generate G color component image data (a2G1+b2G2+c2G3+d2G6)/4 for the target position (second row/second column). It is to be noted that a2, b2, c2 and d2 are weighting coefficients each selected in correspondence to the distance between the specific reference position and the target position and the image structure.

The image processing unit 33 (generation unit 33c) is able to obtain G color component image data for each pixel position, as shown in FIG. 8(c) by generating G color component image data at each position among the B color component positions and the R color component positions in FIG. 8(a).

<R Color Interpolation>

The R color interpolation executed in the second embodiment will be explained. In FIG. 9(a) through FIG. 9(c) the first image-capturing conditions are set for the area located to the left of and above the bold lines and the second image-capturing conditions are set for the area located to the right of and below the bold lines, as in the first embodiment.

In the example presented in FIG. 9(b), the second image-capturing conditions, different from the first image-capturing conditions applied at the target position indicated with the bold-line frame (second row/second column) are applied at the reference position corresponding to the shaded image data Cr2 representing the chrominance component Cr. Accordingly, the image processing unit 33 (selection unit 33b) selects the chrominance component image data Cr1 and Cr3 through Cr4 obtained under the first image-capturing conditions among the chrominance component image data Cr1 through Cr4. In addition, the image processing unit 33 (selection unit 33b) selects image data Cr15 (or Cr16) for the chrominance component Cr obtained under the first image-capturing conditions, located near the reference position corresponding to the data Cr2. In other words, the current embodiment can be distinguished from the first embodiment in that the image processing unit 33 (selection unit 33b) selects image data obtained under the first image-capturing conditions by setting an alternative image data selection position.

It is to be noted that if the second image-capturing conditions are also applied at the position corresponding to the data Cr15 or Cr16, data obtained under the first image-capturing conditions, among the sets of image data available at positions near the data Cr15 or Cr16 may be selected.

The image processing unit 33 (generation unit 33c) executes calculation so as to generate chrominance component image data for the target position (second row/second column) by referencing the image data selected as described above. The image processing unit 33 (generation unit 33c) may, for instance, generate chrominance component image data Cr (e3Cr1+f3Cr15+g3Cr3+h3Cr4)/4 for the target position (second row/second column). It is to be noted that e3, f3, g3 and h3 are weighting coefficients each selected in correspondence to the distance between the specific reference position and the target position and the image structure.

Chrominance component image data Cr are generated for the target position indicated with the bold-line frame (second row/third column) in FIG. 9(c) in much the same manner. In the example presented in FIG. 9(c), the first image-capturing conditions, different from the second image-capturing conditions applied at the target position indicated with the bold-line frame (second row/third column) are applied at the reference positions corresponding to the shaded image data Cr4 and Cr5 representing the chrominance component Cr. Accordingly, the image processing unit 33 (selection unit 33b) selects the chrominance component image data Cr2 and Cr6 obtained under the second image-capturing conditions among the chrominance component image data Cr2 and Cr4 through Cr6. In addition, the image processing unit 33 (selection unit 33b) selects chrominance component image data Cr8 and Cr7 obtained under the second image-capturing conditions, located near the reference position corresponding to the data Cr4 and Cr5. In other words, the current embodiment can be distinguished from the first embodiment in that the image processing unit 33 (selection unit 33b) selects image data obtained under the second image-capturing conditions by setting alternative image data selection positions.

It is to be noted that if the first image-capturing conditions are also applied at the position corresponding to the data Cr8 and Cr7, data obtained under the second image-capturing conditions, among the sets of image data available at positions near the data Cr8 and Cr7 may be selected.

The image processing unit 33 (generation unit 33c) executes calculation so as to generate chrominance component image data Cr for the target position (second row/third column) by referencing the image data selected as described above. The image processing unit 33 (generation unit 33c) may generate chrominance component image data Cr (q3Cr2+r3Cr8+sCr7+t3Cr6)/4 for the target position. It is to be noted that q3, r3, s3 and t3 are weighting coefficients each selected in correspondence to the distance between the specific reference position and the target position and the image structure.

Once chrominance component image data Cr have been obtained for each pixel position, the image processing unit 33 (generation unit 33c) is able to obtain R color component image data at each pixel position by adding each set of G color component image data in FIG. 8(c) to the chrominance component image data Cr at the corresponding pixel position.

<B Color Interpolation>

Next, the B color interpolation executed in the second embodiment will be explained. In FIG. 10(a) through FIG. 10(c) the first image-capturing conditions are set for the area located to the left of and above the bold lines and the second image-capturing conditions are set for the area located to the right of and below the bold lines.

In the example presented in FIG. 10(b), the first image-capturing conditions, different from the second image-capturing conditions applied at the target position indicated with the bold-line frame (third row/third column) are applied at the reference positions corresponding to the shaded image data Cb1 and Cb3 representing the chrominance component Cb. Accordingly, the image processing unit 33 (selection unit 33b) selects the chrominance component image data Cb Cb2 and Cb4 obtained under the second image-capturing conditions among the sets of chrominance component image data Cb1 through Cb4. In addition, the image processing unit 33 (selection unit 33b) selects image data Cb16 and Cb17 for the chrominance component Cb obtained under the second image-capturing conditions, located near the reference position corresponding to the data Cb1 and Cb3. In other words, the current embodiment can be distinguished from the first embodiment in that the image processing unit 33 (selection unit 33b) selects image data obtained under the second image-capturing conditions by setting alternative image data selection positions.

The image processing unit 33 (generation unit 33c) executes calculation so as to generate chrominance component image data Cb for the target position (third row/third column) by referencing the image data selected as described above. The image processing unit 33 (generation unit 33c) may, for instance, generate chrominance component image data Cb (u3Cb16+v3Cb2+w3Cb4+x3Cb17)/4 for the target position (third row/third column). It is to be noted that u3, v3, w3 and x3 are weighting coefficients each selected in correspondence to the distance between the specific reference position and the target position and the image structure.

Chrominance component image data Cb are generated for the target position are indicated with the bold-line frame (third row/fourth column) in FIG. 10(c) in much the same manner.

It is to be noted that the second image-capturing conditions matching those applied at the target position (third row/fourth column) are set at the reference positions corresponding to the four sets of chrominance component image data Cb2 and Cb4 through Cb6, located near the target position (third row/fourth column) in the example presented in FIG. 10(c). The image processing unit 33 (generation unit 33c) generates through calculation chrominance component image data Cb at the target position by referencing the four sets of chrominance component image data Cb2 and Cb4 through Cb6, located near the target position.

Once chrominance component image data Cb have been generated for each pixel position, the image processing unit 33 (generation unit 33c) is able to obtain B color component image data at each pixel position by adding each set of G color component image data in FIG. 8(c) to the chrominance component image data Cr at the corresponding pixel position.

Through the second embodiment described above, the following advantage and operation, in addition to the advantages and operations similar to those achieved in the first embodiment, are realized. Namely, the selection unit 33b selects image data at a pixel that is not a reference pixel, present in an area for which image-capturing conditions identical to those applied at the pixel position (the position taken by the target pixel) have been set. As a result, image processing can be executed in an optimal manner by, for instance, increasing the number of sets of data referenced by the generation unit 33c while it is engaged in generation of third image data.

Variations of the First and Second Embodiments

The following variations are also within the scope of the present invention, and one of the variations or a plurality of variations may be adopted in combination with either of the embodiments described above.

(Variation 1) FIG. 16(a) through FIG. 16(c) each present an example of a positional arrangement with which a first area and a second area may be set on the image-capturing surface of the image sensor 32a. In the example presented in FIG. 16(a), the first area is made up with even-numbered columns and the second area is made up with odd-numbered columns. Namely, the image-capturing surface is divided into even-numbered columns and odd-numbered columns.

In the example presented in FIG. 16(b), the first area is made up with odd-numbered rows and the second area is made up with even-numbered rows. Namely, the image-capturing surface is divided into odd-numbered rows and even-numbered rows.

In the example presented in FIG. 16(c), the first area is made up with even-numbered row blocks in odd-numbered columns and odd-numbered row blocks in even-numbered columns. In addition, the second area is made up with even-numbered row blocks in even-numbered columns and odd-numbered row blocks in odd numbered columns. Namely, the image-capturing surface is divided into areas forming a checker pattern.

In each of the examples presented in FIG. 16(a) through FIG. 16(c), photoelectric conversion signals read out from the image sensor 32a having captured an image for one frame are used to generate a first image based upon photoelectric conversion signals read out from the first area and a second image based upon photoelectric conversion signals read out from the second area. In Variation 1, the first image and the second image are captured at matching angles of view and include a common subject image.

In Variation 1, the control unit 34 uses the first image as a display image and uses the second image for purposes of detection. In more specific terms, the control unit 34 brings up on display at the display unit 35 the first image as a live view image. In addition, the control unit 34 engages the object detection unit 34a in subject detection processing executed by using the second image, engages the AF operation unit 34 in focus detection processing by using the second image and engages the setting unit 34b in exposure calculation processing executed by using the second image.

In the description of Variation 1, the image-capturing conditions set for the first area where the first image is captured are referred to as first image-capturing conditions and the image-capturing conditions set for the second area where the second image is captured are referred to as second image-capturing conditions. The control unit 34 may select different image-capturing conditions for the first image-capturing conditions and the second image-capturing conditions.

1. For instance, the control unit 34 may select conditions optimal for display at the display unit 35 as the first image-capturing conditions. In this situation, uniform image-capturing conditions will be set as the first image-capturing conditions for the entire first area at the imaging field. At the same time, the control unit 34 may select conditions optimal for focus detection processing, subject detection processing and exposure calculation processing as the second image-capturing conditions. Uniform image-capturing conditions will be also set as the second image-capturing conditions for the entire second area at the imaging field.

It is to be noted that if conditions optimal for the focus detection processing, conditions optimal for the subject detection processing and conditions optimal for the exposure calculation processing are different from one another, the control unit 34 may select different second image-capturing conditions for the second area from one frame to the next. For instance, it may select the conditions optimal for the focus detection processing as the second image-capturing conditions for the first frame, select the conditions optimal for the subject detection processing as the second image-capturing conditions for the second frame, and select the conditions optimal for the exposure calculation processing as the second image-capturing conditions for the third frame. In this case too, uniform image-capturing conditions will be set for the second image-capturing conditions for the entire second area at the imaging field in correspondence to each frame.

2. As an alternative, the control unit 34 may select different image-capturing conditions as the first image-capturing conditions set for the first area. In this case, the control unit 34 (setting unit 34*b*) sets different first image-capturing conditions from one subject element-containing area to another among areas containing different subject elements defined by the setting unit 34*b*. However, the control unit 34 selects uniform second image-capturing conditions for the entire second area at the imaging field. While the control unit 34 selects conditions optimal for focus detection processing, subject detection processing and exposure calculation processing as the second image-capturing conditions, it may select different image-capturing conditions for the second area from one frame to another if conditions optimal for the focus detection processing, conditions optimal for the subject detection processing and conditions optimal for the exposure calculation processing are different from one another.

3. As a further alternative, the control unit 34 may select different second image-capturing conditions for the second area at the imaging field while applying uniform first image-capturing conditions to the entire first area of the imaging field. For instance, it may select different second image-capturing conditions from one subject element-containing area to another among areas containing different subject elements defined by the setting unit 34. In this case, too, different image-capturing conditions may be set for the second area from one frame to another if conditions optimal for the focus detection processing, conditions optimal for the subject detection processing and conditions optimal for the exposure calculation processing are different from one another.

4. As yet another alternative, the control unit 34 may select different first image-capturing conditions for the first area at the imaging field and also select different second image-capturing conditions for the second area at the imaging field. For instance, it may select different first image-capturing conditions from one subject element-containing area to another among areas containing different subject elements defined by the setting unit 34*b* and also select different second image-capturing conditions from one subject element-containing area to another among areas containing different subject elements defined by the setting unit 34*b*.

The areal ratios of the first area and the second area in FIG. 16(*a*) through FIG. 16(*c*) may be varied. In response to a user operation or based upon a decision made by the control unit 34, for instance, the control unit 34 may set the ratio of the first area higher than that of the second area may set the first area ratio and the second area ratio equal to each other, as shown in the examples presented in FIG. 16(*a*) through FIG. 16(*c*) or may set the ratio of the first area lower than that of the second area. By adjusting the ratios for the first area and the second area, a first image achieving higher definition compared to the second image can be generated, the resolution of the first image and the resolution of the second image can be set equal to each other or a second image achieving higher definition than the first image can be generated.

(Variation 2)

In the embodiments described earlier, the control unit 34 (setting unit 34*b*) detects subject elements based upon the live view image and divides the image plane of the live view image into subject element-containing areas. In conjunction with a photometering sensor installed as a member separate from the image sensor 32*a*, the control unit 34 in Variation 2 may divide the live view image plane into different areas based upon output signals provided by the photometering sensor.

In this case, based upon output signals from the photometering sensor, the control unit 34 divides the image plane into a foreground and a background. In more specific terms, it divides the live view image obtained via the image sensor 32*b* into a foreground area corresponding to an area judged to be a foreground based upon signals output from the photometering sensor and a background area corresponding to an area judged to be a background based upon signals output from the photometering sensor.

The control unit 34 then sets a first area and a second area at positions corresponding to the foreground area at the image-capturing surface of the image sensor 32*a*, as in any of the examples presented in FIG. 16(*a*) through FIG. 16(*c*). In addition, the control unit 34 sets the first area alone at positions corresponding to the background area at the image-capturing surface of the image sensor 32*a*. The control unit 34 uses the first image as a display image and uses the second image for purposes of detection.

In Variation 2, the live view image obtained via the image sensor 32*b* can be divided into different areas by using output signals provided from a photometering sensor. In addition, a first image to be used as a display image and a second image to be used for purposes of detection can be obtained in correspondence to the foreground area, whereas a first image to be used as a display image alone can be obtained over the background area.

(Variation 3)

In Variation 3, the image processing unit 33 (generation unit 33*c*) executes contrast adjustment processing in order to reduce the appearance of discontinuity in an image, attributable to the difference between the first image-capturing conditions and the second image-capturing conditions. Namely, the generation unit 33*c* lessens the appearance of discontinuity in an image attributable to the difference between the first image-capturing conditions and the second image-capturing conditions by altering the tone curve (gamma curve).

For instance, the first image-capturing conditions and the second image-capturing conditions may differ from each other only in the ISO sensitivity, with an ISO sensitivity setting of 100 selected for the first image-capturing conditions and an ISO sensitivity setting of 800 selected for the second image-capturing conditions. In this situation, the generation unit 33*c* will compress the image data values obtained under the second image-capturing conditions, among the image data values indicated at the reference positions by a factor of ⅛ by flattening the tone curve.

As an alternative, the generation unit 33*c* may expand the image data value included at the target position and image data values obtained under the first image-capturing conditions, among the image data values indicated at the reference positions by a factor of eight, by steepening the tone curve.

As in the embodiments described earlier, optimal image processing can be executed on sets of image data individually generated in correspondence to areas with different image-capturing conditions applied thereto through Variation 3. For instance, the appearance of discontinuity or an unnatural appearance in an image having undergone image processing, attributable to different image-capturing conditions set at boundaries of areas can be reduced.

(Variation 4)

In Variation 4, the image processing unit 33 (generation unit 33*c*) executes the image processing described above (e.g., noise reduction processing) by ensuring that edges of subject elements do not become lost. Noise reduction is generally executed through smoothing filter processing. While a smoothing filter is effective in noise reduction, the use of a smoothing filter may result in blurring at the edges of subject elements.

Accordingly, the image processing unit 33 (generation unit 33*c*) corrects any blurring at the edges of the subject elements by executing contrast adjustment processing, for instance, after the noise reduction processing or concurrently while the noise reduction processing is underway. The image processing unit 33 (generation unit 33*c*) in Variation 4 sets an S-shaped curve as a density conversion (gradation conversion) curve (for conversion often referred to as S conversion). The image processing unit 33 (generation unit 33*c*) executes contrast adjustment through the S conversion so as to increase the number of gradations in bright-area image data and the number of gradations in dark-area image data by individually stretching the bright data gradation portion and the dark data gradation portion and to decrease the number of gradations for mid tone gradation image data by compressing the mid-tone gradation image data. Through these measures, blurring that occurs along the edges of subject elements can be corrected as a result of a decrease in the number of sets of image data assuming mid-tone image brightness and an increase in the number of sets of image data classified as either bright-area data or dark-area data.

Through Variation 4, by achieving sharper contrast between bright and dark in the image, blurring along the boundaries of subject elements can be corrected.

(Variation 5)

In Variation 5, the image processing unit 33 (generation unit 33*c*) adjusts white balance adjustment gain to reduce the appearance of discontinuity in an image attributable to the difference between the first image-capturing conditions and the second image-capturing conditions.

For instance, the image-capturing conditions (referred to as first image-capturing conditions) applied at the target position during image-capturing operation and the image-capturing conditions (referred to as second image-capturing conditions) applied at a reference position around the target position during the image-capturing operation may be different from each other, and under such circumstances, the image processing unit 33 (generation unit 33*c*) adjusts the white balance adjustment gain so that the white balance in the image data obtained under the second image-capturing conditions, among the sets of image data obtained at reference positions, will achieve better similarity to the white balance in the image data obtained under the first image-capturing conditions.

It is to be noted that the image processing unit 33 (generation unit 33*c*) may instead adjust the white balance adjustment gain so as to adjust the white balance in the image data obtained under the first image-capturing conditions, among the sets of image data obtained at the reference positions, and in the image data obtained at the target position to achieve better similarity to the white balance in the image data obtained under the second image-capturing conditions.

In Variation 5, the appearance of discontinuity in an image, attributable to the difference between the first image-capturing conditions and the second image-capturing conditions, can be reduced by adjusting the white balance adjustment gains corresponding to the image data obtained in areas at which different image-capturing conditions are applied so that a uniform adjustment gain matching the gain applied in either of the areas with different image-capturing conditions applied thereto is used for both areas.

(Variation 6)

A plurality of image processing units 33 may be used for concurrent execution of image processing. For instance, while image processing for image data obtained by capturing an image in an area A at the image-capturing unit 32 is underway, image processing may be also executed for image data obtained by capturing an image in an area B at the image-capturing unit 32. The plurality of image processing units 33 may execute identical image processing or they may be engaged in different types of image processing. Namely, matching image processing may be executed for the image data obtained in the area A and the image data obtained in the area B by using matching parameters or the like, or different types of image processing may be executed for the image data obtained in the area A and for the image data obtained in the area B by using different parameters.

In a configuration that includes a plurality of image processing units 133, one of the image processing units may be engaged in image processing for image data obtained under the first image-capturing conditions and another image processing unit may be engaged in image processing for image data obtained under the second image-capturing conditions. In addition, the number of image processing units is not limited to two, as in the example described above, and the number of image processing units included in the configuration may match the number of sets of image-capturing conditions that can be set. Namely, an image processing unit may be assigned to execute image processing for each area for which a different set of image-capturing conditions has been set. In Variation 6, image-capturing operation executed under different image-capturing conditions set for different areas and image processing for image data expressing an image obtained in correspondence to each of the areas can be executed concurrently.

(Variation 7)

While the explanation has been given on an example in which the present invention is embodied in the camera 1, the present invention is not limited to this example and it may be adopted in a high-function mobile telephone 250 (see FIG. 14) with a camera function such as a smart phone, or in a mobile device such as a tablet terminal.

(Variation 8)

In the embodiments described above, the present invention is adopted in the camera 1, i.e., an integrated electronic device having the image-capturing unit 32 and the control unit 34 included as integrated components thereof. As an alternative, the present invention may be adopted in an image-capturing system 1B configured with an image-capturing unit 32 and a control unit 34, provided as entities separate from each other, in which the image-capturing unit 32 is controlled by the control unit 34 through communication.

Figure 17:
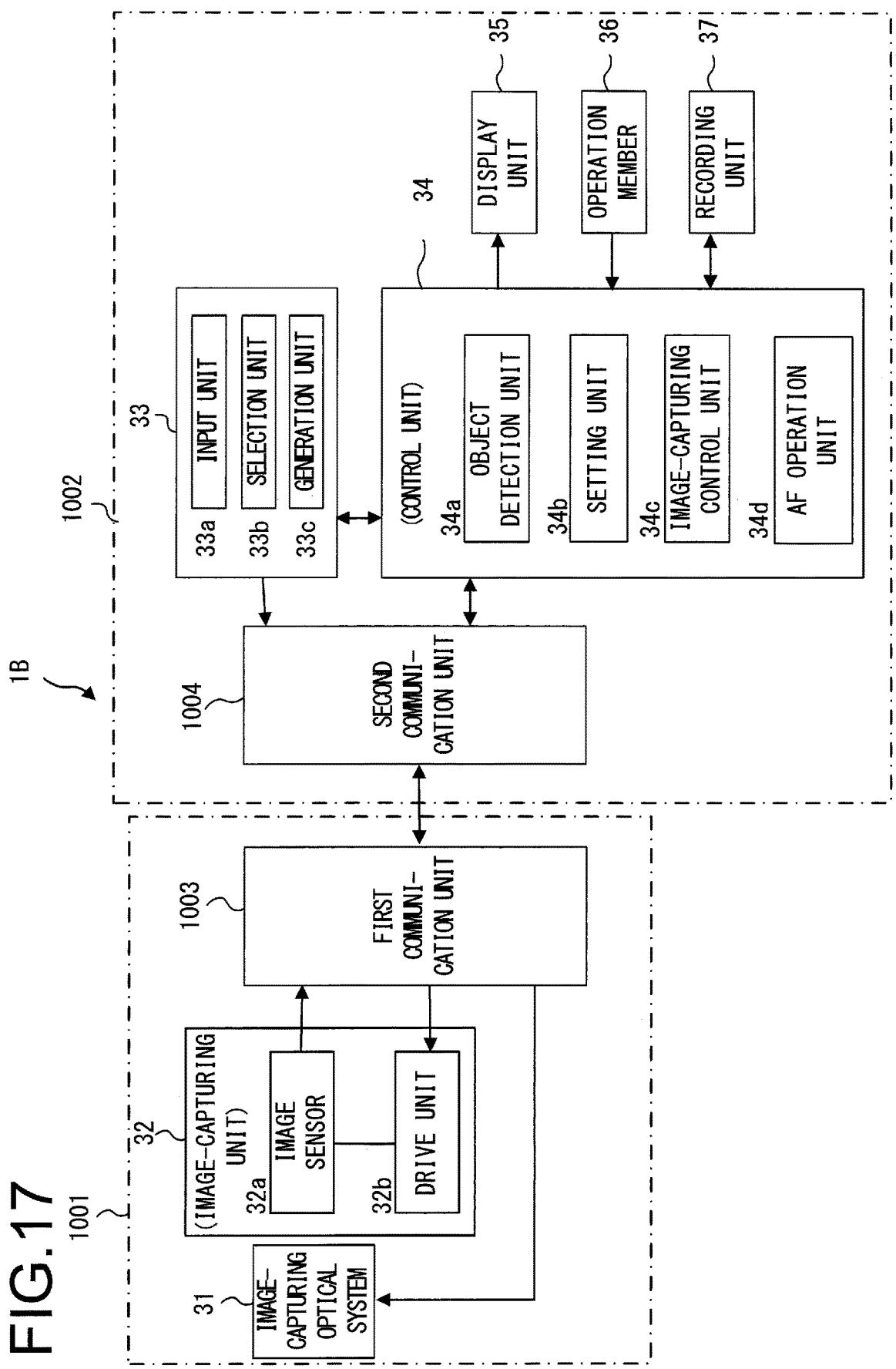
FIG. 17 A block diagram presenting an example of a structure that may be adopted in the image-capturing system achieved in Variation 8

The following is a description of an example in which an image-capturing device 1001, which includes an image-capturing unit 32, is controlled by a control device 1002 which includes a control unit 34, given in reference to FIG. 17.

FIG. 17 is a block diagram presenting an example of a structure that may be adopted in the image-capturing system 1B in Variation 8. The image-capturing system 1B in FIG. 17 is configured with the image-capturing device 1001 and a display device 1002. The image-capturing device 1001 includes a first communication unit 1003, as well as the image-capturing optical system 31 and the image-capturing unit 32 described in reference to the embodiments. In addition, the display device 1002 includes a second communication unit 1004, as well as the image processing unit 33, the control unit 34, the display unit 35, the operation member 36 and the recording unit 37 described in reference to the embodiments.

The first communication unit 1003 and the second communication unit 1004 are able to conduct bidirectional image data communication through, for instance, wireless communication, optical communication or the like of the known art.

It is to be noted that the image-capturing device 1001 and the display device 1002 may be connected via a wiring cable to enable the first communication unit 1003 and the second communication unit 1004 to conduct bidirectional image data communication.

In the image-capturing system 1B, the control unit 34 controls the image-capturing unit 32 through data communication enabled via the second communication unit 1004 and the first communication unit 1003. For instance, specific image data are exchanged between the image-capturing device 1001 and the display device 1002 so as to allow the display device 1002 to divide the image plane into a plurality of areas based upon an image, set different image-capturing conditions in different areas and read out photoelectric conversion signals resulting from photoelectric conversion in the individual areas, as has been explained earlier.

In Variation 8, a live view image obtained at the image-capturing device 1001 and transmitted to the display device 1002 is brought up on display at the display unit 35 in the display device 1002. This means that the user is able to perform operation through remote control at the display device 1002 distanced from the image-capturing device 1001.

The display device 1002 may be, for instance, a high-function mobile telephone 250 such as a smart phone. In addition, the image-capturing device 1001 may be configured as an electronic device that includes the stacked image sensor 100 described earlier.

It is to be noted that while the control unit 34 in the display device 1002 includes the object detection unit 34a, the setting unit 34b, the image-capturing control unit 34c and the AF operation unit 34d in the example described above, some of these units, i.e., the subject detection unit 34a, the setting unit 34b, the image-capturing control unit 34c and the AF operation unit 34d, may be installed in the image-capturing device 1001, instead.

(Variation 9)

Figure 18:
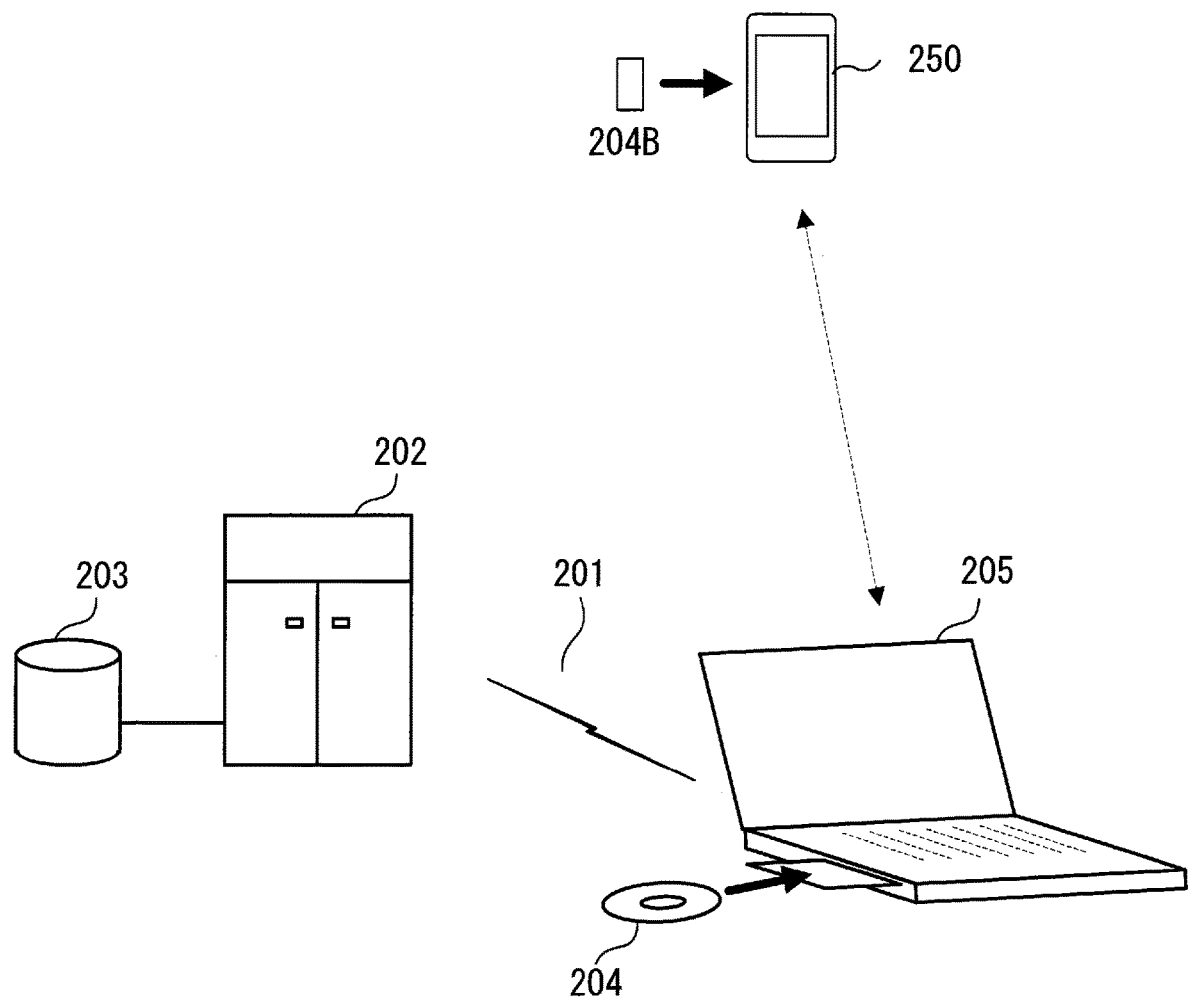
FIG. 18 An illustration showing how a program is provided a mobile device

A program may be provided to the camera 1, the high-function mobile telephone 250 or a mobile device such as a tablet terminal by transmitting the program installed in the personal computer 205 to the recipient mobile device through, for instance, infrared communication or short-range wireless communication, as illustrated in FIG. 18.

The program may be provided to the personal computer 205 by setting a recording medium 204, such as a CD-ROM, with the program stored therein, into the personal computer 205, or by loading the program into the personal computer 205 via a communication line 201 such as a network. The program to be provided via the communication line 201 should be stored in a storage device 203 or the like at a server 202 connected to the communication line.

In addition, the program may be directly transmitted to the mobile device via an access point (not shown) of a wireless LAN connected to the communication line 201. Furthermore, a recording medium 204B such as a memory card with the program stored therein may be set in the mobile device. Namely, the program may be provided as a computer program product assuming any of various modes, including a computer program product in a recording medium and a computer program product provided via a communication line.

Third Embodiment

In reference to FIGS. 19 through 25, a digital camera representing an example of an electronic device that includes the image processing device achieved in the third embodiment, will be explained. The following explanation will focus on features distinguishing the embodiment from the first and second embodiments with the same reference signs assigned to structural elements identical to those in the first or second embodiment. Elements that are not specially noted are identical to those in the first or second embodiment. The primary feature distinguishing the embodiment from the first embodiment is that the structure in the embodiment does not include the image processing unit 33 in the first embodiment and instead an image-capturing unit 32A further includes an image processing unit 32c having functions similar to those of the image-capturing unit 33 in the first embodiment.

Figure 19:
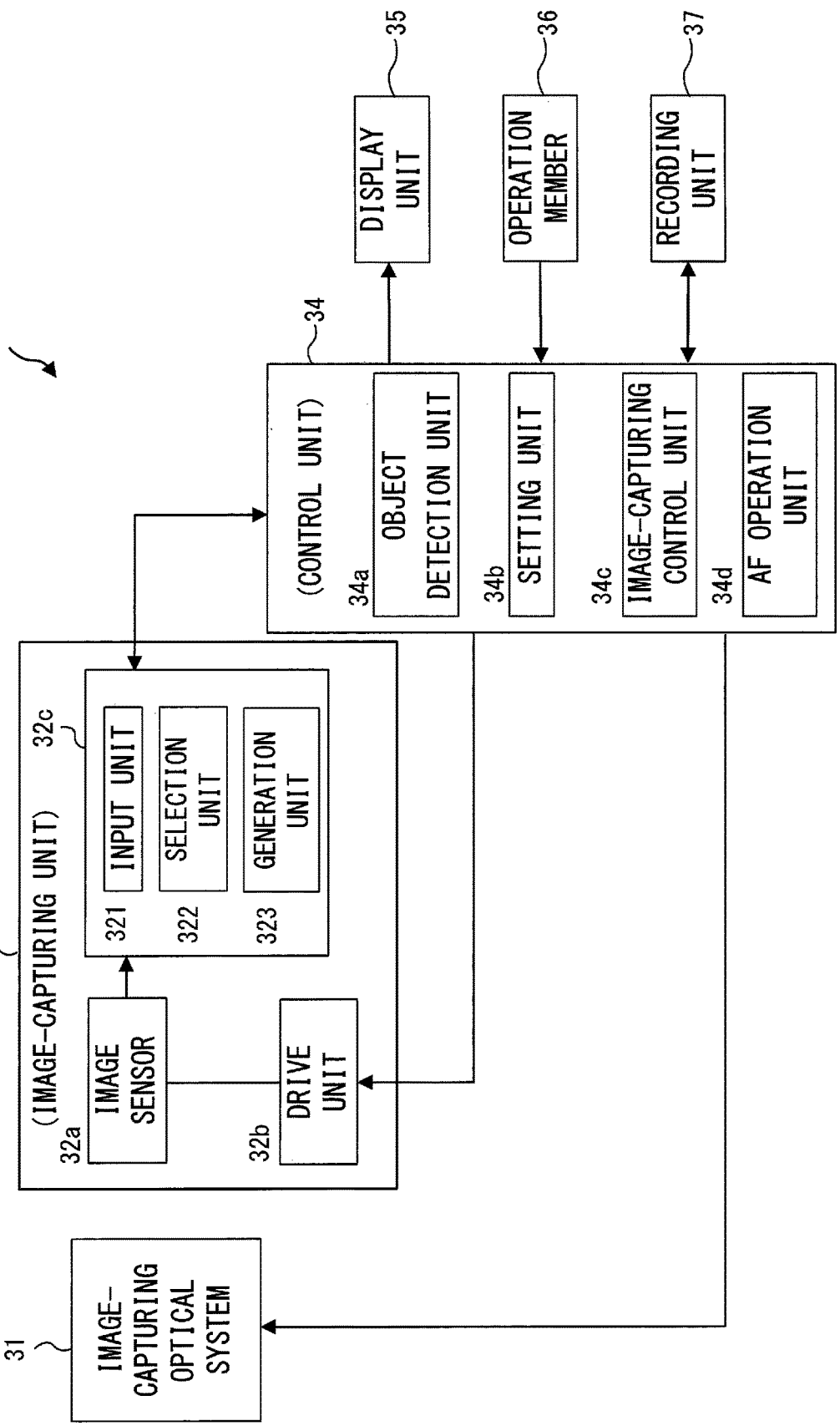
FIG. 19 A block diagram presenting an example of a structure that may be adopted in the camera achieved in a third embodiment FIG. 20 A schematic diagram indicating the correspondence between the individual blocks and a plurality of selection units FIG. 21 A sectional view of a stacked image sensor FIG. 22 A schematic illustration showing how the first image data and the second image data are processed in relation to image processing FIG. 23 A schematic illustration showing how the first image data and the second image data are processed in relation to focus detection processing FIG. 24 A schematic illustration showing how the first image data and the second image data are processed in relation to subject detection processing FIG. 25 A schematic illustration showing how the first image data and the second image data are processed when the image-capturing conditions are set through, for instance, exposure calculation processing FIG. 26 A schematic illustration showing how the first image data and the second image data are processed in Variation 10

FIG. 19 is a block diagram presenting an example of a structure that may be adopted in a camera 1C in the third embodiment. The camera 1C in FIG. 19 comprises an image-capturing optical system 31, the image-capturing unit 32A, a control unit 34, a display unit 35, an operation member 36 and a recording unit 37. The image-capturing unit 32A further includes an image processing unit 32c having functions similar to those of the image processing unit 33 in the first embodiment.

The image processing unit 32c includes an input unit 321, selection units 322 and a generation unit 323. Image data obtained via an image sensor 32a are input to the input unit 321. The selection units 322 execute preliminary processing on the image data input as described above. The preliminary processing executed by the selection units 322 is identical to the preliminary processing executed by the selection unit 33b in the first embodiment. The generation unit 323 generates an image by executing image processing on the input image data and the image data having undergone the preliminary processing.

The image processing executed by the generation unit 323 is identical to the image processing executed by the generation unit 33c in the first embodiment.

Figure 20:
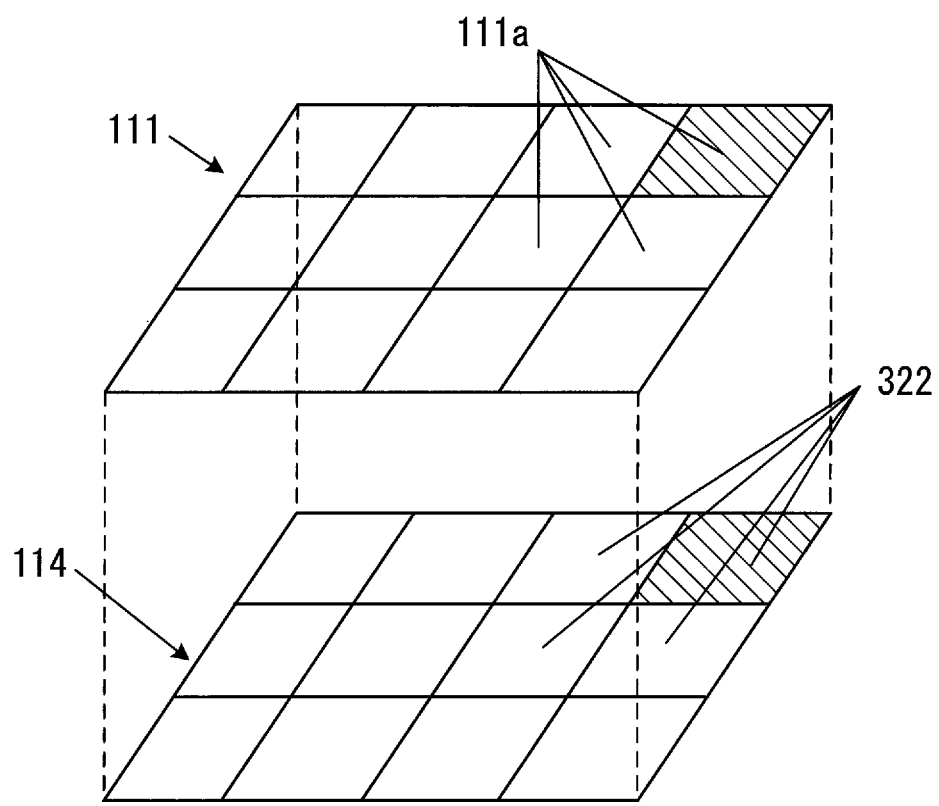

FIG. 20 schematically illustrates the corresponding relationship that exists between various blocks and a plurality of selection units 322 in the embodiment. In FIG. 20 each square at a rectangular image-capturing chip 111 represents a single block 111a. Likewise, each square at a rectangular image processing chip 114, to be described later, represents a single selection unit 322.

In the embodiment, the selection units 322 are provided each in correspondence to one of the blocks 111a. In other words, a selection unit 322 is provided for each of the blocks which are the smallest units of areas for which different image-capturing conditions can be set at the imaging plane. For instance, the hatched block 111a and the hatched selection unit in FIG. 20 correspond to each other. The hatched selection unit 322 in FIG. 20 executes the preliminary processing for the image data output from the pixels present in the hatched block 111a. The selection units 322 each execute the preliminary processing for the image data output from the pixels present in the corresponding block 111a.

Since this makes it possible to engage the plurality of selection units 322 in concurrent execution of preliminary processing for the image data, the processing onus at each selection unit 322 can be reduced, and an optimal image can be generated in a short period of time by using sets of image data individually generated in areas with different image-capturing conditions applied thereto.

It is to be noted that when describing the relationship between a given block 111a and the pixels present in the particular block 111a, the block 111a may be referred to as the block 111a to which the pixels belong in the following explanation. In addition, a block 111a may otherwise be referred to as a unit block and a plurality of blocks 111a grouped together, i.e., an aggregate of unit blocks may be referred to as a combined block.

Figure 21:
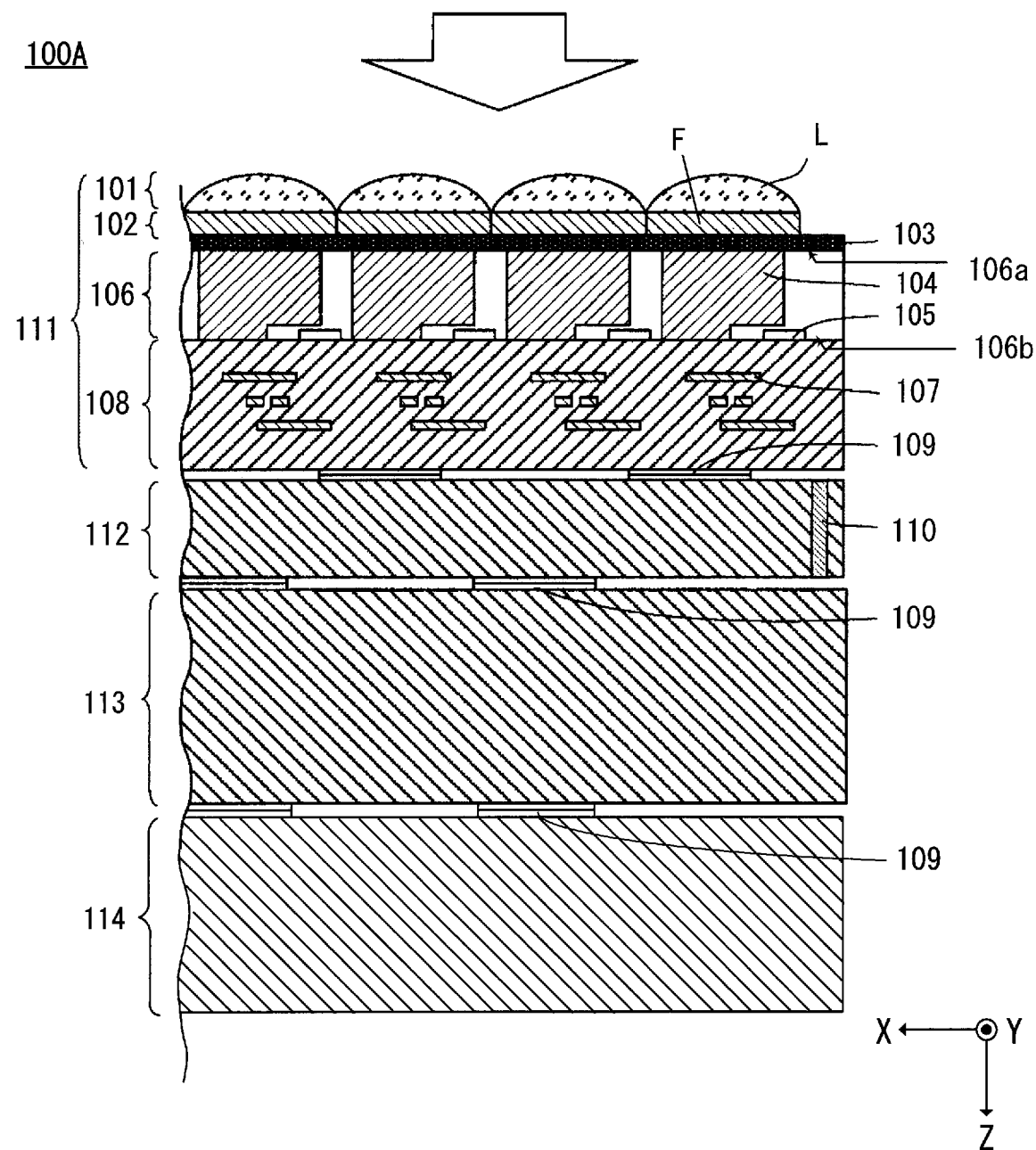

FIG. 21 presents a sectional view of a stacked image sensor 100A. The stacked image sensor 100A includes the image processing chip 114, which executes the preliminary processing described above and image processing, in addition to a back-side illumination-type image-capturing chip 111, a signal processing chip 112 and a memory chip 113. Namely, the image processing unit 32c is disposed at the image processing chip 114.

The image-capturing chip 111, the signal processing chip 112, the memory chip 113 and the image processing chip 114 are stacked one upon another and are electrically connected with one another via bumps 109 constituted of a material such as Cu having electric conductivity.

A plurality of bumps 109 are disposed at the surface of the memory chip 113 and the surface of the image processing chip 114 that face opposite each other. As these bumps 109 are aligned relative to each other and the memory chip 113 and the image processing chip 114 are pressed against each other, the bumps 109, having been aligned with each other, become bonded, thereby achieving electrical connection.

<Data Selection Processing>

In the second embodiment, once the setting unit 34b has divided the imaging field into a plurality of areas, image-capturing conditions can be set (adjusted), for an area selected by the user or for an area determined by the control unit 34, as in the first embodiment. If different image-capturing conditions have been set for individual areas, the control unit 34 initiates the following data selection processing as needed.

1. When Executing Image Processing 1-1. When uniform image-capturing conditions are selected for the target pixel P and a plurality of reference pixels around the target pixel P In this case, the corresponding selection unit 322 selects all the image data obtained at the plurality of reference pixels and outputs the selected image data to the generation unit 323. The generation unit 323 executes image processing by using the image data from the plurality of reference pixels.

1-2. When the image-capturing conditions set for the target pixel P are different from the image-capturing conditions set for at least one of the plurality of reference pixels around the target pixel P The image-capturing conditions applied at the target pixel P are first image-capturing conditions, the image-capturing conditions applied at some of the plurality of reference pixels are also the first image-capturing conditions and the image-capturing conditions applied at the rest of the reference pixels are second image-capturing conditions.

In this situation, a selection unit 322 corresponding to a block 111a to which a reference pixel with the first image-capturing conditions applied thereto belongs, and a selection unit 322 corresponding to a block 111a to which a reference pixel with the second image-capturing conditions applied thereto belongs, execute data selection processing, as explained in (example 1) through (example 3) below with regard to the image data at the reference pixels. The generation unit 323 then executes image processing so as to generate through calculation image data for the target pixel P by referencing the image data at the reference pixels selected through the data selection processing.

Example 1

For instance, the first image-capturing conditions and the second image-capturing conditions may differ from each other only in the ISO sensitivity, with an ISO sensitivity setting of 100 selected for the first image-capturing conditions and an ISO sensitivity setting of 800 selected for the second image-capturing conditions. Under these circumstances, the selection unit 322 corresponding to a block 111a to which a reference pixel with the first image-capturing conditions applied thereto belongs, selects the image data obtained under the first image-capturing conditions. However, the selection unit 322 corresponding to a block 111a to which a reference pixel with the second image-capturing conditions applied thereto belongs, does not select the image data obtained under the second image-capturing conditions. In other words, the image data obtained under the second image-capturing conditions, which are different from the first image-capturing conditions, are not used in the image processing.

Example 2

The first image-capturing conditions and the second image-capturing conditions may differ from each other only in the shutter speed, with a shutter speed setting of 1/1000 sec selected for the first image-capturing conditions and a shutter speed setting of 1/100 sec selected for the second image-capturing conditions. Under these circumstances, the selection unit 322 corresponding to a block 111a to which a reference pixel with the first image-capturing conditions applied thereto belongs, selects the image data obtained under the first image-capturing conditions. However, the selection unit 322 corresponding to a block 111a to which a reference pixel with the second image-capturing conditions applied thereto belongs, does not select the image data obtained under the second image-capturing conditions. In other words, the image data obtained under the second image-capturing conditions, which are different from the first image-capturing conditions, are not used in the image processing.

Example 3

The first image-capturing conditions and the second image-capturing conditions may differ from each other only in the frame rate (with uniform electric charge accumulation time) with a frame rate setting of 30 fps selected for the first image-capturing conditions and a frame rate setting of 60 fps selected for the second image-capturing conditions. Under these circumstances, the selection unit 322 corresponding to a block 111a to which a reference pixel with the first image-capturing conditions applied thereto belongs, selects the image data obtained under the first image-capturing conditions. In addition, the selection unit 322 corresponding to a block 111a to which a reference pixel with the second image-capturing conditions applied thereto belongs, selects image data in frame images obtained with timing close to the timing with which frame images have been obtained under the first image-capturing conditions (30 fps) among the sets of image data obtained under the second image-capturing conditions (60 fps) at the reference pixel. Namely, image data expressing frame images obtained with timing close to the timing with which frame images have been obtained under the first image-capturing conditions (30 fps) are used in the image processing, but image data obtained with timing different from the timing with which the frame images have been obtained under the first image-capturing conditions (30 fps) among the sets of image data at the reference pixel, are not used in the image processing.

It is to be noted that data selection processing will be executed in much the same way when the image-capturing conditions applied at the target pixel P are the second image-capturing conditions and the image-capturing conditions applied at reference pixels around the target pixel P are the first image-capturing conditions. Namely, a selection unit 322 corresponding to a block 111a to which a reference pixel with the first image-capturing conditions applied thereto belongs, and a selection unit 322 corresponding to a block 111a to which a reference pixel with the second image-capturing conditions applied thereto belongs, execute data selection processing, as has been explained in reference (example 1) to (example 3) for the image data at the reference pixels.

It is to be noted that as has been explained earlier, image-capturing conditions indicating a slight difference are regarded as uniform image-capturing conditions.

The generation unit 323 executes image processing such as defective pixel correction processing, color interpolation processing, edge enhancement processing and noise reduction processing based upon the image data at the reference pixels selected by the selection units 322, as does the image processing unit 33 (generation unit 33c) in the first embodiment.

Figure 22:
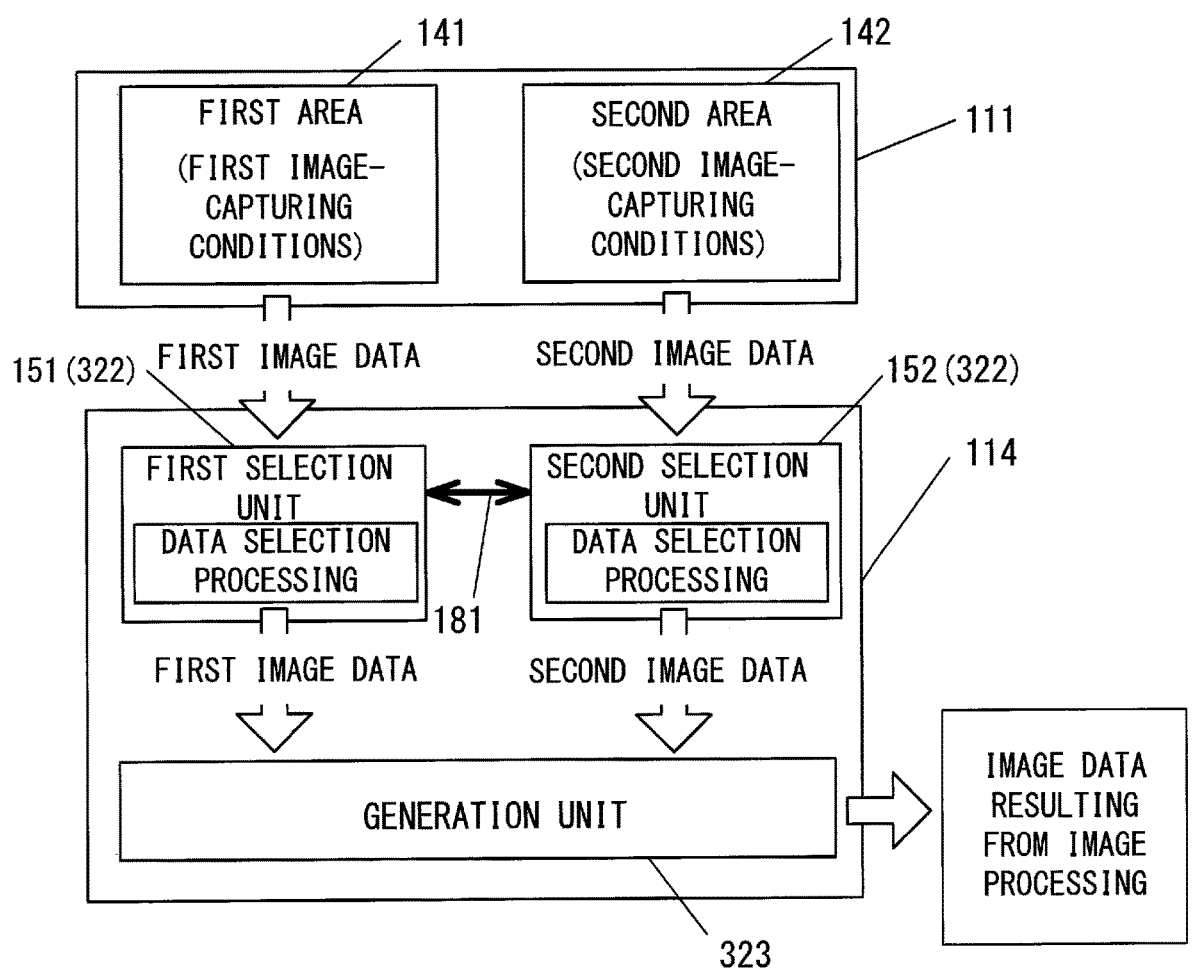

FIG. 22 is a schematic diagram illustrating how image data (hereafter referred to as first image data) from individual pixels present in an area (hereafter referred to as a first area 141) of the image-capturing surface, with the first image-capturing conditions applied thereto, and image data (hereafter referred to as second image data) from individual pixels present in an area (hereafter referred to as a second area 142) at the image-capturing surface, with the second image-capturing conditions applied thereto, are processed. It is to be noted that the processing in FIG. 22 is executed for the target pixel P with the first image-capturing conditions applied thereto in (example 1) and (example 2) described earlier.

The first image data expressing an image captured under the first image-capturing conditions are output from each pixel present in the first area 141, whereas the second image data expressing an image captured under the second image-capturing conditions are output from each pixel present in the second area 142. The first image data are output to the selection unit 322 that corresponds to the block 111a to which the particular pixel having generated the first image data belongs, among the plurality of selection units 322 disposed at the processing chip 114. In the following description, a plurality of selection units 322, each corresponding to one of a plurality of blocks 111a to which pixels having generated individual sets of first image data belong, will be referred to as a first selection unit 151.

Likewise, the second image data are output to the selection unit 322 that corresponds to the block 111a, to which the particular pixel having generated the second image data belongs, among the plurality of selection units 322 disposed at the processing chip 114. In the following description, a plurality of selection units 322, each corresponding to one of a plurality of blocks 111a, to which the pixels having generated individual sets of second image data belong, will be referred to as a second selection unit 152.

For instance, the target pixel P may be present in the first area 141, and in this case, the first selection unit 151 selects the image data at the target pixel P and image data obtained at reference pixels by capturing an image under the first image-capturing conditions and outputs the selected image data to the generation unit 323. While image data in a single block are selected via the selection unit 322 in this example, image data from another block, generated by capturing an image under the first image-capturing conditions, may be selected as well. In the latter case, the selection unit 322, to which the image data from the target pixel P have been input and the selection unit 322 corresponding to another block with the first image-capturing conditions applied thereto for image-capturing operation simply need to exchange the information 181 pertaining to the first image-capturing conditions required for data selection processing. The second selection unit 152 does not select image data at reference pixels generated by capturing an image under the second image-capturing conditions and thus does not output the image data at the reference pixels with the second image-capturing conditions applied thereto to the generation unit 323. It is to be noted that the second selection unit 152 receives the information 181 pertaining to the first image-capturing conditions required in the data selection processing from, for instance, the first selection unit 151.

Likewise, if the target pixel P is present in the second area, and in this case, the second selection unit 152 selects the image data at the target pixel P and image data obtained at reference pixels by capturing an image under the second image-capturing conditions and outputs the selected image data to the generation unit 323. The first selection unit 151 does not select the image data at reference pixels generated by capturing an image under the first image-capturing conditions, and thus does not output image data at the reference pixels with the first image-capturing conditions applied thereto to the generation unit 323. It is to be noted that the first selection unit 151 receives information pertaining to the second image-capturing conditions required in the data selection processing from, for instance, the second selection unit 152.

Once the preliminary processing has been executed as described above, the generation unit 323 executes image processing such as defective pixel correction processing, color interpolation processing, edge enhancement processing and noise reduction processing based upon the image data provided via the first selection unit 151 and the second selection unit 152, and outputs image data resulting from the image processing.

2. When Executing Focus Detection Processing

As in the first embodiment, the control unit 34 (AF operation unit 34d) executes focus detection processing by using image data corresponding to a specific position (focus detection position) on the imaging field. It is to be noted that if different image-capturing conditions have been set in different areas and the focus detection position set for an AF operation is located at a boundary between areas, i.e., if the focus detection position is split over the first area and the second area, the control unit 34 (AF operation unit 34d) in the embodiment engages the selection units 322 in data selection processing as explained in 2-2 below.

2-1. When the image data from the pixels present within the frame 170 in FIG. 13 do not include both focus detection signal data obtained under the first image-capturing conditions and focus detection signal data obtained under the second image-capturing conditions In this case, the selection units 322 select the focus detection signal data from all the pixels present in the frame 170 and output the selected data to the generation unit 323. The control unit 34 (AF operation unit 34d) executes focus detection processing by using the focus detection signal data obtained at the focus detection pixels within the frame 170.

2-2. When the image data from the pixels present within the frame 170 in FIG. 13 include both focus detection signal data obtained under the first image-capturing conditions and focus detection signal data obtained under the second image-capturing conditions output The control unit 34 (AF operation unit 34d) engages the selection units 322 that correspond to the blocks 111a to which the pixels in the frame 170 belong, in data selection processing, as described in (example 1) through (example 3) below. The control unit 34 (AF operation unit 34d) then executes focus detection processing by using the focus detection signal data selected through the data selection processing.

Example 1

For instance, the first image-capturing conditions and the second image-capturing conditions may differ from each other only in the ISO sensitivity, with an ISO sensitivity setting of 100 selected for the first image-capturing conditions and ISO sensitivity setting of 800 selected for the second image-capturing conditions. Under these circumstances, a selection unit 322 corresponding to a block 111a, to which a pixel with the first image-capturing conditions applied thereto belongs, selects the focus detection signal data obtained under the first image-capturing conditions. However, a selection unit 322 corresponding to a block 111a to which a pixel with the second image-capturing conditions applied thereto belongs does not select the focus detection signal data obtained under the second image-capturing conditions. In other words, only the focus detection signal data obtained under the first image-capturing conditions, among the sets of focus detection signal data obtained at pixels present inside the frame 170, are used for the focus detection processing without using the image data obtained under the second image-capturing conditions, different from the first image-capturing conditions, for the focus detection processing.

Example 2

The first image-capturing conditions and the second image-capturing conditions may differ from each other only in the shutter speed, with a shutter speed setting of 1/1000 sec selected for the first image-capturing conditions and a shutter speed setting of 1/100 sec selected for the second image-capturing conditions. Under these circumstances, a selection unit 322 corresponding to a block 111a to which a pixel with the first image-capturing conditions applied thereto belongs, selects the focus detection signal data obtained under the first image-capturing conditions. However, a selection unit 322 corresponding to a block 111a to which a pixel with the second image-capturing conditions applied thereto belongs does not select the focus detection signal data obtained under the second image-capturing conditions. In other words, only the focus detection signal data obtained under the first image-capturing conditions, among the sets of focus detection signal data obtained at pixels present inside the frame 170, are used for the focus detection processing without using the focus detection signal data obtained under the second image-capturing conditions, different from the first image-capturing conditions, for the focus detection processing.

Example 3

The first image-capturing conditions and the second image-capturing conditions may differ from each other only in the frame rate (with uniform electric charge accumulation time) with a frame rate setting of 30 fps selected for the first image-capturing conditions and a frame rate setting of 60 fps selected for the second image-capturing conditions. Under these circumstances, a selection unit 322 corresponding to a block 111a to which a pixel with the first image-capturing conditions applied thereto belongs, selects the focus detection signal data obtained under the first image-capturing conditions. In addition, a selection unit 322 corresponding to a block 111a to which a pixel with the second image-capturing conditions applied thereto belongs, selects focus detection signal data in frame images obtained under the second image-capturing conditions (60 fps) with timing close to the timing with which a frame image have been obtained under the first image-capturing conditions (30 fps). Namely, focus detection signal data expressing frame images obtained with timing close to the timing with which the focus detection signal data for frame images have been obtained under the first image-capturing conditions, among sets of focus detection signal data obtained under the second image-capturing conditions (60 fps) are used in the focus detection processing, but focus detection signal data obtained with timing significantly different from the timing with which the frame images have been obtained under the first image-capturing conditions (30 fps) are not used in the focus detection processing.

It is to be noted that as has been explained earlier, image-capturing conditions indicating a slight difference are regarded as uniform image-capturing conditions.

In addition, while the focus detection signal data obtained under the first image-capturing conditions, among the sets of focus detection signal data obtained in the area enclosed with the frame 170, are selected in (example 1) and (example 2) described above, the focus detection signal data obtained under the second image-capturing conditions, among the sets of focus detection signal data in the area within the frame 170, may be selected instead.

It is to be also noted that if the focus detection position is split over the first area and the second area with the first area assuming a greater areal size than the second area, it is desirable to select the image data obtained under the first image-capturing conditions, whereas if the second area takes a greater areal size than the first area, it is desirable to select image data obtained under the second image-capturing conditions.

Figure 23:
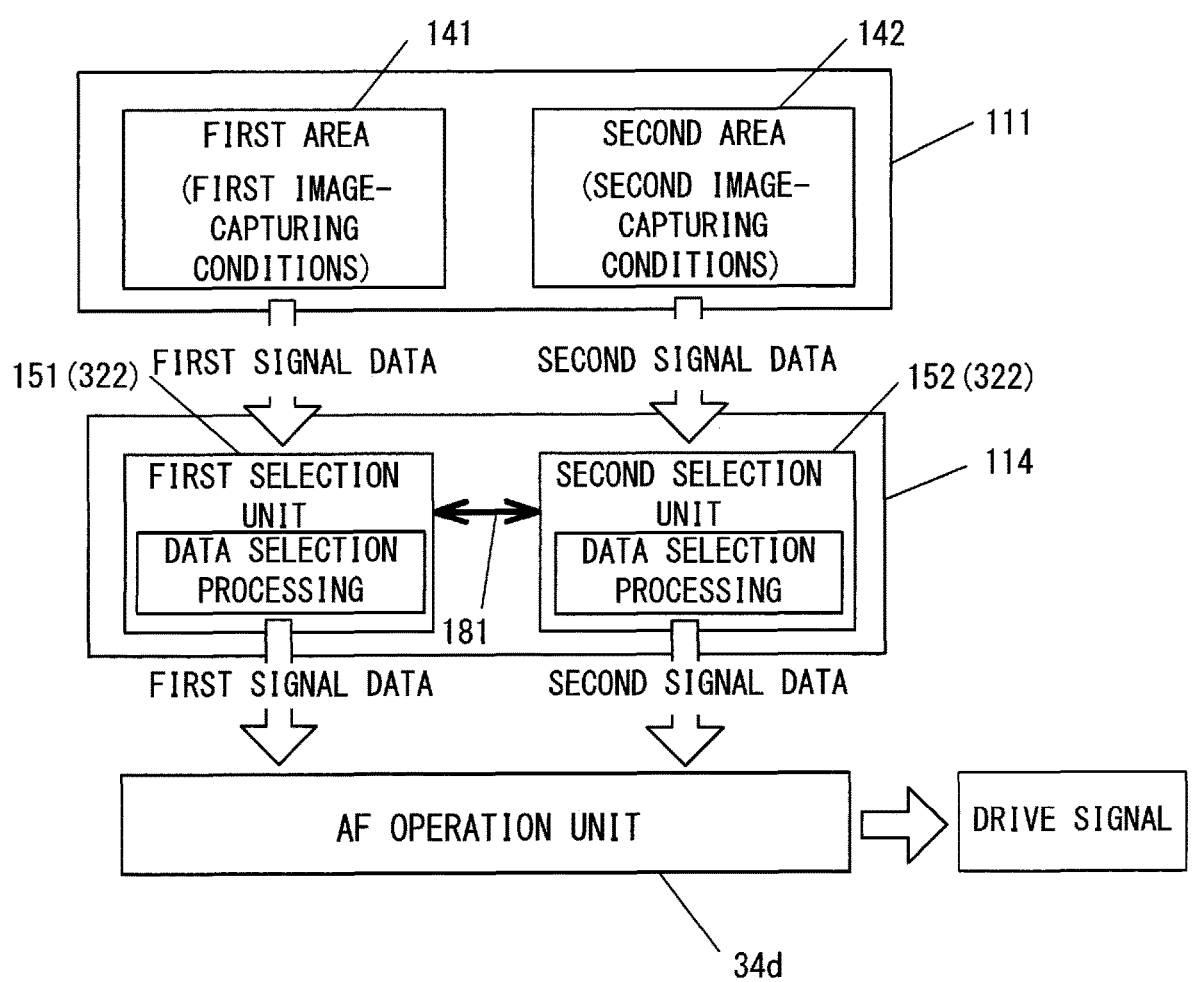

FIG. 23 presents a schematic diagram illustrating how first signal data and second signal data are processed in relation to the focus detection processing. It is to be noted that FIG. 23 illustrates how processing is executed with the focus detection signal data obtained under the first image-capturing conditions, selected from the sets of signal data obtained in the area enclosed by the frame 170, and with the focus detection signal data obtained under the second image-capturing conditions also selected from the sets of signal data obtained in the area enclosed by the frame 170.

First signal data to be used for focus detection, generated by capturing an image under the first image-capturing conditions, are output from each of the pixels present in the first area 141, whereas second signal data to be used for focus detection, generated by capturing an image under the second image-capturing conditions, are output from each of the pixels present in the second area 142. The first signal data originating from the first area 141 are output to the first selection unit 151. Likewise, the second signal data originating from the second area 142 are output to the second selection unit 152.

The first processing unit 151 selects the first signal data obtained under the first image-capturing conditions and outputs the selected data to the AF operation unit 34d. The second processing unit 152 selects the second signal data obtained under the second image-capturing conditions and outputs the selected data to the AF operation unit 34d.

Once the preliminary processing has been executed as described above, the AF operation unit 34d calculates a first defocus quantity based upon the first signal data provided via the first processing unit 151. In addition, the AF operation unit 34d calculates a second defocus quantity based upon the second signal data provided from the first processing unit 151. Then, the AF operation unit 34d outputs a drive signal generated based upon the first defocus quantity and the second defocus quantity to be used to drive the focus lens in the image-capturing optical system 31 to the in-focus position.

It is to be noted that if the focus detection signal data obtained under the first image-capturing conditions, among the sets of signal data obtained in the area within the frame 170, are selected but the focus detection signal data obtained under the second image-capturing conditions located in the area within the frame 170 are not selected, as in (example 1) and (example 2) described above, the following processing is executed with regard to the first signal data and the second signal data.

When focus detection processing is executed by using the first signal data obtained under the first image-capturing conditions, for instance, the first processing unit 151 selects the first signal data obtained under the first image-capturing conditions and outputs the selected first signal data to the generation unit 323. The second processing unit 152, however, does not select the second signal data obtained under the second image-capturing conditions and does not output the second signal data at the reference pixels with the second image-capturing conditions applied thereto to the generation unit 323. It is to be noted that the second processing unit 152 receives the information 181 pertaining to the first image-capturing conditions required in the data selection processing from, for instance, the first processing unit 151.

Once the preliminary processing has been executed as described above, the AF operation unit 34d executes focus detection processing based upon the first signal data provided via the first processing unit 151 and outputs a drive signal, generated based upon the arithmetic operation results, to be used to drive the focus lens in the image-capturing optical system 31, to the in-focus position.

An explanation will be given next on an example in which a focusing target subject, onto which focus is to be adjusted, takes a position astride an area with the first image-capturing conditions applied thereto and an area with the second image-capturing conditions applied thereto. When the focusing target subject takes a position astride an area with the first image-capturing conditions applied thereto and an area with the second image-capturing conditions applied thereto, a, selection unit 322 corresponding to a block 111a to which a pixel with the first image-capturing conditions applied thereto belongs, selects the first signal data generated under the first image-capturing conditions, to be used for focus detection. In addition, a selection unit 322 corresponding to a block 111a, to which a pixel with the second image-capturing conditions applied thereto belongs, selects the second signal data generated under the second image-capturing conditions, to be used for focus detection. The control unit 34 (AF operation unit 34d) then calculates a first defocus quantity based upon the first focus detection signal data having been selected. The control unit 34 (AF operation unit 34d) further calculates a second defocus quantity based upon the second focus detection signal data having been selected. The control unit 34 (AF operation unit 34d) next executes focus detection processing based upon the first defocus quantity and the second defocus quantity. In more specific terms, the control unit 34 (AF operation unit 34d) calculates a lens drive distance by, for instance, calculating the average of the first defocus quantity and the second defocus quantity. As an alternative, the control unit 34 (AF operation unit 34d) may select a value representing either the first defocus quantity or the second defocus quantity, that indicates a smaller drive distance for the lens. As a further alternative, the control unit 34 (AF operation unit 34d) may select a value representing either the first defocus quantity or the second defocus quantity that indicates that the subject is located closer to the camera.

In addition, when the focusing target subject is present astride an area with the first image-capturing conditions applied thereto and an area with the second image-capturing conditions applied thereto, the control unit 34 (AF operation unit 34d) may select the focus detection photoelectric conversion signals generated in the area occupied by the greater part of the subject. For instance, 70% of the facial area, i.e., the focusing target subject, may be present in the area with the first image-capturing conditions applied thereto with the remaining 30% of the facial area in the second area, and in such case, the control unit 34 (AF operation unit 34d) will select the focus detection photoelectric conversion signals generated under the first image-capturing conditions. It is to be noted that the areal ratio (%) described above simply represents an example, in the present invention is not limited to this example.

3. When Executing Subject Detection Processing

The processing executed when different image-capturing conditions are set for different areas and a search range 190 includes a boundary between areas will be explained next.

3-1. When the image data available within the search range 190 in FIG. 14 do not include both image data obtained under the first image-capturing conditions and image data obtained under the second image-capturing conditions In this case, the selection units 322 select the image data from all the pixels present in the search range 190 and output the selected image data to the generation unit 323. The control unit 34 (AF operation unit 34*d*) executes subject detection processing by using the image data obtained at the pixels within the search range 190.

Figure 24:
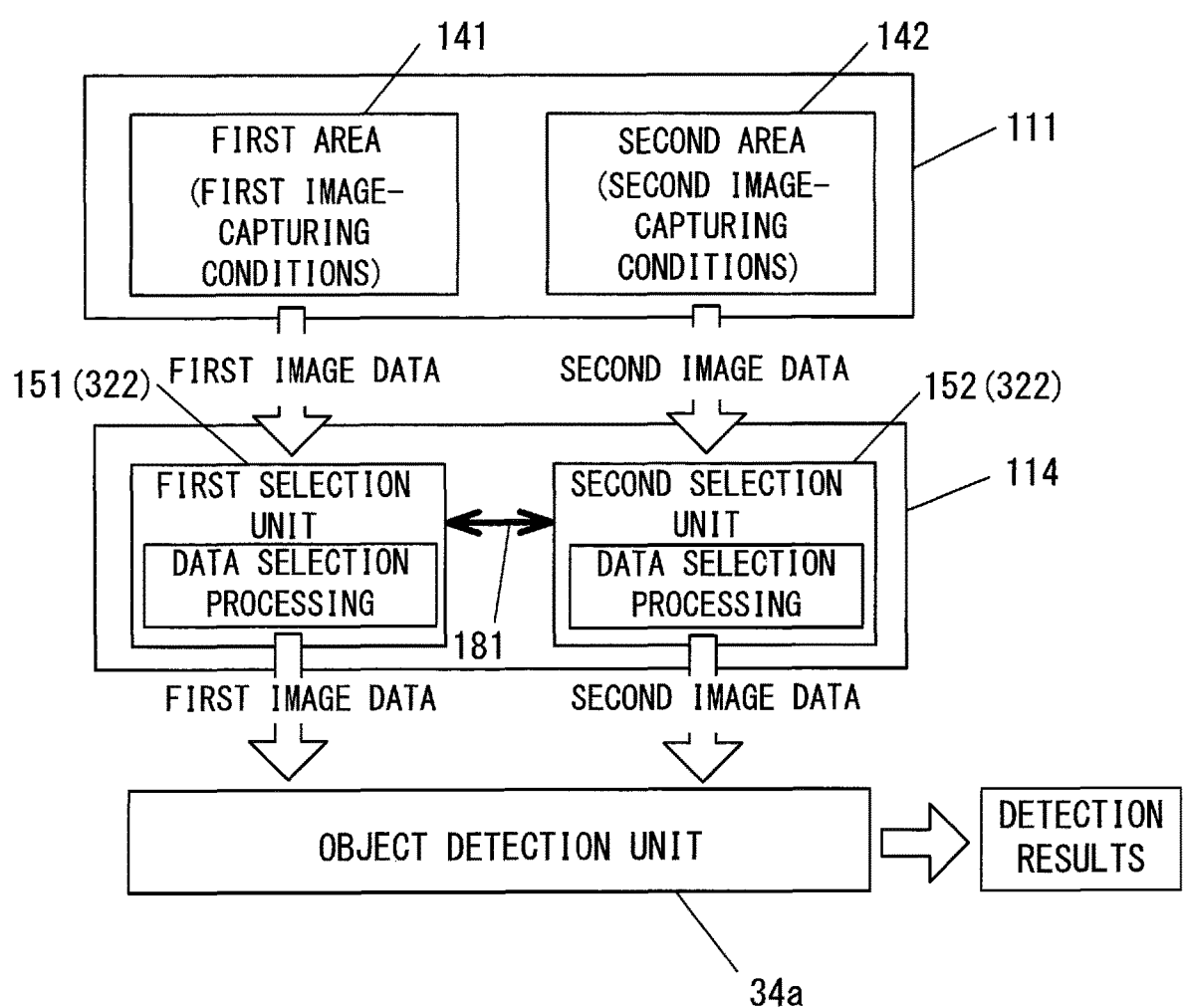

3-2. When the image data within the search range 190 in FIG. 14 include both image data obtained under the first image-capturing conditions and image data obtained under the second image-capturing conditions (a) When the first image-capturing conditions and the second image-capturing conditions differ from each other only in the ISO sensitivity or in the shutter speed, as in (example 1) or (example 2) described earlier in reference to the focus detection processing Under these circumstances, the control unit 34 (object detection unit 34*a*) engages each selection unit 322 (first selection unit 151) corresponding to a block 111*a*, to which a pixel with the first image-capturing conditions applied thereto belongs so as to select the image data obtained under the first image-capturing conditions to be used in the subject detection processing, among the sets of image data available in the search range 190, as illustrated in FIG. 24. It is to be noted that FIG. 24 presents a schematic diagram illustrating how first image data and second image data are processed in relation to the subject detection processing.

The control unit 34 (object detection unit 34*a*) then executes the subject detection processing by using the image data selected through the data selection processing.

The control unit 34 (object detection unit 34*a*) also engages each selection unit 322 (second selection unit 152) corresponding to a block 111*a*, to which a pixel with the second image-capturing conditions applied thereto belongs so as to select the image data obtained under the second image-capturing conditions to be used in the subject detection processing, among the sets of image data available in the search range 190. The control unit 34 (object detection unit 34*a*) then executes the subject detection processing by using the image data selected through the data selection processing. The control unit 34 (object detection unit 34*a*) is able to detect a subject present within the search range 190 by combining the subject area detected based upon the image data obtained under the first image-capturing conditions and the subject area detected based upon the image data obtained under the second image-capturing conditions at their boundary.

(b) When the first image-capturing conditions and the second image-capturing conditions are different from each other only in the frame rate, as in (example 3) explained earlier in reference to the focus detection processing In this case, the control unit 34 (object detection unit 34*a*) engages each selection unit 322 (first selection unit 151) corresponding to a block 111*a*, to which a pixel with the first image-capturing conditions applied thereto belongs, so as to select the image data obtained under the first image-capturing conditions to be used in the subject detection processing, among the sets of image data available in the search range 190. The control unit 34 (object detection unit 34*a*) then executes the subject detection processing by using the image data selected through the data selection processing. In addition, the control unit 34 (object detection unit 34*a*) engages each selection unit 322 (second selection unit 152) corresponding to a block 111*a*, to which a pixel with the second image-capturing conditions applied thereto belongs, so as to select only image data expressing frame images that have been obtained with timing close to the timing with which frame images have been obtained under the first image-capturing conditions (30 fps), among the sets of image data available in the search range 190, as the image data corresponding to the second image-capturing conditions (60 fps) to be used in the subject detection processing. The control unit 34 (object detection unit 34*a*) then executes the subject detection processing by using the image data having been selected through the data selection processing. The control unit 34 (object detection unit 34*a*) is able to detect a subject present within the search range 190 by combining the subject area detected based upon the image data obtained under the first image-capturing conditions and the subject area detected based upon the image data obtained under the second image-capturing conditions at their boundary.

It is to be noted that if the search range 190 is split over the first area and the second area with the first area assuming a greater areal size than the second area, only the image data obtained under the first image-capturing conditions may be selected without selecting any image data obtained under the second image-capturing conditions. If, on the other hand, the second area assumes a greater areal size than the first area, only the image data obtained under the second image-capturing conditions may be selected without selecting any image data obtained under the first image-capturing conditions.

4. When Setting Image-Capturing Conditions

Data selection processing executed when exposure conditions are determined by re-executing photometering operation with the imaging field divided into a plurality of areas with different image-capturing conditions set for different areas will be explained.

4-1. When the image data available within a photometering range do not include both image data obtained under the first image-capturing conditions and image data obtained under the second image-capturing conditions In this case, the selection units 322 select the image data from all the pixels present in the photometering range and output the selected data to the generation unit 323. The control unit 34 (setting unit 34*b*) executes exposure calculation processing by using the image data obtained at the pixels within the photometering range.

Figure 25:
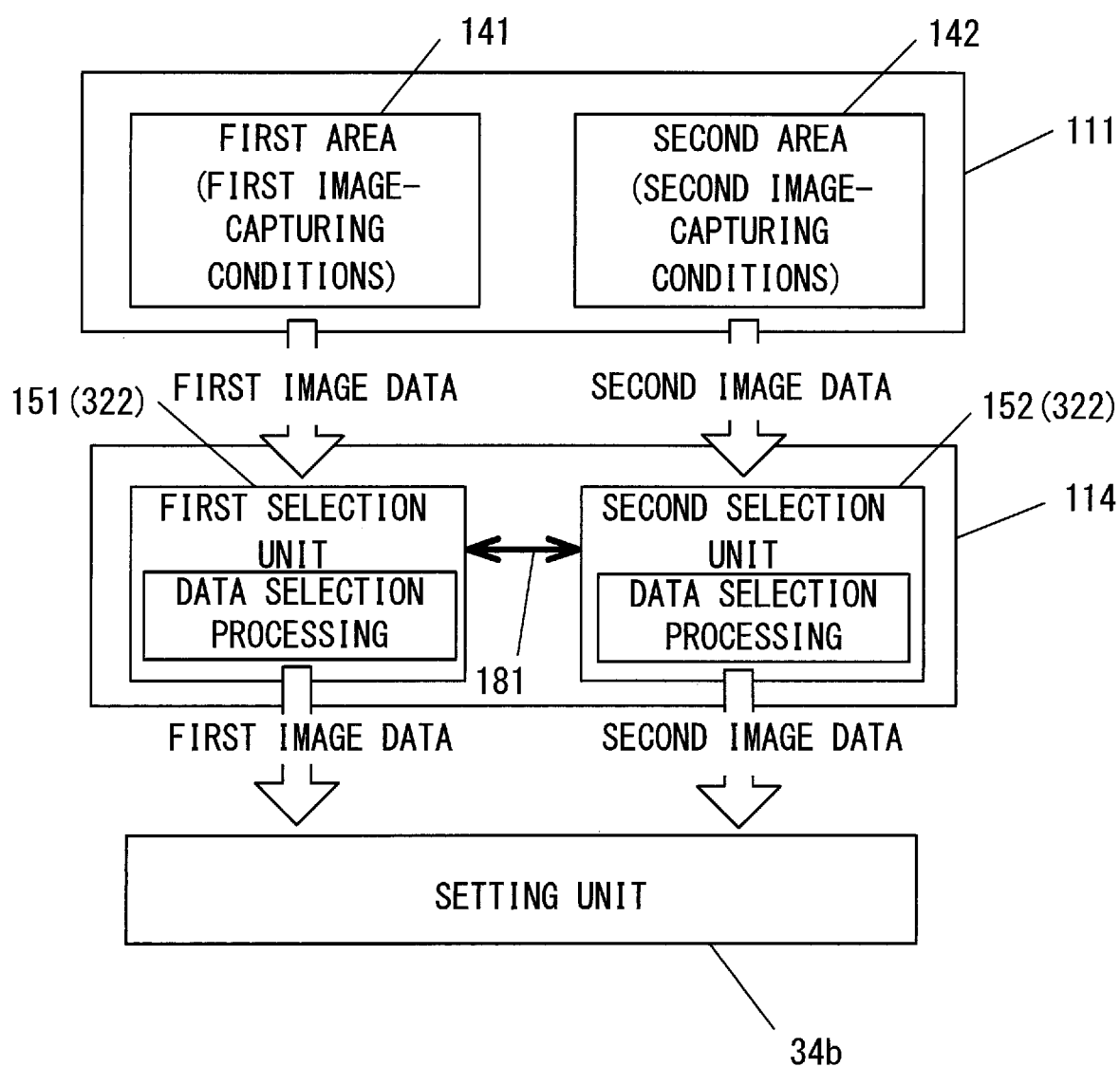

4-2. When the image data available within the photometering range include both image data obtained under the first image-capturing conditions and image data obtained under the second image-capturing conditions (a) When the first image-capturing conditions and the second image-capturing conditions differ from each other only in the ISO sensitivity or in the shutter speed, as in (example 1) or (example 2) described earlier in reference to the focus detection processing Under these circumstances, the control unit 34 (object detection unit 34*a*) engages each selection unit 322 (first selection unit 151) corresponding to a block 111*a*, to which a pixel with the first image-capturing conditions applied thereto belongs, so as to select the image data obtained under the first image-capturing conditions to be used in the subject detection processing, among the sets of image data available in the photometering range, as illustrated in FIG. 25 in a manner similar to that described in (a) pertaining to the subject detection processing. The control unit 34 (object detection unit 34*a*) also engages each selection unit 322 corresponding to a block 111*a* to which a pixel with the second image-capturing conditions applied thereto belongs, so as to select the image data obtained under the second image-capturing conditions to be used in the exposure calculation processing, among the sets of image data available in the photometering range. It is to be noted that FIG. 25 presents a schematic diagram illustrating how the first image data and the second image data are processed when setting image-capturing conditions through exposure calculation processing or the like.

The control unit 34 (setting unit 34*b*) then executes exposure calculation processing individually for the area with the first image-capturing conditions applied thereto and the area with the second image-capturing conditions applied thereto by using the image data selected through the data selection processing. Namely, the control unit 34 (setting unit 34*b*) executes data selection processing so as to photometer the individual areas and executes exposure calculation processing by using the image data selected through the data selection processing if a plurality of areas with different image-capturing conditions applied thereto are present within the photometering range.

(b) When the first image-capturing conditions and the second image-capturing conditions are different from each other only in the frame rate, as in (example 3) explained earlier in reference to the focus detection processing In this case, the control unit 34 (object detection unit 34*a*) engages each selection unit 322 corresponding to a block 111*a*, to which a pixel with the first image-capturing conditions applied thereto belongs, so as to select the image data obtained under the first image-capturing conditions to be used in the exposure calculation processing, among the sets of image data available in the photometering range, as has been described in (b) in relation to the subject detection processing. In addition, the control unit 34 (object detection unit 34*a*) engages each selection unit 322 corresponding to a block 111*a* to which a pixel with the second image-capturing conditions applied thereto belongs, so as to select only image data expressing frame images that have been obtained with timing close to the timing with which frame images have been obtained under the first image-capturing conditions (30 fps), among the sets of image data available in the photometering range, as the image data corresponding to the second image-capturing conditions (60 fps) to be used in the exposure calculation processing, as in (example 3) explained in relation to the focus detection processing.

The control unit 34 (setting unit 34*b*) then executes the exposure calculation processing by using the image data selected through the data selection processing as in (a) above.

It is to be noted that if the photometering range is split over the first area and the second area with the first area assuming a greater areal size than the second area, only the image data obtained under the first image-capturing conditions may be selected without selecting any image data obtained under the second image-capturing conditions. If, on the other hand, the second area assumes a greater areal size than the first area, only the image data obtained under the second image-capturing conditions may be selected without selecting any image data obtained under the first image-capturing conditions.

The following advantages and operations are achieved through the third embodiment described above.

(1) The camera 1C includes an image sensor 32*a* capable of capturing images under image-capturing conditions set from one unit block to another defined at the image-capturing surface thereof, which generates first image data from a first area made up with at least one unit block by capturing an image under first image-capturing conditions, and second image data from a second area made up with at least one unit block by capturing an image under second image-capturing conditions different from the first image-capturing conditions. The camera 1C includes a plurality of selection units 322, each disposed in correspondence to one of the unit blocks or in correspondence to a combined block made up with a plurality of unit blocks. The plurality of selection units 322 each either select or do not select the image data from the corresponding unit block or from the unit blocks making up the corresponding combined block. The image sensor 32*a* is disposed at a back-side illumination image-capturing chip 111. The plurality of selection units 322 are disposed at an image-capturing chip 114.

These structural features make it possible to concurrently execute data selection processing to select image data at the plurality of selection units 322 and, as a result, the processing onus on the individual selection units 322 is reduced.

(2) The back-side illumination image-capturing chip 111 and the image processing chip 114 are stacked one upon the other. This means that the image sensor 32*a* and the image processing unit 32*c* can achieve connection with ease.

(3) The camera 1C includes a generation unit 323 that generates an image by using the selected image data, having been selected via the selection units 322. Since the preliminary processing can be executed by the plurality of selection units 322 through concurrent processing, the length of time required for image generation can be reduced.

(4) The camera 1C includes an image sensor 32*a* capable of capturing images under different image-capturing conditions set from one unit block to another defined at the image-capturing surface thereof, which generates first image data from a first area made up with at least one unit block by capturing an optical image formed with light having entered therein via an image-capturing optical system, under first image-capturing conditions, and second image data from a second area made up with at least one unit block by capturing an optical image formed with light having entered therein under second image-capturing conditions different from the first image-capturing conditions. The camera 1C includes a plurality of selection units 322, each disposed in correspondence to one of the unit blocks or in correspondence to a combined block made up with a plurality of unit blocks. The plurality of selection units 322 each either select or do not select the image data from the corresponding unit block or from the unit blocks making up the corresponding combined block. The camera 1C also includes an AF operation unit 34*d* that detects information used to drive the image-capturing optical system based upon the image data having been selected. The image sensor 32*a* is disposed at a back-side illumination image-capturing chip 111. The plurality of correction units 322 are disposed at an image-capturing chip 114.

These structural features make it possible to concurrently execute data selection processing to select image data at the plurality of selection units 322 and, as a result, the processing onus on the individual selection units 322 is reduced. Furthermore, since the preliminary processing can be executed quickly by the plurality of selection units 322 through parallel processing, the length of time to elapse before the AF operation unit 34*d* can start executing the focus detection processing is reduced, thereby making it possible to speed up the focus detection processing.

(5) The camera 1C includes an image sensor 32a capable of capturing images under different image-capturing conditions set from one unit block to another defined at the image-capturing surface thereof, which generates first image data from a first area made up with at least one unit block by capturing a subject image formed with light having entered therein via an image-capturing optical system, under first image-capturing conditions, and second image data from a second area made up with at least one unit block by capturing a subject image formed with light having entered therein under second image-capturing conditions different from the first image-capturing conditions. The camera 1C includes a plurality of selection units 322, each disposed in correspondence to one of the unit blocks or in correspondence to a combined block made up with a plurality of unit blocks. The plurality of selection units 322 each either select or do not select the image data from the corresponding unit block or from the unit blocks making up the corresponding combined block. The camera 1C also includes an object detection unit 34a that detects a target object in the subject image based upon the selected image data having been selected. The image sensor 32a is disposed at a back-side illumination image-capturing chip 111. The plurality of correction units 322 are disposed at an image-capturing chip 114.

These structural features make it possible to concurrently execute data selection processing to select image data at the plurality of selection units 322 and, as a result, the processing onus on the individual selection units 322 is reduced. Furthermore, since the preliminary processing can be executed quickly by the plurality of selection units 322 through parallel processing, the length of time to elapse before the object detection unit 34a can start executing subject detection processing is reduced, thereby making it possible to speed up the subject detection processing.

(6) The camera 1C includes an image sensor 32a capable of capturing images under different image-capturing conditions set from one unit block to another defined at the image-capturing surface thereof, which generates first image data from a first area made up with at least one unit block by capturing an optical image, formed with light having entered therein via an image-capturing optical system, under first image-capturing conditions, and second image data from a second area made up with at least one unit block by capturing an image formed with light having entered therein under second image-capturing conditions different from the first image-capturing conditions. The camera 1C includes a plurality of selection units 322, each disposed in correspondence to one of the unit blocks or in correspondence to a combined block made up with a plurality of unit blocks. The plurality of selection units 322 each either select or do not select the image data from the corresponding unit block or from the unit blocks making up the corresponding combined block. The camera 1C also includes a setting unit 34b that sets photographing conditions based upon the selected image data having been selected. The image sensor 32a is disposed at a back-side illumination image-capturing chip 111. The plurality of correction units 322 are disposed at an image-capturing chip 114.

These structural features make it possible to concurrently execute data selection processing to select image data at the plurality of selection units 322 and, as a result, the processing onus on the individual selection units 322 is reduced. Furthermore, since the preliminary processing can be executed quickly by the plurality of selection units 322 through parallel processing, the length of time to elapse before the AF setting unit 34b can start executing image-capturing condition setting processing is reduced, thereby making it possible to speed up the image-capturing condition setting processing.

Variations of the Third Embodiment

The following variations are also within the scope of the present invention, and one of the variations or a plurality of variations may be adopted in combination with the embodiment described above.

(Variation 10) An explanation will be given on how first image data and second image data are processed with the first area and the second area set at the image-capturing surface of the image sensor 32a, as shown in FIG. 16(a) through FIG. 16(c) in reference to which Variation 1 of the first and second embodiments have been described.

In this variation, too, pixel signals read out from the image sensor 32a having captured an image for one frame are used to generate a first image based upon image signals read out from the first area and a second image based upon image signals read out from the second area, as in Variation 1, in each of the examples presented in FIG. 16(a) through FIG. 16(c). In this variation, the control unit 34 uses the first image as a display image and uses the second image for purposes of detection, as in Variation 1.

It is assumed that first image-capturing conditions are set for the first area where the first image is captured and that second image-capturing conditions different from the first image-capturing conditions are set for the second area where the second image is captured.

Figure 26:
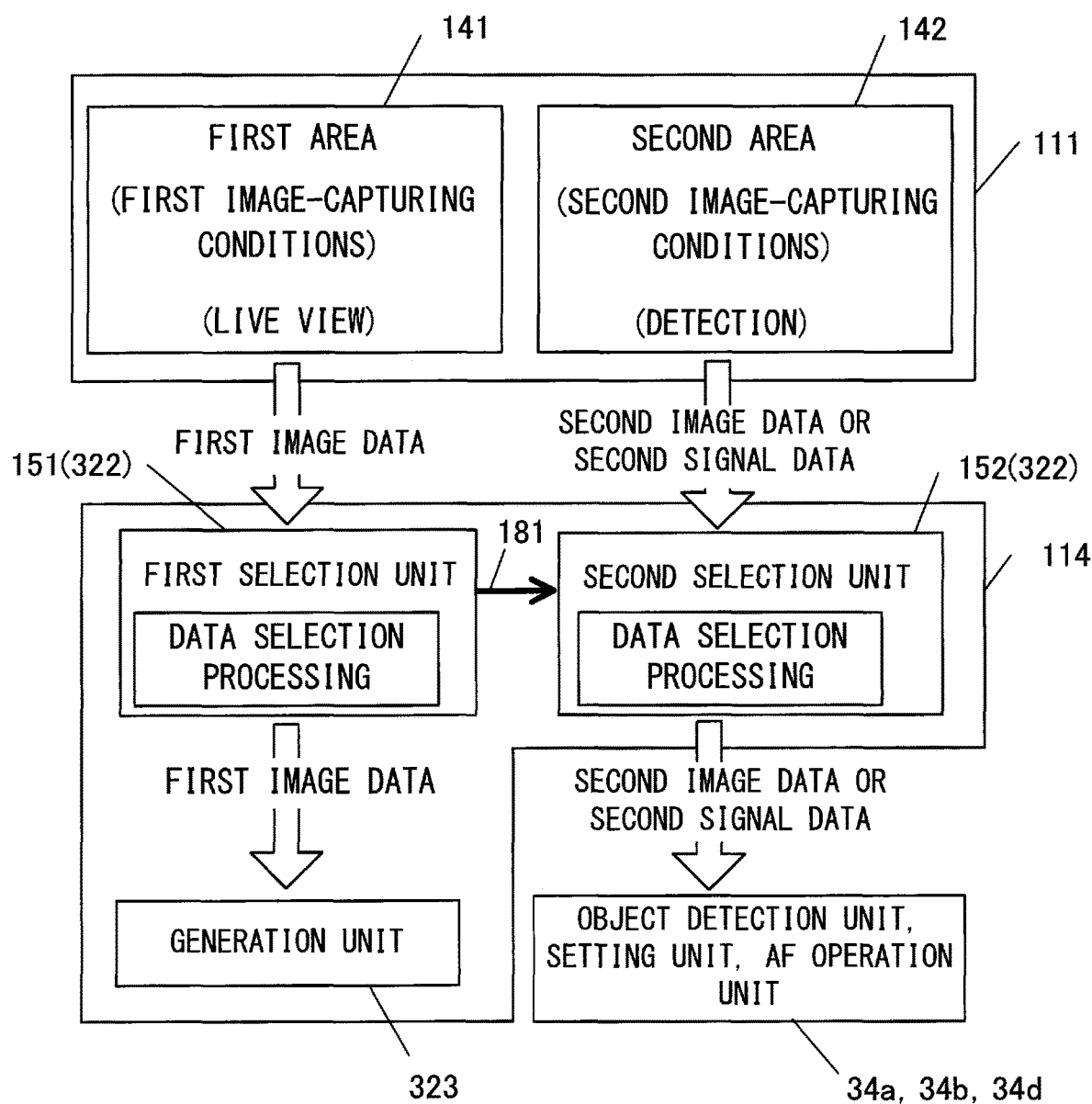

1. An example in which the first image-capturing conditions are uniform over the entire first area at the image-capturing surface and the second image-capturing conditions, too, are uniform over the entire second area at the image-capturing surface, will be explained in reference to FIG. 26. FIG. 26 presents a schematic diagram illustrating how first image data and second image data are processed.

First image data obtained by capturing an image under the first image-capturing conditions are output from each of the pixels present in the first area 141, whereas second image data and second signal data obtained by capturing an image under the second image-capturing conditions are output from each of the pixels present in the second area 142. The first image data from the first area 141 are output to the first selection unit 151. Likewise, the second image data and the second signal data from the second area 142 are output to the second selection unit 152.

In this example, uniform first image-capturing conditions are set for the entire first area at the image-capturing surface and accordingly, the first selection unit 151 selects the first image data from all the pixels present in the first area. In addition, since uniform second image-capturing conditions are set for the entire second area at the image-capturing surface, the second selection unit 152 selects the second image data from all the pixels present in the second area. It is to be noted that since the first image-capturing conditions and the second image-capturing conditions are different from each other, the second selection unit 152 does not select the second image data as data to be used in the image processing executed for the image data in the first area.

In addition, the second selection unit 152 receives the information 181 pertaining to the first image-capturing conditions from, for instance, the first selection unit 151.

The generation unit 323 executes image processing such as defective pixel correction processing, color interpolation processing, edge enhancement processing and noise reduction processing based upon the first image data provided via the first selection unit 151 and outputs image data having undergone the image processing.

The object detection unit 34*a* executes processing so as to detect subject elements based upon the second image data provided via the second selection unit 152 and outputs the detection results.

The setting unit 34*b* executes image-capturing condition calculation processing such as exposure calculation processing based upon the second image data provided via the second selection unit 152. Then, based upon the calculation results, it divides the image-capturing surface at the image-capturing unit 32 into a plurality of areas containing detected subject elements and resets image-capturing conditions for the plurality of areas.

The AF operation unit 34*d* executes focus detection processing based upon the second signal data provided via the second selection unit 152 and outputs a drive signal, generated based upon the arithmetic operation results, to be used to drive the focus lens in the image-capturing optical system 31 to the in-focus position.

Figure 27:
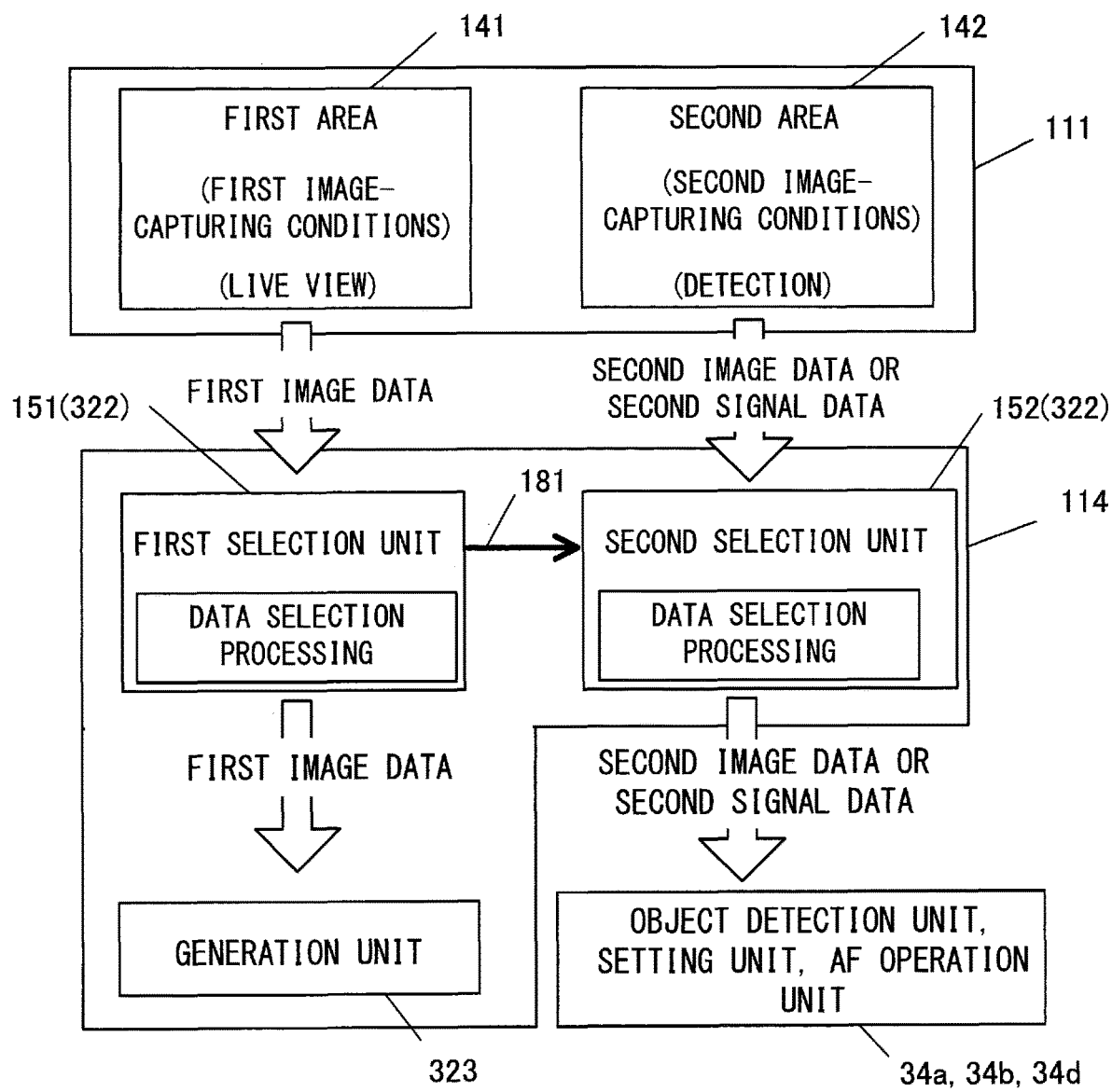
FIG. 27 A schematic illustration showing how the first image data and the second image data are processed in Variation 10

2. Another example in which the first image-capturing conditions are altered depending upon the location at the image-capturing surface, i.e., different first image-capturing conditions are set from one areal portion to another within the first area, and uniform second image-capturing conditions are set for the entire second area at the image-capturing surface, will be explained in reference to FIG. 27. FIG. 27 presents a schematic diagram illustrating how first image data, second image data and second signal data are processed.

First image data obtained by capturing an image under the first image-capturing conditions are output from each of the pixels present in the first area 141, whereas second image data or second signal data obtained by capturing an image under the second image-capturing conditions are output from each of the pixels present in the second area 142. The first image data from the first area 141 are output to the first selection unit 151. Likewise, the second image data from the second area are output to the second selection unit 152.

As described earlier, the first image-capturing conditions are altered depending upon the location at the image-capturing surface in this example. In other words, different first image-capturing conditions are set for different areal portions within the first area. The first selection unit 151 selects only first image data obtained under specific image-capturing conditions, among the sets of first image data obtained at the individual pixels present in the first area but does not select first image data obtained under other image-capturing conditions. In addition, since uniform second image-capturing conditions are set for the entire second area at the image-capturing surface, the second selection unit 152 selects the second image data at all the pixels present in the second area. It is to be noted that since the first image-capturing conditions and the second image-capturing conditions are different from each other, the second selection unit 152 does not select the second image data as data to be used in the image processing executed for the image data in the first area.

In addition, the second selection unit 152 receives the information 181 pertaining to the first image-capturing conditions from, for instance, the first selection unit 151.

The generation unit 323 executes image processing such as defective pixel correction processing, color interpolation processing, edge enhancement processing and noise reduction processing based upon the part of the first image data having been selected via the first selection unit 151 and outputs image data having undergone the image processing.

The object detection unit 34*a* executes processing so as to detect subject elements based upon the second image data provided via the second selection unit 152 and outputs the detection results.

The setting unit 34*b* executes image-capturing condition calculation processing such as exposure calculation processing based upon the second image data provided via the second selection unit 152. Then, based upon the calculation results, it divides the image-capturing surface at the image-capturing unit 32 into a plurality of areas containing detected subject elements and resets image-capturing conditions for the plurality of areas.

The AF operation unit 34*d* executes focus detection processing based upon the second signal data, generated based upon the arithmetic operation results provided via the second selection unit 152 and outputs a drive signal to be used to drive the focus lens in the image-capturing optical system 31 to the in-focus position.

Figure 28:
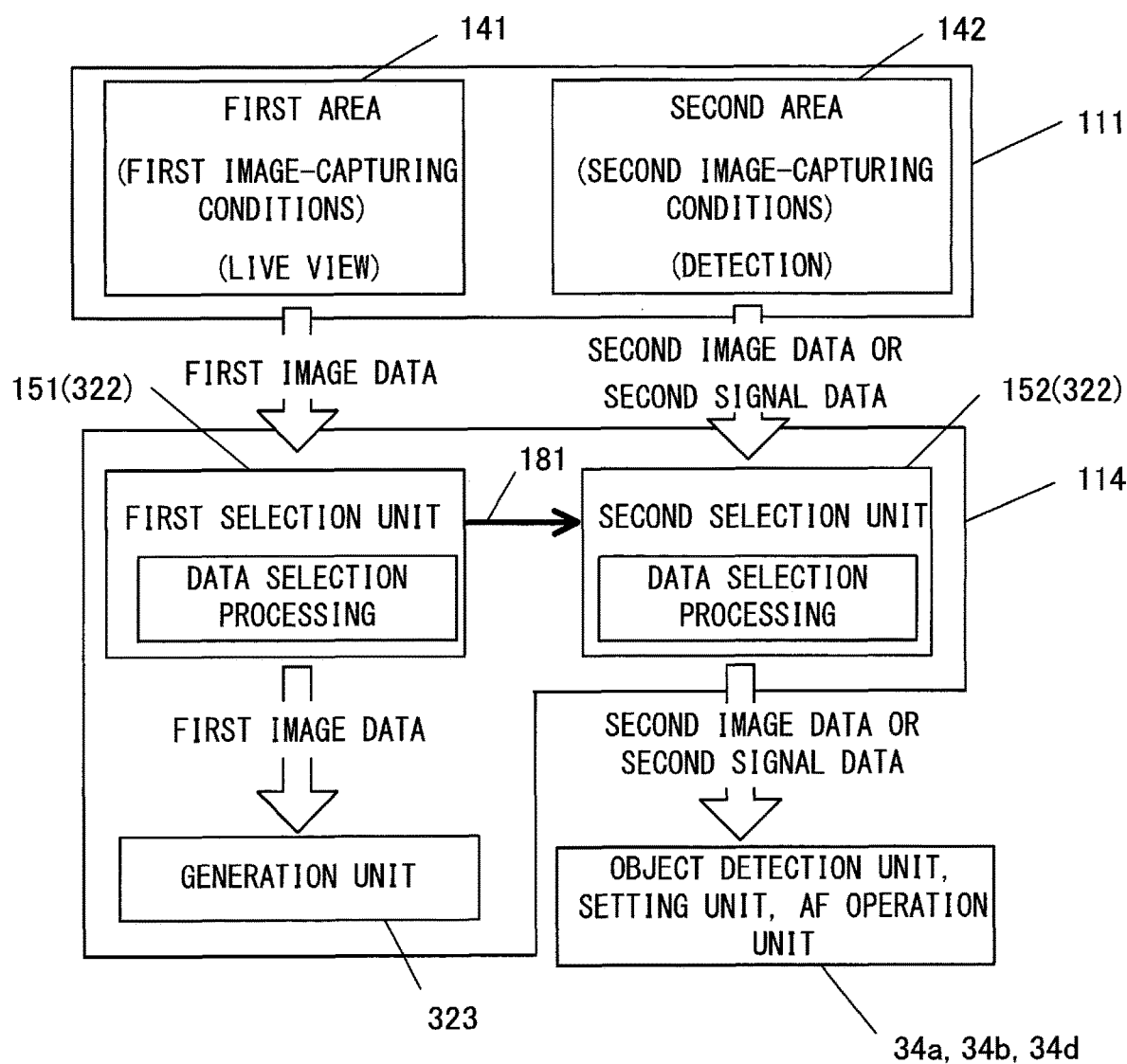
FIG. 28 A schematic illustration showing how the first image data and the second image data are processed in Variation 10

3. Yet another example in which uniform first image-capturing conditions are set for the first area at the image-capturing surface, but the second image-capturing conditions are altered depending upon the location at the image-capturing surface, i.e., different second image-capturing conditions are set for different areal portions within the second area, will be explained in reference to FIG. 28. FIG. 28 presents a schematic diagram illustrating how first image data, and second image data are processed.

First image data obtained by capturing an image under the first image-capturing conditions, uniformly set for the entire first area at the image-capturing surface, are output from each of the pixels present in the first area 141, whereas second image data obtained by capturing an image under the second image-capturing conditions, which are altered depending upon the location at the image-capturing surface, are output from each of the pixels present in the second area 142. The first image data from the first area 141 are output to the first selection unit 151. Likewise, the second image data and second signal data from the second area 142 are output to the second selection unit 152.

In the example, uniform first image-capturing conditions are set for the entire first area at the image-capturing surface and accordingly, the first selection unit 151 selects the first image data from all the pixels present in the first area. In addition, the second image-capturing conditions are altered depending upon the location at the image-capturing surface. In other words, different second image-capturing conditions are set from one areal portion to another within the second area. The second selection unit 152 selects only second image data generated under specific image-capturing conditions among the sets of second image data generated at the individual pixels present in the second area but does not select second image data generated under other image-capturing conditions. It is to be noted that since the first image-capturing conditions and the second image-capturing conditions are different from each other, the second selection unit 152 does not select the second image data as data to be used in the image processing executed for the image data in the first area.

In addition, the second selection unit 152 receives the information 181 pertaining to the first image-capturing conditions from, for instance, the first selection unit 151.

The generation unit 323 executes image processing such as defective pixel correction processing, color interpolation processing, edge enhancement processing and noise reduction processing based upon the first image data provided via the first selection unit 151 and outputs image data having undergone the image processing.

The object detection unit 34a executes processing so as to detect subject elements based upon the part of the second image data selected via the second selection unit 152, and outputs the detection results.

The setting unit 34b executes image-capturing condition calculation processing such as exposure calculation processing based upon the part of the second image data selected via the second selection unit 152. Then, based upon the calculation results, it divides the image-capturing surface at the image-capturing unit 32 into a plurality of areas containing detected subject elements and resets image-capturing conditions for the plurality of areas.

The AF operation unit 34d executes focus detection processing based upon the part of the second signal data selected via the second selection unit 152 and outputs a drive signal, generated based upon the arithmetic operation results, to be used to drive the focus lens in the image-capturing optical system 31 to the in-focus position.

Figure 29:
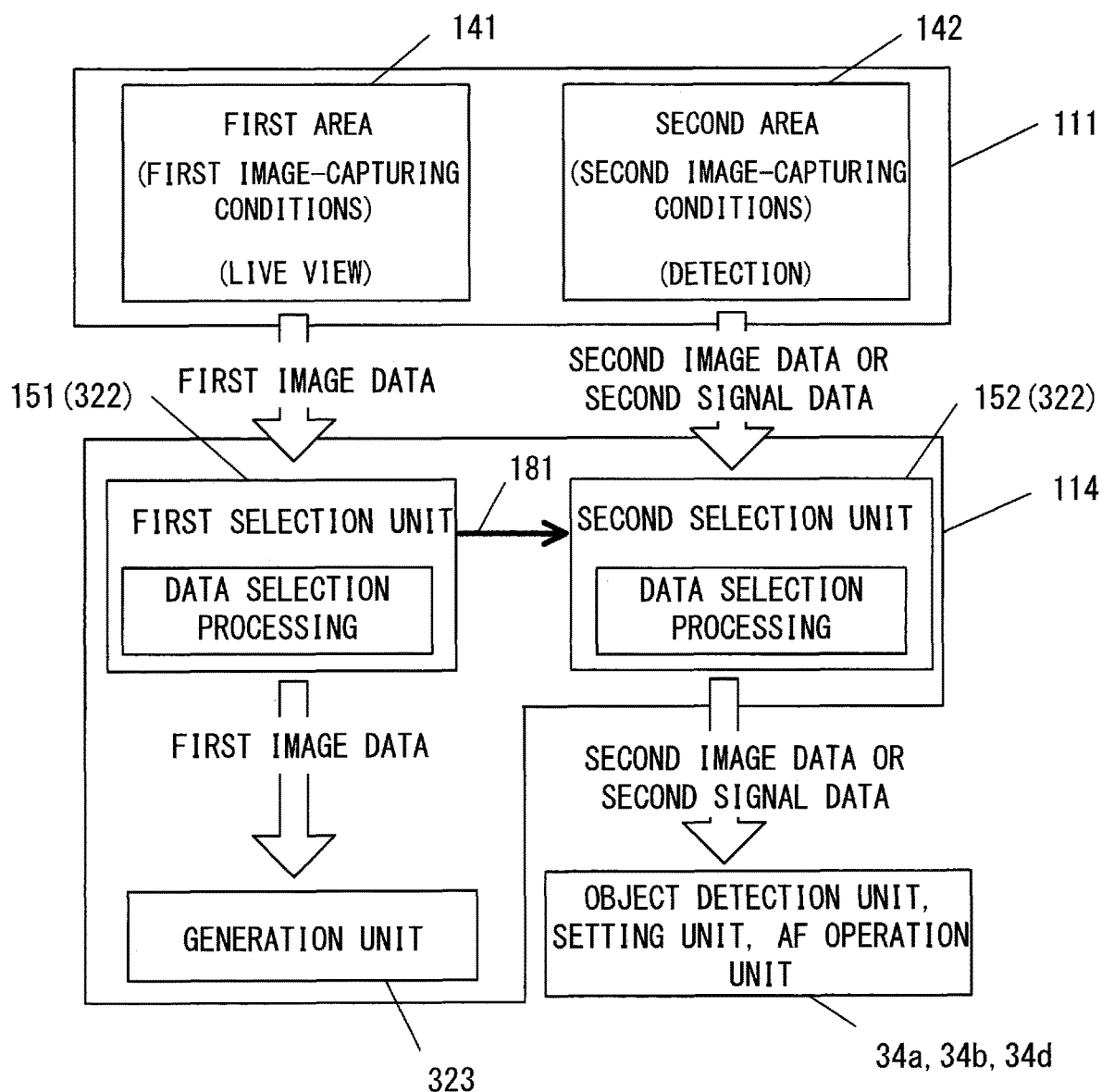
FIG. 29 A schematic illustration showing how the first image data and the second image data are processed in Variation 10

4. A further example in which the first image-capturing conditions are altered depending upon the location at the image-capturing surface and the second image-capturing conditions are also altered depending upon the location at the image-capturing surface, will be explained in reference to FIG. 29. FIG. 29 presents a schematic diagram illustrating how first image data, second image data and second signal data are processed.

First image data obtained by capturing an image under the first image-capturing conditions, which are altered depending upon the location at the image-capturing surface, are output from each pixel present in the first area 141 and second image data or second signal data, obtained by capturing an image under the second image-capturing conditions, which are altered depending upon the location at the image-capturing surface, are output from each pixel present in the second area 142. The first image data from the first area 141 are output to the first selection unit 151. Likewise, the second image data and the second signal data from the second area 142 are output to the second selection unit 152.

As described earlier, the first image-capturing conditions are altered depending upon the location at the image-capturing surface in this example. In other words, different first image-capturing conditions are set for different areal portions within the second area. The first selection unit 151 selects only first image data obtained under specific image-capturing conditions, among the sets of first image data obtained at the individual pixels present in the first area but does not select first image data obtained under other image-capturing conditions. In addition, the second image-capturing conditions are altered depending upon the location at the image-capturing surface. In other words, different second image-capturing conditions are set for different areal portions within the second area. The second selection unit 152 selects only second image data obtained under specific image-capturing conditions, among the sets of second image data obtained at the individual pixels present in the second area but does not select second image data obtained under other image-capturing conditions. It is to be noted that since the first image-capturing conditions and the second image-capturing conditions are different from each other, the second selection unit 152 does not select the second image data as data to be used in the image processing executed for the image data in the first area.

In addition, the second selection unit 152 receives the information 181 pertaining to the first image-capturing conditions from, for instance, the first selection unit 151.

The generation unit 323 executes image processing such as defective pixel correction processing, color interpolation processing, edge enhancement processing and noise reduction processing based upon the part of the first image data selected via the first selection unit 151, and outputs image data having undergone the image processing.

The object detection unit 34a executes processing so as to detect subject elements based upon the part of the second image data selected via the second selection unit 152 and outputs the detection results.

The setting unit 34b executes image-capturing condition calculation processing such as exposure calculation processing based upon the part of the second image data selected via the second selection unit 152. Then, based upon the calculation results, it divides the image-capturing surface at the image-capturing unit 32 into a plurality of areas containing detected subject elements and resets image-capturing conditions for the plurality of areas.

The AF operation unit 34d executes focus detection processing based upon the part of the second signal data selected via the second selection unit 152 and outputs a drive signal, generated based upon the arithmetic operation results, to be used to drive the focus lens in the image-capturing optical system 31 to the in-focus position.

(Variation 11)

In the third embodiment described above, one selection unit 322 corresponds to a single block 111a (unit block). However, the selection units 322 may be each disposed in correspondence to a combined block made up with a plurality of blocks 111a (unit blocks). In such a case, each selection unit 322 sequentially executes data selection processing for sets of image data output from the pixels belonging to the plurality of blocks 111a included in the corresponding combined block. Even though the plurality of selection units 322 are each provided in correspondence to a combined block made up with a plurality of blocks 111a, the plurality of selection units 322 can be engaged in parallel image data selection processing, which makes it possible to reduce the processing onus on the individual selection units 322 and generate an optimal image in a shorter period of time by using image data individually generated in areas with different image-capturing conditions applied thereto.

(Variation 12)

The generation unit 323 in the third embodiment described above is disposed within the image-capturing unit 32A. As an alternative, the generation unit 323 may be disposed outside the image-capturing unit 32A. The configuration with an external generation unit 323 disposed outside the image-capturing unit 32A, too, achieves advantages and operations similar to the advantages and operations described earlier.

(Variation 13)

The stacked image sensor 100A in the third embodiment described above further includes an image processing chip 114 engaged in the preliminary processing and image processing explained earlier, in addition to the back-side illumination image-capturing chip 111, the signal processing chip 112 and the memory chip 113. However, the present invention may be adopted in a configuration with an image processing unit 32c disposed at the signal processing chip 112 in place of the image processing chip 114 included in the stacked image sensor 100A.

It is to be noted that the various embodiments and variations thereof may be adopted in any combination.

While various embodiments and variations thereof have been described above, the present invention is in no way limited to the particulars of these examples. Any mode conceivable within the scope of the technical teachings of the present invention is also within the scope of the present invention.

The devices described below are also part of the embodiments and variations thereof explained earlier.

(1) An image-capturing device comprising an image sensor that includes an image-capturing area where an image of a subject is captured, a setting unit that sets image-capturing conditions to be applied to the image-capturing area, a selection unit that selects pixels to be used for interpolation among pixels present in the image-capturing area and a generation unit that generates an image of the subject captured in the image-capturing area with signals generated through interpolation executed by using signals output from the pixels selected by the selection unit. In this image-capturing device, the selection unit makes a change in the selection of at least some of the pixels to be selected depending upon the image-capturing conditions set by the setting unit.

(2) An image-capturing device such as that described in (1), in which the image sensor includes a first image-capturing area where an image of a subject is captured and a second image-capturing area where an image of the subject is captured, the setting unit sets image-capturing conditions for the first image-capturing area and image-capturing conditions for the second image-capturing area, the selection unit makes a change in the selection of at least some of the pixels to be selected for purposes of interpolation executed for a pixel present in the first image-capturing area, among pixels present in the first image-capturing area and pixels present in the second image-capturing area, depending upon the image-capturing conditions set for the second image-capturing area by the setting unit, and the generation unit generates an image of the subject captured in the first image-capturing area with signals generated through interpolation by using signals output from the pixels selected by the selection unit.

(3) An image-capturing device such as that described in (2), in which the selection unit makes a change in the selection of at least some of the pixels to be selected for purposes of interpolation executed for a pixel present in the first image-capturing area depending upon the image-capturing conditions set for the first image-capturing area and the image-capturing conditions set for the second image-capturing area by the setting unit.

(4) An image-capturing device such as that described in (2) or (3), in which the selection unit selects pixels to be used for the interpolation from at least either the first image-capturing area or the second image-capturing area.

(5) An image-capturing device such as that described in (4), in which the selection unit selects a pixel present in the second image-capturing area as a pixel to be used for the interpolation based upon the image-capturing conditions set for the second image-capturing area by the setting unit.

(6) An image-capturing device such as that described in any of (2) through (5), in which if first image-capturing conditions are set for the first image-capturing area and the second image-capturing area by the setting unit, the selection unit selects a pixel present in the second image-capturing area.

(7) An image-capturing device such as that described in (6), in which the selection unit selects a pixel present in the second image-capturing area as a pixel to be used for the interpolation based upon a value pertaining to exposure included in the image-capturing conditions set for the second image-capturing area by the setting unit.

(8) An image-capturing device such as that described in (7), in which the selection unit selects a pixel present in the second image-capturing area as a pixel to be used for the interpolation based upon a value pertaining to exposure included in the image-capturing conditions set for the first image-capturing area by the setting unit, and a value pertaining to exposure included in the image-capturing conditions set for the second image-capturing area by the setting unit.

(9) An image-capturing device such as that described in (8), in which the selection unit selects a pixel present in the second image-capturing area as a pixel to be used for the interpolation if a difference between an exposure value included in the image-capturing conditions set for the first image-capturing area by the setting unit and an exposure value included in the image-capturing conditions set for the second image-capturing area by the setting unit is equal to or less than 0.3.

(10) An image-capturing device such as that described in any of (2) through (9), in which the selection unit selects pixels present in the first image-capturing area if the setting unit sets first image-capturing conditions for the first image-capturing area and second image-capturing conditions for the second image-capturing area.

(11) An image-capturing device such as that described in (10), in which the selection unit selects pixels present in the first image-capturing area without selecting any pixel present in the second image-capturing area if the setting unit sets first image-capturing conditions for the first image-capturing area and second image-capturing conditions for the second image-capturing area.

(12) An image-capturing device such as that described in any of (2) through (11), in which the selection unit selects as a pixel to be used for interpolation executed for a first pixel present in the first image-capturing area, a third pixel present in the first image-capturing area set apart from the first pixel by a distance greater than a distance setting apart the first pixel from a second pixel present in the second image-capturing area.

(13) An image-capturing device such as that described in any of (2) through (12), in which the selection unit selects a varying number of pixels depending upon the image-capturing conditions set for the second image-capturing area by the setting unit.

(14) An image-capturing device such as that described in (13), in which the selection unit selects a smaller number of pixels if the setting unit sets first image-capturing conditions for the first image-capturing area and second image-capturing conditions for the second image-capturing area, compared to the number of pixels selected when the first image-capturing conditions are set for the first image-capturing area and the second image-capturing area.

(15) An image-capturing device comprising an image sensor that includes a first image-capturing area set so as to capture an image of a subject under first image-capturing conditions, a second image-capturing area set so as to capture an image of the subject under second image-capturing conditions different from the first image-capturing conditions and a third image-capturing area set so as to capture an image of the subject under third image-capturing conditions different from the second image-capturing conditions, a selection unit that selects pixels to be used for purposes of interpolation executed for a pixel present in the first image-capturing area among pixels present in the second image-capturing area and pixels present in the third image-capturing area, and a generation unit that generates an image of the subject captured in the first image-capturing area with signals generated through interpolation executed by using signals output from the pixels selected by the selection unit.

(16) An image-capturing device comprising an image sensor that includes a first image-capturing area set so as to capture an image of a subject under first image-capturing conditions and a second image-capturing area set so as to capture an image of the subject under second image-capturing conditions different from the first image-capturing conditions, a selection unit that selects pixels to be used for purposes of interpolation executed for a pixel present in the first image-capturing area among pixels present in the first image-capturing area and pixels present in the second image-capturing area, and a generation unit that generates an image of the subject captured in the first image-capturing area with signals generated through interpolation executed by using signals output from the pixels selected by the selection unit.

(17) An image-capturing device comprising an image sensor that includes a first image-capturing area where an image of a subject is captured, a second image-capturing area where an image of the subject is captured and a third image-capturing area where an image of the subject is captured, a setting unit that sets first image-capturing conditions as image-capturing conditions for the first image-capturing area, sets second image-capturing conditions, different from the first image-capturing conditions, as image-capturing conditions for the second image-capturing area and sets third image-capturing conditions, different from the first image-capturing conditions by an extent smaller than an extent of the difference between the first image-capturing conditions and the second image-capturing conditions, as image-capturing conditions for the third image-capturing area, a selection unit that selects pixels to be used for purposes of interpolation executed for a pixel present in the first image-capturing area among pixels present in the first image-capturing area, pixels present in the second image-capturing area and pixels present in the third image-capturing area, and a generation unit that generates an image of the subject captured in the first image-capturing area with signals generated through interpolation executed by using signals output from the pixels selected by the selection unit.

(18) An image-capturing device comprising an image sensor that includes a first image-capturing area where an image of a subject is captured, a second image-capturing area where an image of the subject is captured and a third image-capturing area where an image of the subject is captured, set apart from the first image-capturing area by a distance greater than the distance between the first image-capturing area and the second image-capturing area, a setting unit that sets image-capturing conditions different from the image-capturing conditions selected for the first image-capturing area, as image-capturing conditions for the second image-capturing area, a selection unit that selects pixels to be used for purposes of interpolation executed for a pixel present in the first image-capturing area from pixels present in the first image-capturing area, pixels present in the second image-capturing area and pixels present in the third image-capturing area, and a generation unit that generates an image of the subject captured in the first image-capturing area with signals generated through interpolation executed by using signals output from the pixels selected by the selection unit.

(19) An image-capturing device comprising an image sensor that includes an image-capturing area where an image of a subject is captured, a setting unit that sets image-capturing conditions to be applied to the image-capturing area, and a generation unit that generates an image of a subject captured in the image-capturing area with signals generated through interpolation executed by using signals output from pixels selected as pixels to be used for purposes of interpolation, and present in the image-capturing area. In this image-capturing device, a change is made in the selection of at least some of the pixels to be selected depending upon the image-capturing conditions set by the setting unit.

(20) An image-capturing device comprising an image sensor that includes a first image-capturing area set so as to capture an image of a subject under first image-capturing conditions and a second image-capturing area set so as to capture an image of the subject under second image-capturing conditions different from the first image-capturing conditions, and a generation unit that generates an image of the subject captured in the first image-capturing area with signals generated through interpolation executed by using signals output from pixels selected as pixels to be used for purposes of interpolation executed for a pixel present in the first image-capturing area among pixels present in the first image-capturing area and pixels present in the second image-capturing area.

(21) An image-capturing device comprising an image sensor that includes an image-capturing area where an image of a subject is captured, a setting unit that sets image-capturing conditions to be applied to the image-capturing area and a generation unit that generates an image of the subject captured in the image-capturing area with signals generated through noise reduction executed by using signals output from pixels that output noise reduction signals, selected from pixels present in the image-capturing area. In the image-capturing device, a change is made in the selection of at least some of the pixels to be selected depending upon the image-capturing conditions set by the setting unit.

(22) An image-capturing device comprising an image sensor that includes a first image-capturing area set so as to capture an image of a subject under first image-capturing conditions, a second image-capturing area set so as to capture an image of the subject under second image-capturing conditions different from the first image-capturing conditions and a third image-capturing area set so as to capture an image of the subject under third image-capturing conditions different from the second image-capturing conditions, a selection unit that selects pixels to be used to reduce noise for a pixel present in the first image-capturing area among pixels present in the second image-capturing area and pixels present in the third image-capturing area, and a generation unit that generates an image of the subject captured in the first image-capturing area with signals having undergone noise reduction executed by using signals output from the pixels selected from the pixels present in the second image-capturing area and the pixels present in the third image-capturing area as pixels to output signals to be used to reduce noise in a signal at a pixel present in the first image-capturing area.

(23) An image-capturing device comprising an image sensor that includes a first image-capturing area set so as to capture an image of a subject under first image-capturing conditions and a second image-capturing area set so as to capture an image of the subject under second image-capturing conditions different from the first image-capturing conditions and a generation unit that generates an image of the subject captured in the first image-capturing area with signals generated through interpolation executed by using signals output from pixels selected from pixels present in the first image-capturing area and pixels present in the second image-capturing area, as pixels to output signals to be used to reduce noise for a pixel present in the first image-capturing area.

(24) An image-capturing device comprising an image sensor that includes an image-capturing area where an image of a subject is captured, a setting unit that sets image-capturing conditions to be applied to the image-capturing area, and a generation unit that generates an image of the subject captured in the image-capturing area with signals having undergone image processing executed by using signals output from pixels selected as pixels to be used in image processing. In this image-capturing device, a change is made in the selection of at least some of the pixels to be selected depending upon the image-capturing conditions set by the setting unit.

(25) An image processing device comprising a selection unit that selects signals to be used for purposes of interpolation, among signals output from pixels present in an image-capturing area of an image sensor, and a generation unit that generates an image of a subject captured in the image-capturing area with signals generated through interpolation executed by using the signals selected by the selection unit. The selection unit in the image processing device makes a change in selection of at least some of the pixels to be selected depending upon the image-capturing conditions set for the image-capturing area.

(26) An image processing device comprising a selection unit that selects signals to be used for noise reduction, from signals output from pixels present in an image-capturing area of an image sensor, and a generation unit that generates an image of a subject captured in the image-capturing area with signals having undergone noise reduction executed by using the signals selected by the selection unit. The selection unit in the image processing device makes a change in selection of at least some of the pixels to be selected depending upon the image-capturing conditions set for the image-capturing area.

(27) An image processing device comprising a selection unit that selects signals to be used for purposes of interpolation, among signals output from pixels present in an image-capturing area of an image sensor, and a display unit that brings up on display an image of a subject captured in the image-capturing area, generated with signals generated through interpolation executed by using the signals selected by the selection unit. The selection unit in the image processing device makes a change in selection of at least some of the pixels to be selected depending upon the image-capturing conditions set for the image-capturing area.

(28) An image processing device comprising a selection unit that selects signals to be used for noise reduction, among signals output from pixels present in an image-capturing area of an image sensor, and a display unit that brings up on display an image of a subject captured in the image-capturing area, generated with signals having undergone noise reduction executed by using the signals selected by the selection unit. The selection unit in the image processing device makes a change in selection of at least some of the pixels to be selected depending upon the image-capturing conditions set for the image-capturing area.

Furthermore, the devices described below are also part of the embodiments and variations thereof explained earlier.

(1) An image-capturing device comprising an image sensor that includes a first area from which first image data obtained by capturing an image formed with light having entered therein under first image-capturing conditions are output, a second area from which second image data obtained by capturing an image formed with light having entered therein under second image-capturing conditions different from the first image-capturing conditions are output, and a third area from which third image data obtained by capturing an image formed with light having entered therein under the first image-capturing conditions are output, and an image processing unit that generates an image based upon first image data resulting from image processing executed by using the second image data and at least either the first image data or the third image data.

(2) An image-capturing device such as that described in (1), in which the image processing unit executes the image processing for first image data by using the third image data without using the second image data.

(3) An image-capturing device such as that in (2), in which the first image data are output from a pixel at a first position in the first area, the second image data are output from a pixel at a second position in the second area, the third image data are output from a pixel at a third position in the first area, and a distance between the first position and the third position is greater than a distance between the first position and the second position.

(4) An image-capturing device such as that described in any of (1) through (3), in which the image sensor includes a fourth area from which fourth image data, obtained by capturing an image formed with light having entered therein under the second image-capturing conditions, are output and the image processing unit generates an image based upon second image data, resulting from image processing executed by using the first image data resulting from the image processing described earlier and at least either the second image data or the fourth image data.

(5) An image-capturing device comprising an image sensor that includes a first area from which first image data obtained by capturing an image formed with light having entered therein under first image-capturing conditions are output, and a second area from which second image data obtained by capturing an image formed with light having entered therein under second image-capturing conditions different from the first image-capturing conditions are output, and an image processing unit that generates an image based upon first image data resulting from image processing executed by using the first image data and the second image data.

(6) An image-capturing device such as that described in (5), in which the image processing unit executes the image processing for first image data by using the first image data without using the second image data.

(7) An image-capturing device such as that described in (6), in which the image processing unit generates an image based upon second image data resulting from image processing executed by using the second image data, and the first image data resulting from the image processing described above.

(8) An image-capturing device such as that described in any of (1) through (7), in which a plurality of sets of first image data are output from the first area and the image processing unit executes image processing on a set of processing target first image data, among the plurality of sets of first image data, by using another set of first image data among the plurality of sets of first image data.

(9) An image-capturing device such as that described in (8), in which the first image data are output from a pixel at a first position in the first area, the second image data are output from a pixel at a second position in the second area, the other set of first image data is output from a pixel at a third position in the first area, and the distance between the first position and the third position is greater than the distance between the first position and the second position.

(10) An image-capturing device such as that described in any of (1) through (9), in which the first image-capturing conditions and the second image-capturing conditions both include at least either an accumulation time setting or an ISO sensitivity setting.

(11) An image-capturing device such as that described in any of (1) through (10), in which the image processing unit processes the first image data by executing at least defective pixel correction processing, color interpolation processing, edge enhancement processing or noise reduction processing.

(12) An image-capturing device such as that described in any of (1) through (11), in which the image processing unit includes a selection unit that selects image data to be used in image processing executed on the first image data.

(13) An image-capturing device such as that described in (12), in which the image sensor is capable of executing image-capturing operation by setting different image-capturing conditions from one unit area to another at an image-capturing surface, and the selection unit, disposed in correspondence to each unit area or each combined area made up with a plurality of unit areas, selects image data from the corresponding unit area or from the unit areas present in the corresponding combined area.

(14) An image-capturing device such as that described in (13), in which the image sensor is disposed at a first semiconductor substrate and the selection unit is disposed at a second semiconductor substrate.

(15) An image-capturing device such as that described in (14), in which the first semiconductor substrate and the second semiconductor substrate are stacked one upon the other.

(16) A display device having a display unit that brings up on display an image generated based upon first image data output by capturing an image formed with light having entered a first area at an image-capturing unit under first image-capturing conditions, second image data output by capturing an image formed with light having entered a second area that the image-capturing unit, under second image-capturing conditions different from the first image-capturing conditions, and third image data output by capturing an image formed with light having entered a third area at the image-capturing unit under the first image-capturing conditions. The display device further includes an image processing unit that generates an image based upon first image data, resulting from image processing executed by using at least either the first image data or the third image data, and the second image data, and the display unit brings up on display the image generated by the image processing unit.

(17) A display device comprising an image processing unit that generates an image based upon first image data resulting from image processing executed by using first image data output from a first area at an image-capturing unit where an image formed with light having entered therein is captured under first image-capturing conditions and second image data output by capturing an image formed with light having entered a second area at the image-capturing unit under second image-capturing conditions different from the first image-capturing conditions, and a display unit that brings up on display the image generated by the image processing unit.

(18) An image processing device having an image processing unit that generates an image based upon first image data output by capturing an image formed with light having entered a first area at an image-capturing unit under first image-capturing conditions, second image data output by capturing an image formed with light having entered a second area at the image-capturing unit under second image-capturing conditions different from the first image-capturing conditions, and third image data output by capturing an image formed with light having entered a third area at the image-capturing unit under the first image-capturing conditions. The image processing unit generates the image based upon first image data, resulting from image processing executed by using at least either the first image data or the third image data, and the second image data.

(19) An image processing device having an image processing unit that generates an image based upon first image data resulting from image processing executed by using first image data output from a first area at an image-capturing unit where an image formed with light having entered therein is captured under first image-capturing conditions, and second image data output by capturing an image formed with light having entered a second area at the image-capturing unit under second image-capturing conditions different from the first image-capturing conditions.

The disclosure of the following priority application is herein incorporated by reference:
Japanese Patent Application No. 2015-195288 filed Sep. 30, 2015

REFERENCE SIGNS LIST 1, 1C . . . camera
1B . . . image-capturing system
32 . . . image-capturing unit
32a, 100 . . . image sensor
33 . . . image processing unit
33a, 321 . . . input unit
33b, 322 . . . selection unit
33c, 323 . . . generation unit
34 . . . control unit
34a . . . object detection unit
34b . . . area dividing unit
34d . . . image-capturing control unit
35 . . . display unit
90 . . . predetermined range
1001 . . . image-capturing device
1002 . . . display device
P . . . target pixel

The invention claimed is:

1. An image-capturing device, comprising:
   an image sensor that includes a first image-capturing area set so as to capture an image of a subject under first image-capturing conditions, a second image-capturing area set so as to capture an image of the subject under second image-capturing conditions different from the first image-capturing conditions and a third image-capturing area set so as to capture an image of the subject under third image-capturing conditions different from the second image-capturing conditions; and
   a selection unit that selects pixels, to be used for purposes of interpolation executed for a pixel present in the first image-capturing area among pixels present in the second image-capturing area, and pixels present in the third image-capturing area.

2. The image-capturing device according to claim 1, further comprising:
   a generation unit that generates an image of the subject captured in the first image-capturing area with signals generated through interpolation executed by using signals output from the pixels selected by the selection unit.

3. The image-capturing device according to claim 1, further comprising:

a detection unit that detects the subject captured in the first image-capturing area with signals generated through interpolation executed by using signals output from the pixels selected by the selection unit.

4. The image-capturing device according to claim 1, further comprising:
a control unit that controls setting of image-capturing conditions set in the first image-capturing area with signals generated through interpolation executed by using signals output from the pixels selected by the selection unit.

5. The image-capturing device according to claim 1, further comprising:
the first image-capturing area, the second image-capturing area and the third image-capturing area being set so as to capture an image of the subject through a lens that adjusts an in-focus position of an optical system; and
a control unit that controls driving of the lens based upon a state of the in-focus position of the optical system with signals generated through interpolation executed by using signals output from the pixels selected by the selection unit.

6. The image-capturing device according to claim 1, wherein:
the third image-capturing conditions which are to be different from the first image-capturing conditions by an extent smaller than an extent of difference between the first image-capturing conditions and the second image-capturing conditions, are set as image-capturing conditions for the third image-capturing area.

7. The image-capturing device according to claim 6, wherein:
the first image-capturing conditions are set for the third image-capturing area.

8. The image-capturing device according to claim 1, wherein:
the third image-capturing area is set apart from the first image-capturing area by a distance greater than a distance between the first image-capturing area and the second image-capturing area.

* * * * *